(12) United States Patent
Watarai et al.

(10) Patent No.: US 11,594,549 B2
(45) Date of Patent: Feb. 28, 2023

(54) SEMICONDUCTOR MEMORY DEVICE

(71) Applicant: Kioxia Corporation, Tokyo (JP)

(72) Inventors: Ayumi Watarai, Ama (JP); Taichi Iwasaki, Yokkaichi (JP); Osamu Matsuura, Kuwana (JP); Yu Hirotsu, Kuwana (JP); Sota Matsumoto, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 169 days.

(21) Appl. No.: 17/202,690

(22) Filed: Mar. 16, 2021

(65) Prior Publication Data
US 2022/0085052 A1 Mar. 17, 2022

(30) Foreign Application Priority Data
Sep. 17, 2020 (JP) .............................. JP2020-156717

(51) Int. Cl.
*H01L 27/11578* (2017.01)
*H01L 27/11519* (2017.01)
*H01L 27/11521* (2017.01)
*H01L 27/11526* (2017.01)
*G11C 8/14* (2006.01)
(Continued)

(52) U.S. Cl.
CPC .......... *H01L 27/11578* (2013.01); *G11C 8/14* (2013.01); *H01L 27/11519* (2013.01); *H01L 27/11521* (2013.01); *H01L 27/11526* (2013.01); *H01L 27/11551* (2013.01); *H01L 27/11565* (2013.01); *H01L 27/11568* (2013.01); *H01L 27/11573* (2013.01)

(58) Field of Classification Search
CPC ......... H01L 27/11578; H01L 27/11519; H01L 27/11521; H01L 27/11526; H01L 27/11551; H01L 27/11565; H01L 27/11568; H01L 27/11573; H01L 27/11575; H01L 27/11582; H01L 27/11524; H01L 27/1157; G11C 8/14; G11C 16/08
See application file for complete search history.

(56) References Cited

U.S. PATENT DOCUMENTS 10,553,603 B2 2/2020 Yamashita
10,566,339 B2 2/2020 Fujii et al.
(Continued)

FOREIGN PATENT DOCUMENTS

JP 2019-114698 A 7/2019
JP 2019-160922 A 9/2019

*Primary Examiner* — Allison Bernstein
(74) *Attorney, Agent, or Firm* — Oblon, McClelland, Maier & Neustadt, L.L.P.

(57) ABSTRACT

A semiconductor memory device according to an embodiment includes a substrate, a source line, word lines, a pillar, an outer peripheral conductive layer, a lower layer conductive layer, and a first contact. The substrate includes a core region and a first region.

The outer peripheral conductive layer is provided to surround the core region in the first region. The outer peripheral conductive layer is included in a first layer. The lower layer conductive layer is provided in the first region. The first contact is provided on the lower layer conductive layer to surround the core region in the first region. An upper end of the first contact is included in the first layer. The first contact is electrically connected to the outer peripheral conductive layer.

20 Claims, 67 Drawing Sheets

(51) Int. Cl.
  *H01L 27/11565* (2017.01)
  *H01L 27/11568* (2017.01)
  *H01L 27/11573* (2017.01)
  *H01L 27/11551* (2017.01)

(56) References Cited

U.S. PATENT DOCUMENTS

| | | |
|---|---|---|
| 10,756,104 B2 | 8/2020 | Fujiki et al. |
| 2015/0263011 A1 | 9/2015 | Hong |
| 2022/0285383 A1* | 9/2022 | Kubota ............. H01L 27/11573 |
| 2022/0310808 A1* | 9/2022 | Kajino ............. H01L 29/42328 |

* cited by examiner

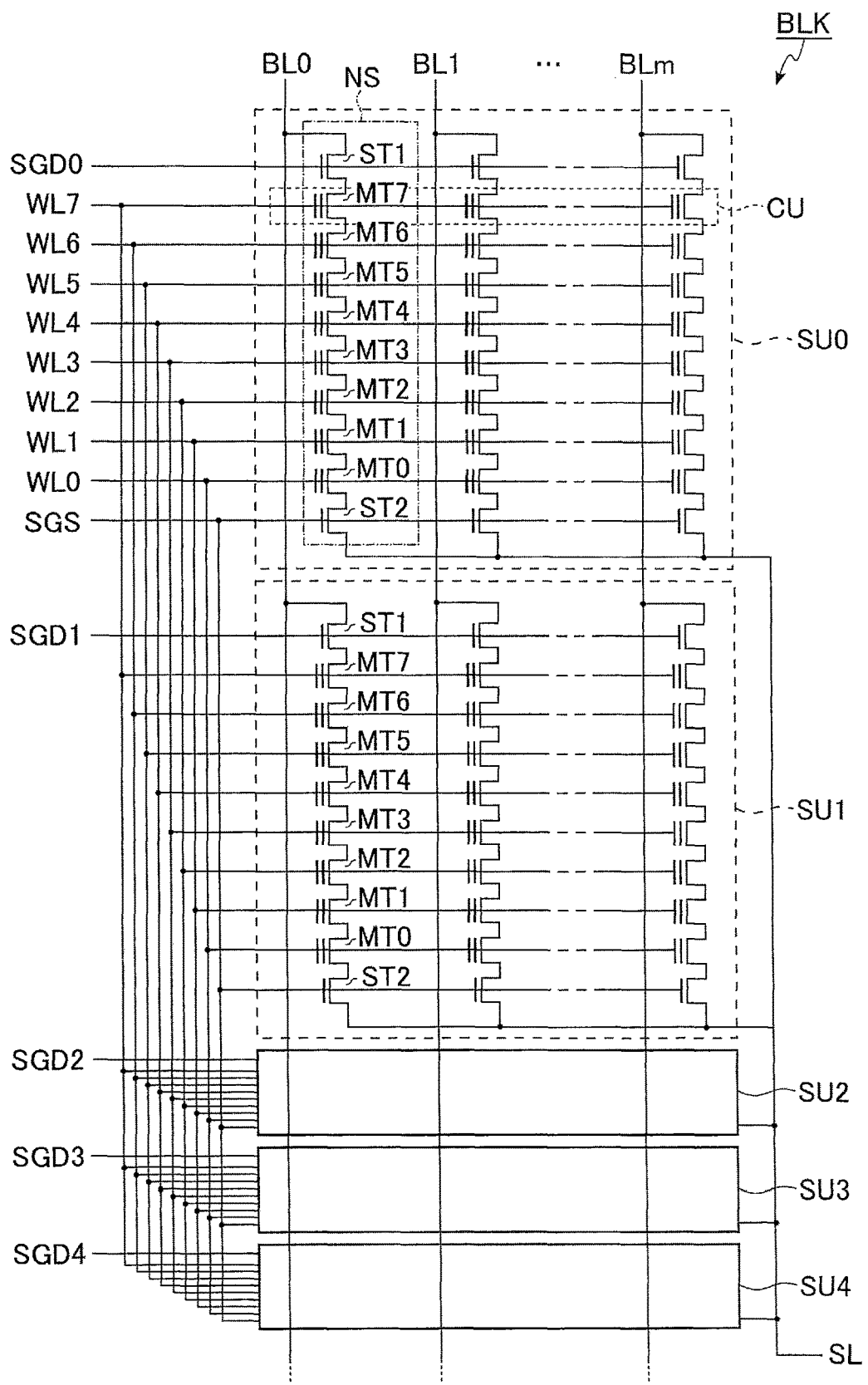
F I G. 2

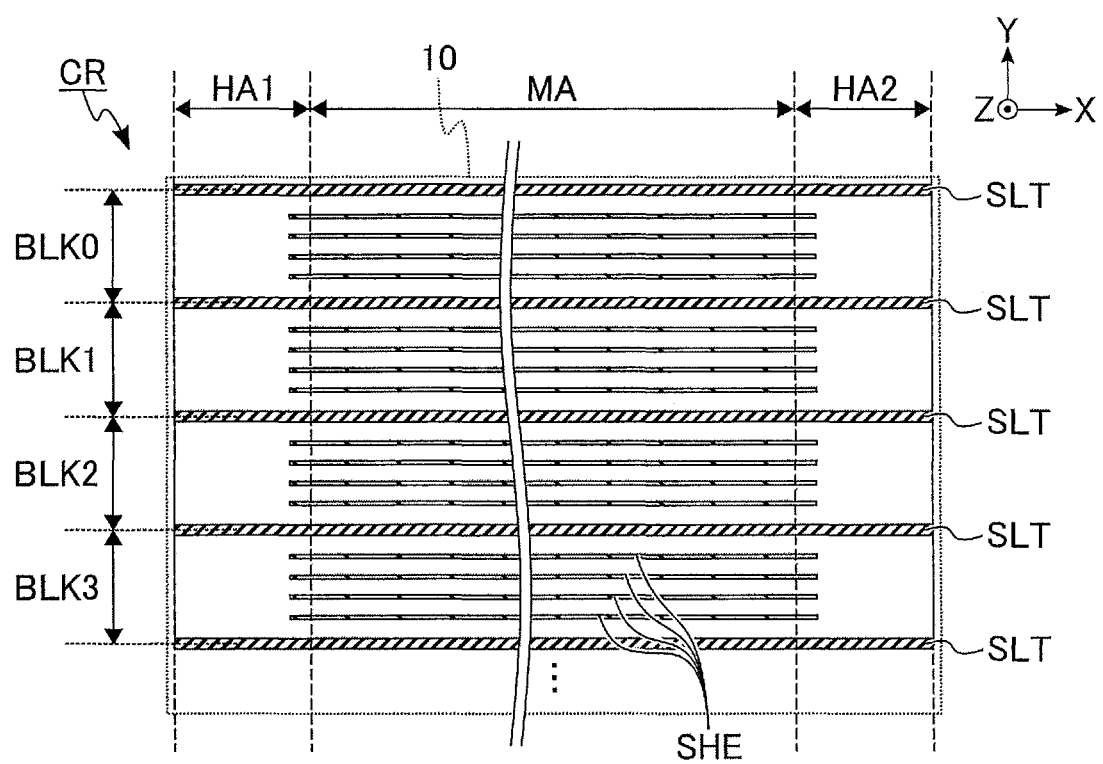
F I G. 4

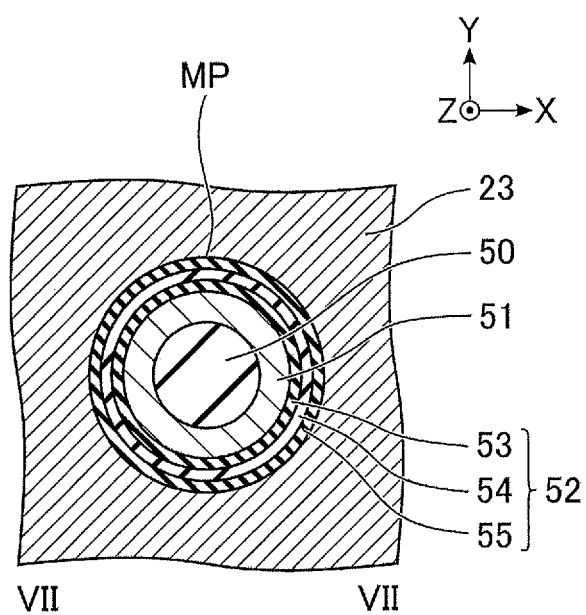
F I G. 7

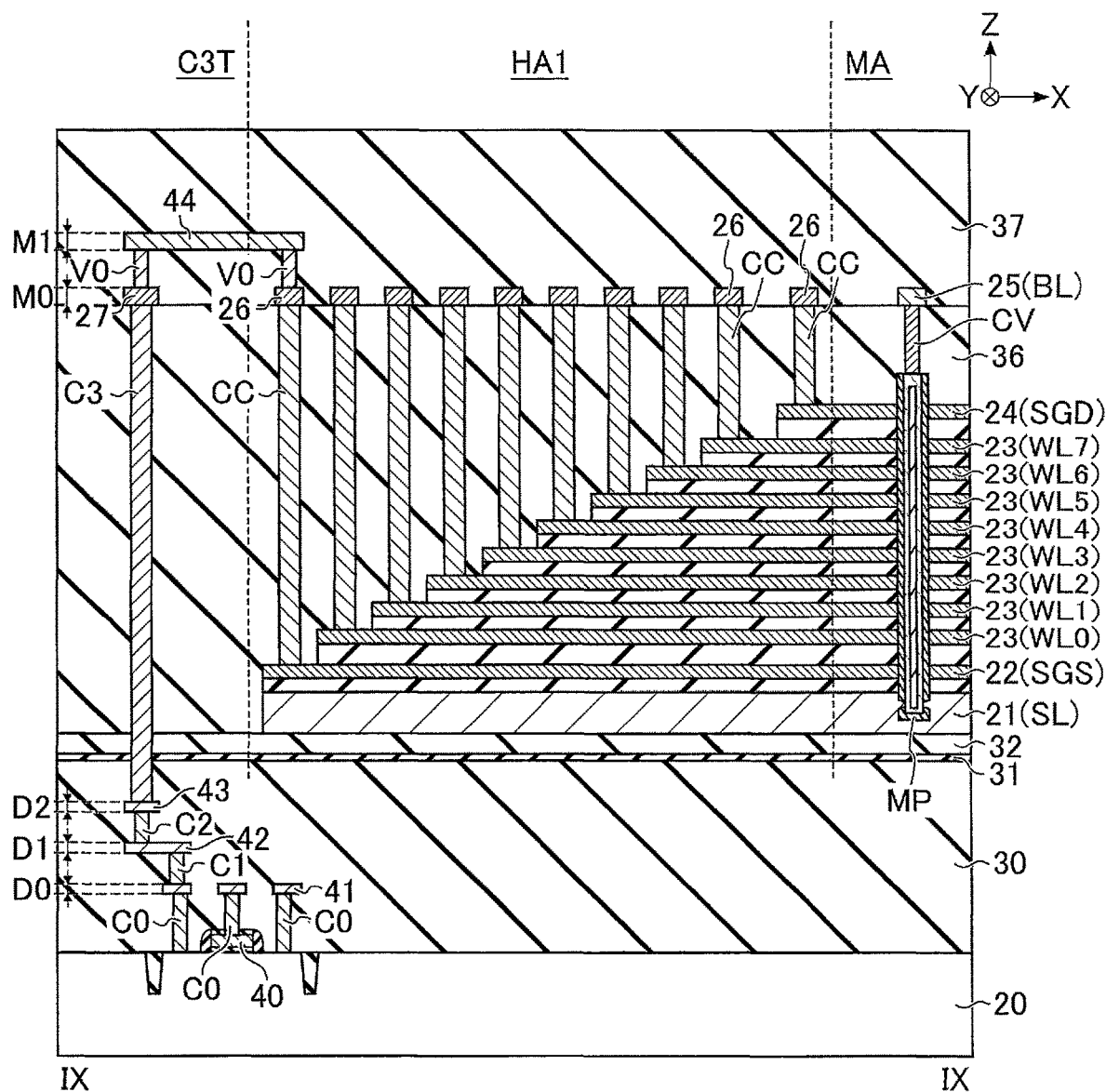
F I G. 9

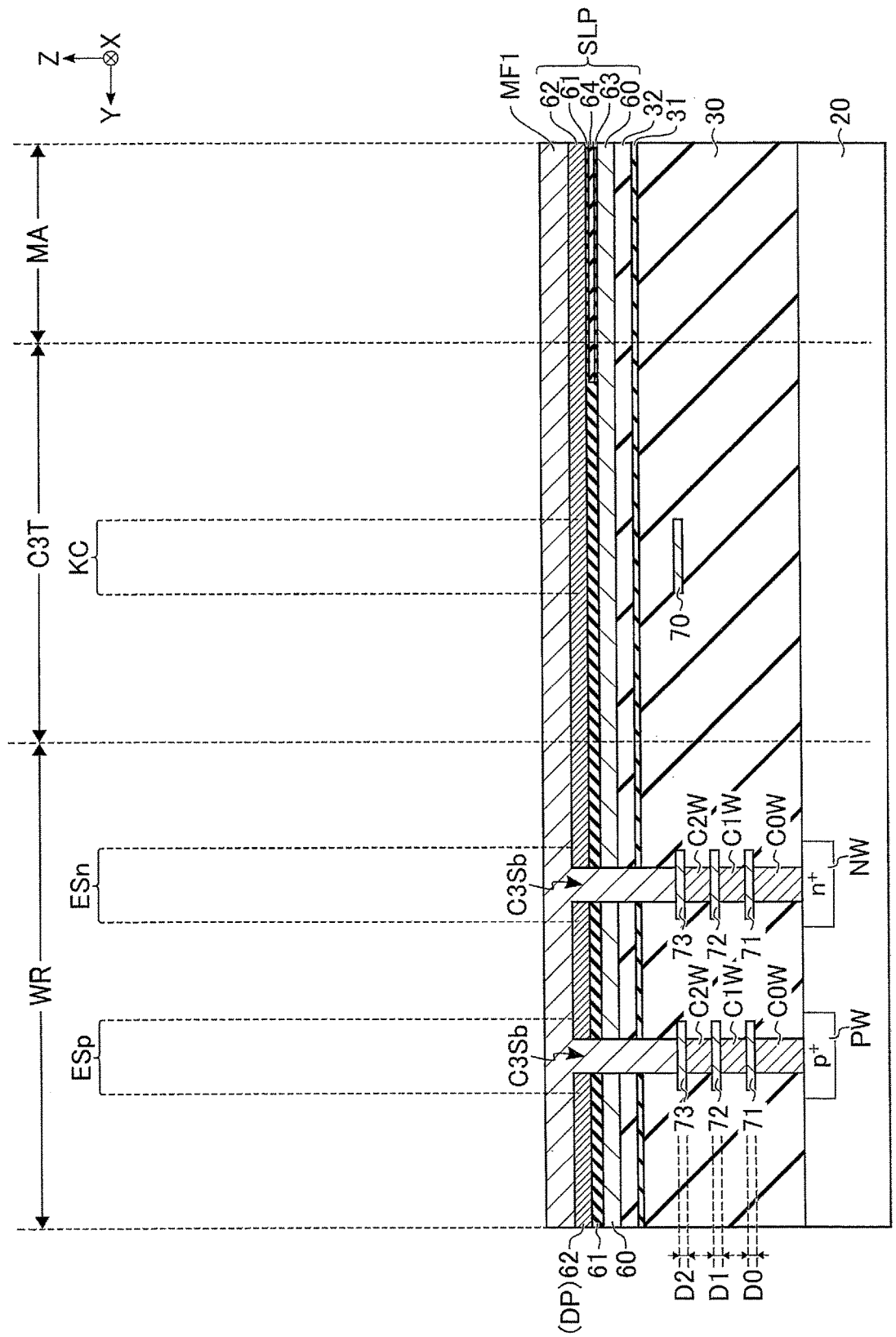
F I G. 16

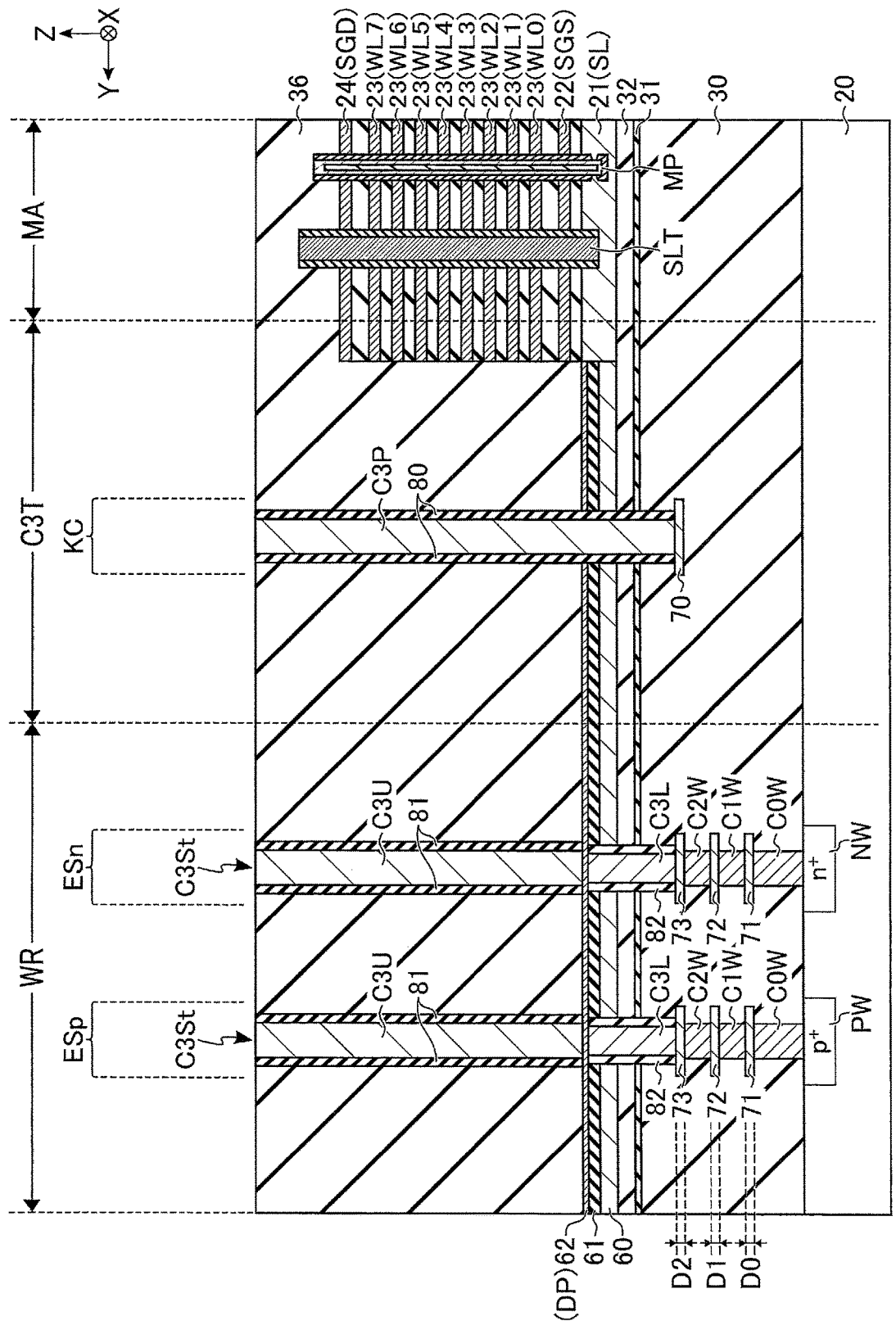
F I G. 39

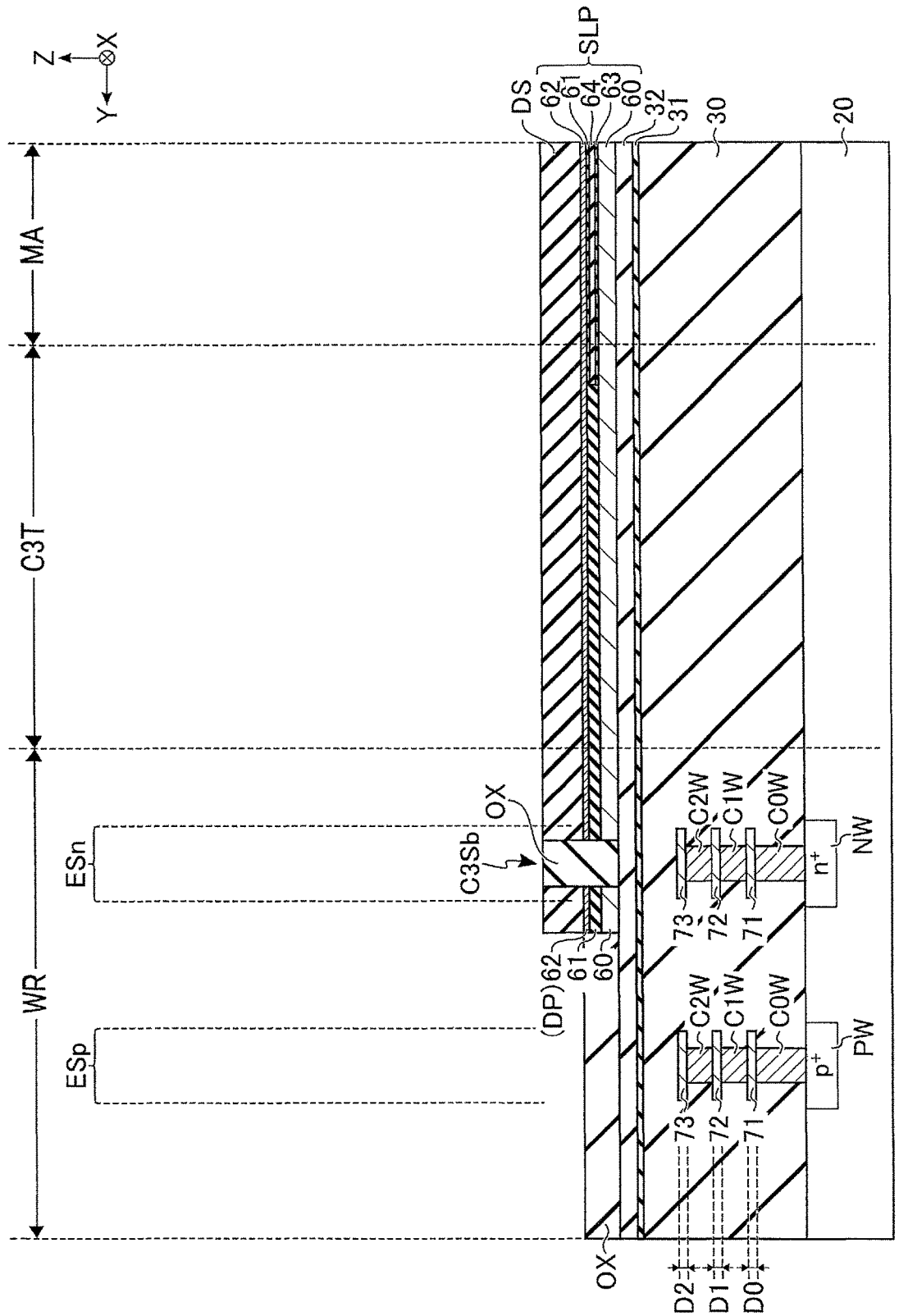
F I G. 47

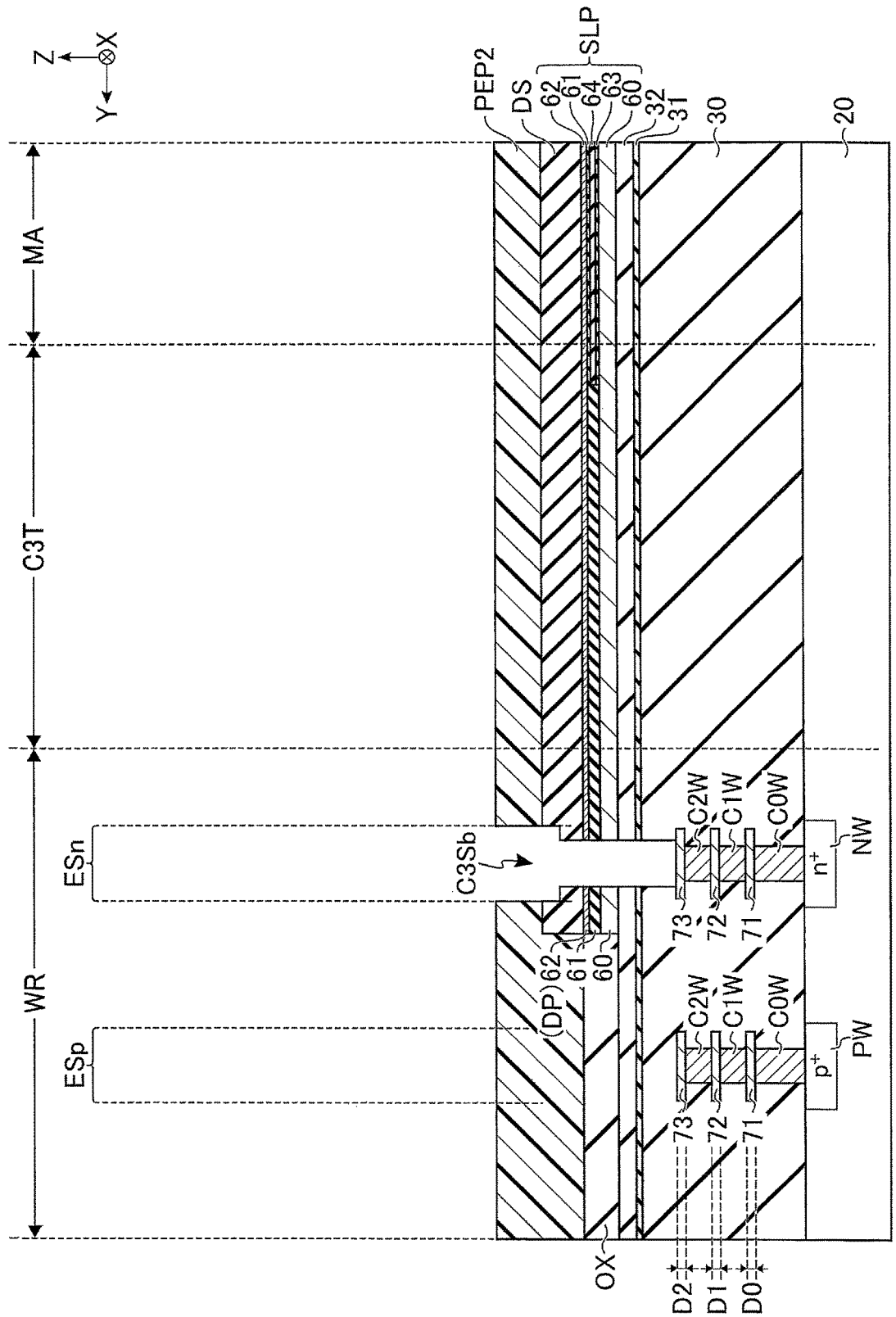
F I G. 48

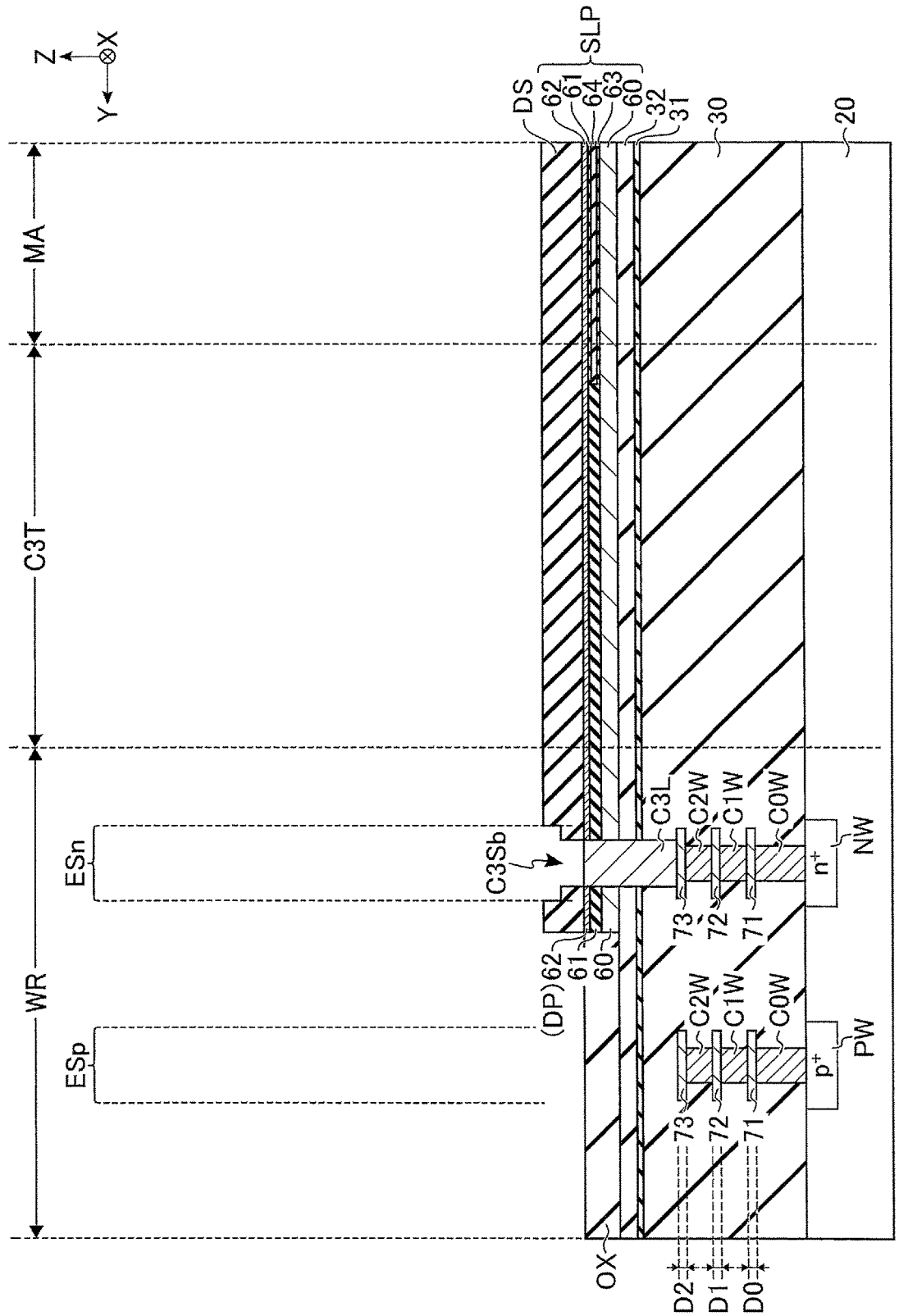
F I G. 50

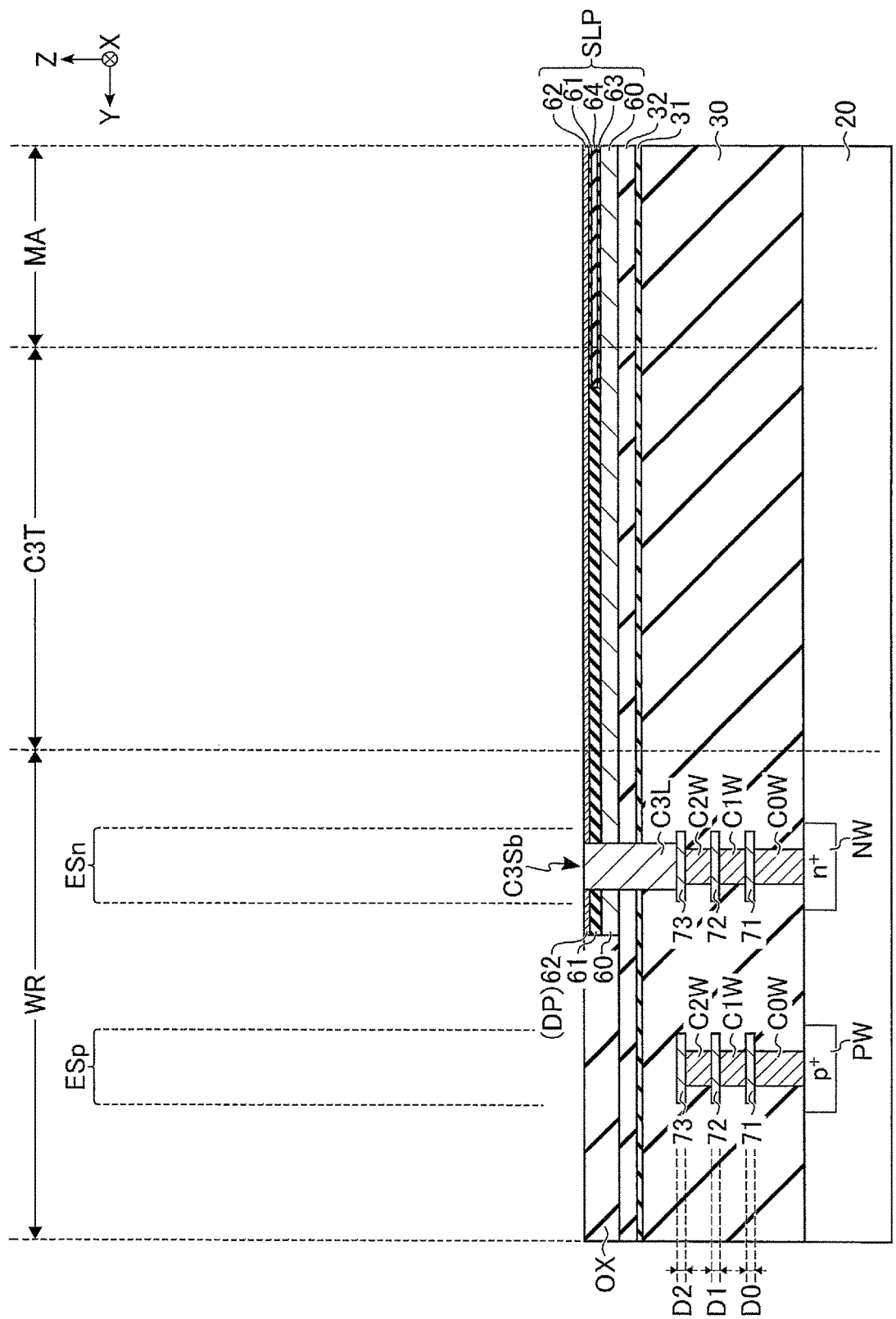
F I G. 51

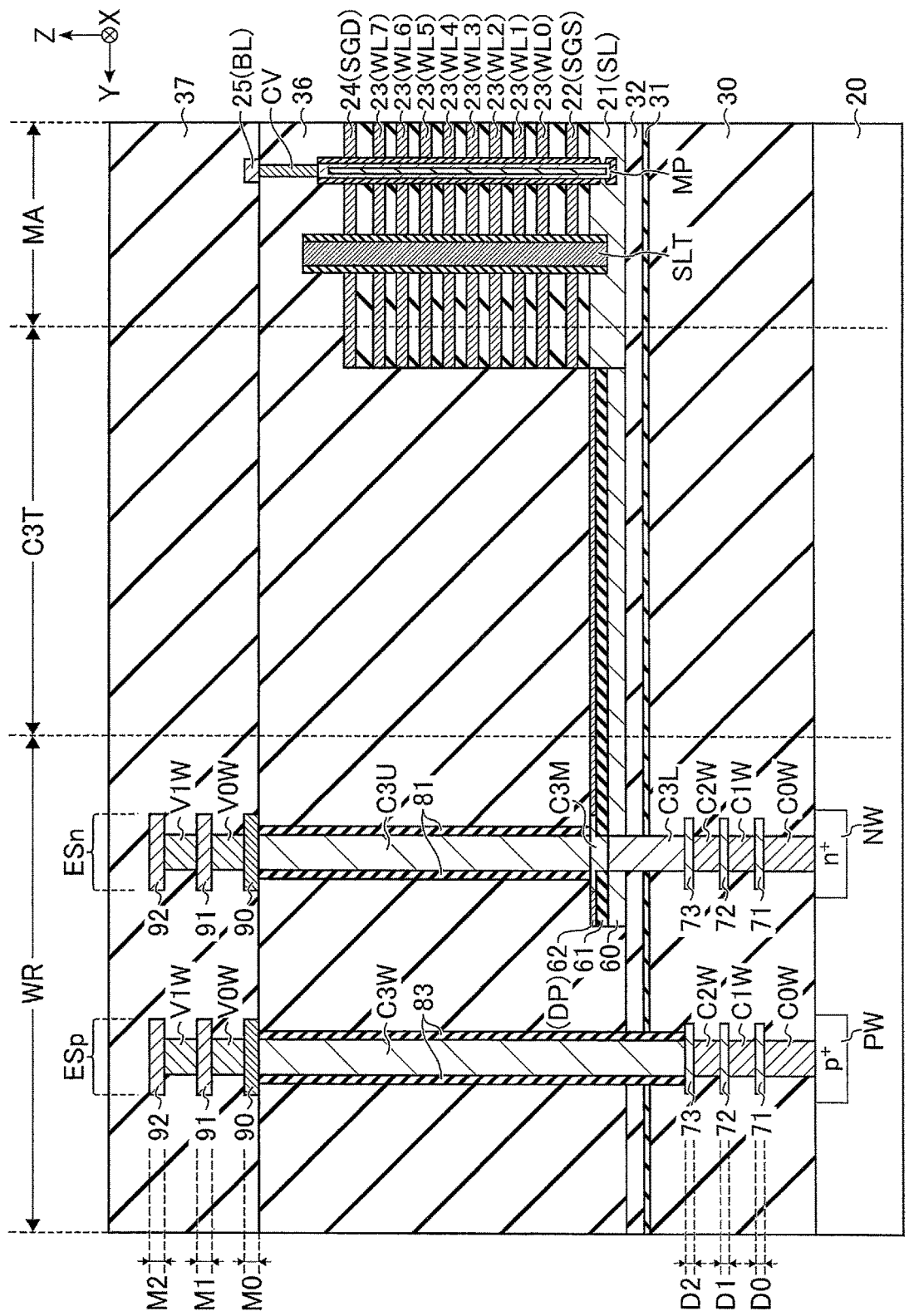
F I G. 55

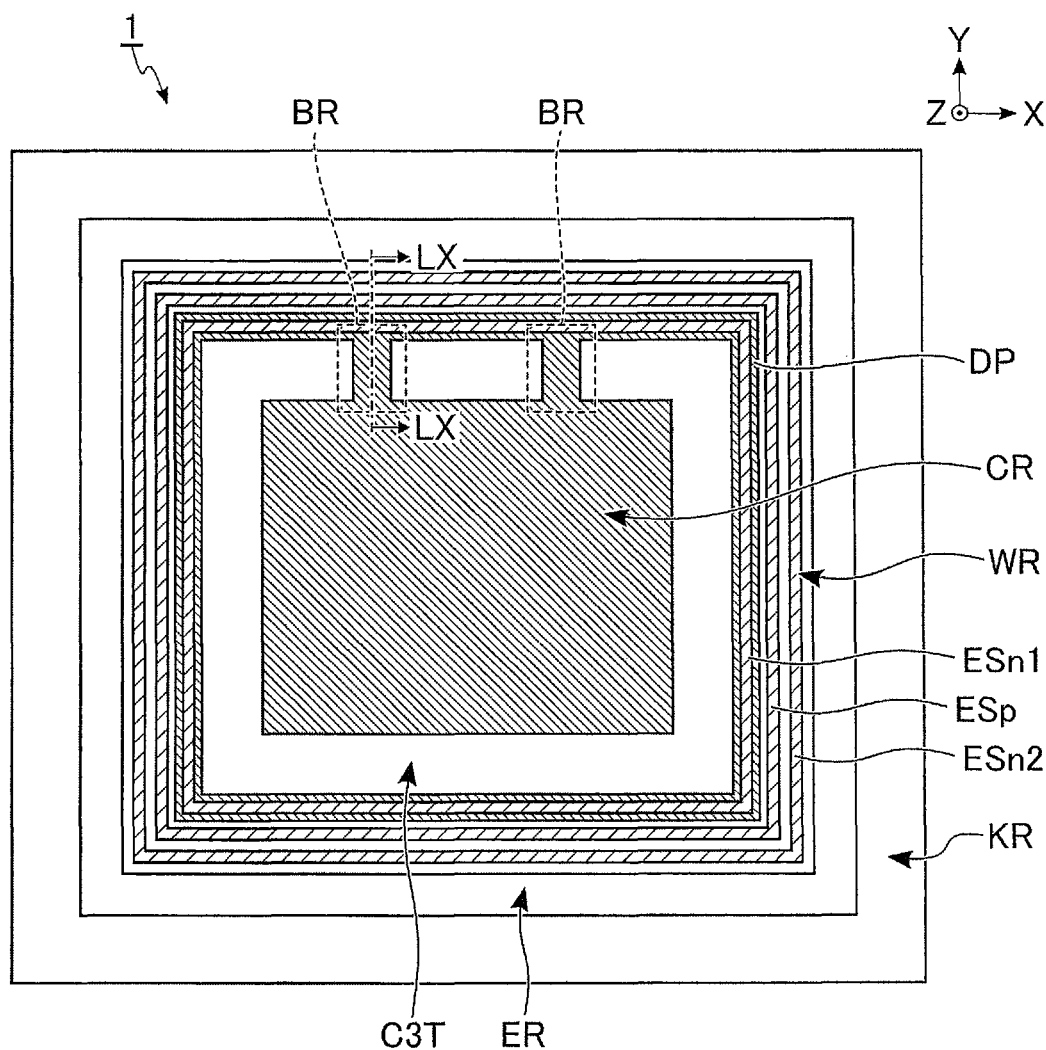
F I G. 59

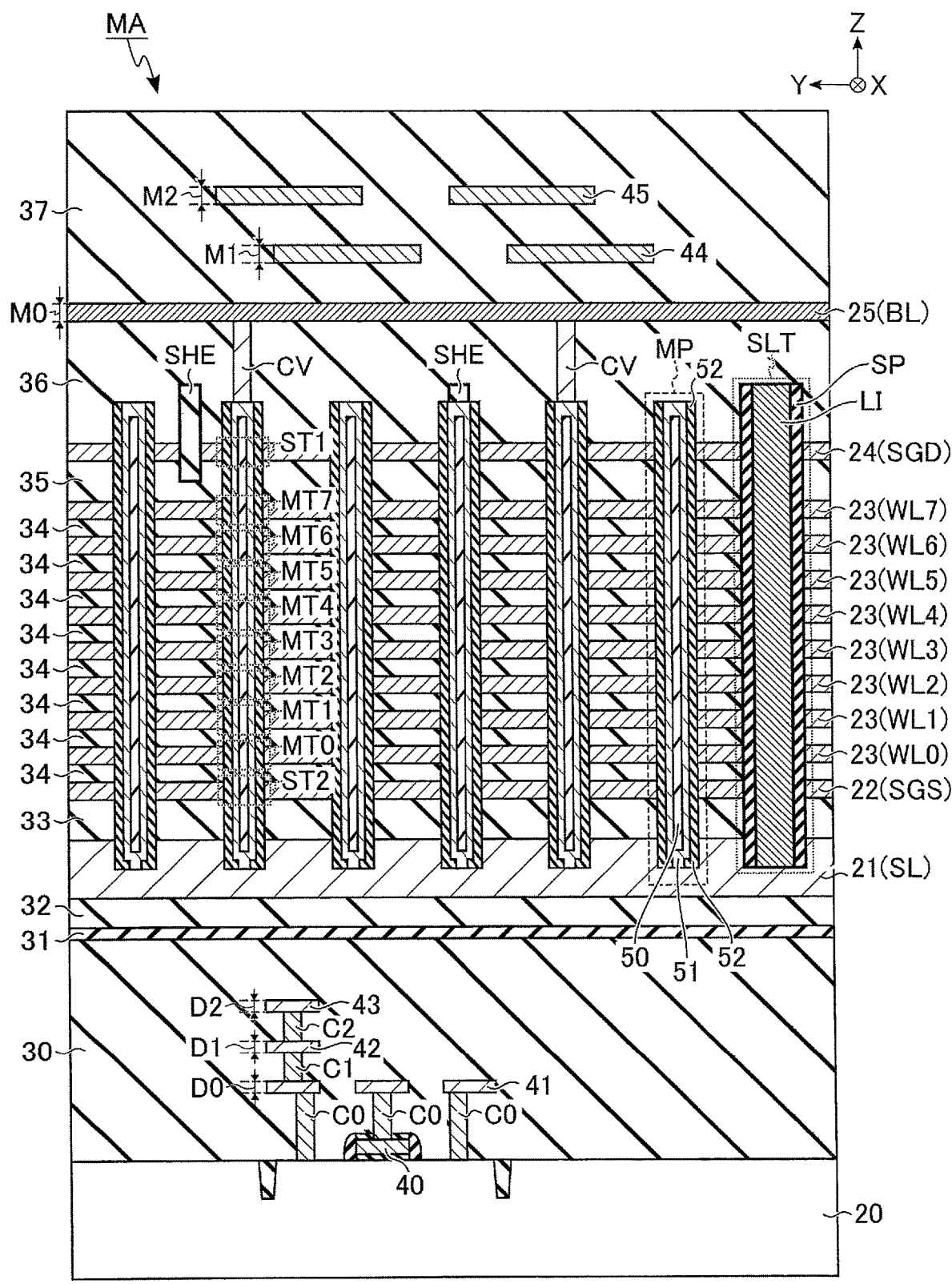
F I G. 66

US 11,594,549 B2

SEMICONDUCTOR MEMORY DEVICE

CROSS-REFERENCE TO RELATED APPLICATIONS

This application is based upon and claims the benefit of priority from Japanese Patent Application No. 2020-156717, filed Sep. 17, 2020, the entire contents of which are incorporated herein by reference.

FIELD

Embodiments described herein relate generally to a semiconductor memory device.

BACKGROUND

There is known a NAND-type flash memory capable of storing data in a nonvolatile manner.

BRIEF DESCRIPTION OF THE DRAWINGS

FIG. 2 is a circuit diagram illustrating an example of a circuit configuration of a memory cell array included in the semiconductor memory device according to the first embodiment;

FIG. 4 is a plan view illustrating an example of a plan layout in a core region of the semiconductor memory device according to the first embodiment;

FIG. 7 is a cross-sectional view taken along a line VII-VII of FIG. 6 illustrating an example of cross-sectional structure of a memory pillar in the semiconductor memory device according to the first embodiment;

FIG. 9 is a cross-sectional view taken along a line IX-IX of FIG. 8 illustrating an example of cross-sectional structure in the hookup region and the contact region of the semiconductor memory device according to the first embodiment;

FIGS. 14, 15, 16, 17, 18, 19, 20, 21, 22, 23, 24, 25 and 26 are cross-sectional views illustrating an example of cross-sectional structure during manufacturing of the semiconductor memory device according to the first embodiment;

FIGS. 31, 32, 33, 34, 35, 36, 37, 38, 39 and 40 are cross-sectional views illustrating an example of cross-sectional structure during manufacturing of the semiconductor memory device according to the second embodiment;

FIGS. 44, 45, 46, 47, 48, 49, 50, 51, 52 and 53 are cross-sectional views illustrating an example of cross-sectional structure during manufacturing of the semiconductor memory device according to the third embodiment;

FIG. 55 is a cross-sectional view illustrating an example of cross-sectional structure in the contact region and the wall region of the semiconductor memory device according to the first embodiment to which a second modification is applied;

FIG. 59 is a plan view illustrating an example of a plan layout of the sealing member and the conductive portion in the semiconductor memory device according to the third embodiment to which the third modification is applied;

FIG. 66 is a cross-sectional view illustrating an example of cross-sectional structure in the memory region of the semiconductor memory device according to the first embodiment to which a fifth modification is applied.

DETAILED DESCRIPTION

In general, according to one embodiment, a semiconductor memory device includes a substrate, a source line, a plurality of word lines, a pillar, an outer peripheral conductive layer, a lower layer conductive layer, and a first contact. The substrate includes a core region and a first region. The first region is provided to surround an outer periphery of the core region. The source line is provided above the substrate in the core region. The word lines are provided above the source line in the core region. The word lines are provided apart from each other in a first direction intersecting a surface of the substrate. The pillar is provided to extend in the first direction in the core region. A bottom of the pillar reaches the source line. An intersecting portion of the pillar and one of the word lines functions as a memory cell. The outer peripheral conductive layer is provided to surround the core region in the first region. The outer peripheral conductive layer is included in a first layer including the source line. The lower layer conductive layer is provided in the first region. The lower layer conductive layer is included in a second layer between the first layer and the substrate. The first contact is provided on the lower layer conductive layer to surround the core region in the first region. An upper end of the first contact is included in the first layer. The first contact is electrically connected to the outer peripheral conductive layer.

Hereinafter, embodiments will be described with reference to the drawings. Each embodiment exemplifies a device or method for embodying a technical idea of the invention. The drawings are schematic or conceptual, and the dimensions and ratios of each drawing are not always the same as the actual ones. The technical idea of the present invention is not specified by the shape, structure, arrangement, and the like of constituent elements.

Note that, in the following description, constituent elements having substantially the same functions and configurations are denoted by the same signs. A number after a character constituting a reference sign is used for distinguishing between elements that are referred to by a reference sign including the same character and have similar configurations. When it is not necessary to distinguish between elements indicated by a reference sign including the same character, each of these elements is referred to by the reference sign including only the character.

[1] First Embodiment

Hereinafter, a semiconductor memory device 1 according to a first embodiment will be described.

[1-1] Configuration of Semiconductor Memory Device 1

[1-1-1] Overall Configuration of Semiconductor Memory Device 1

Figure 1:
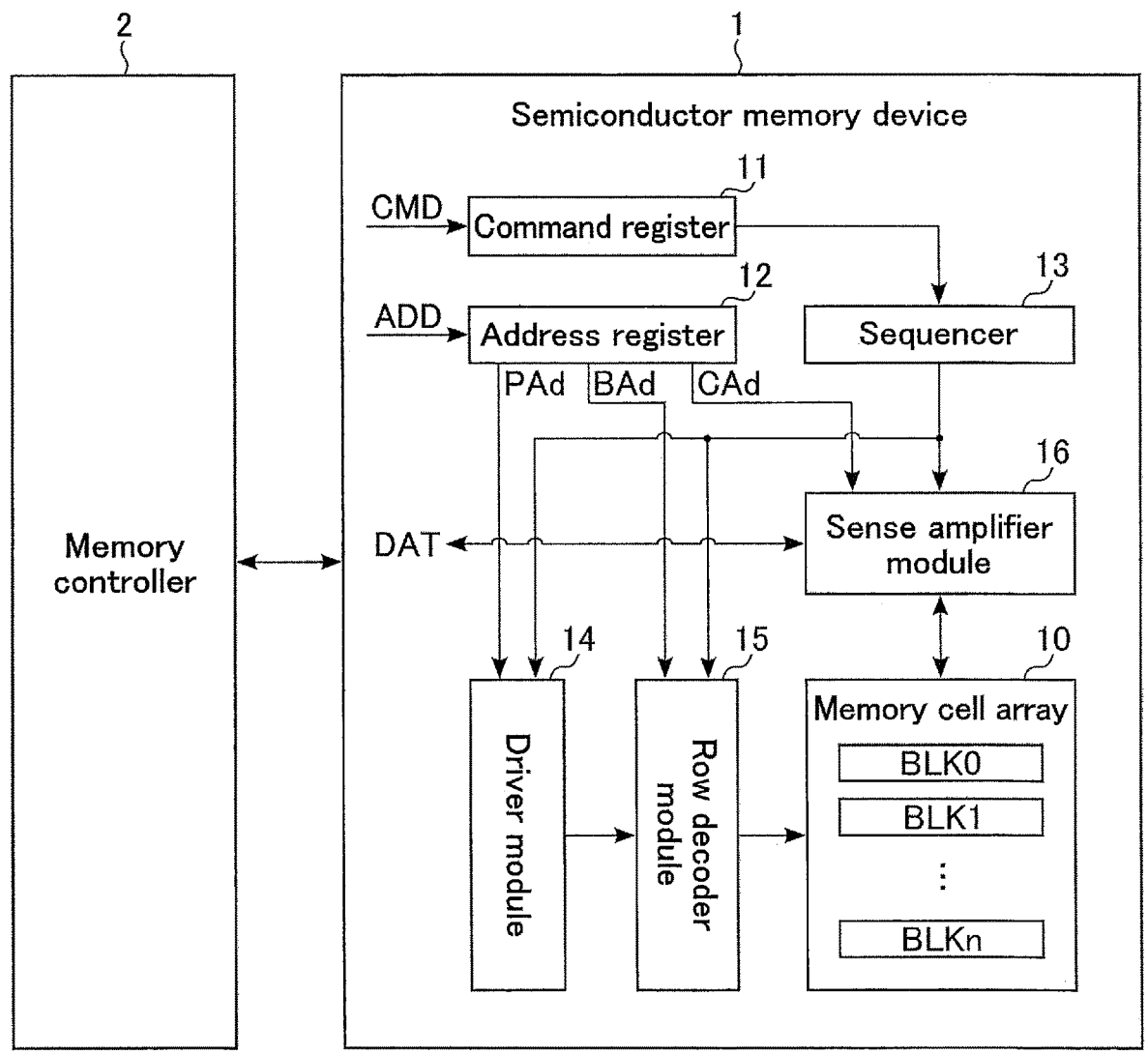
FIG. 1 is a block diagram illustrating an example of an overall configuration of a semiconductor memory device according to a first embodiment.

FIG. 1 is a block diagram illustrating a configuration example of the semiconductor memory device 1 according to the first embodiment. The semiconductor memory device 1 is a NAND-type flash memory capable of storing data in a nonvolatile manner, and can be controlled by an external memory controller 2.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer greater than or equal to 1). Each block BLK is a set of a plurality of memory cells capable of storing data in a nonvolatile manner, and is used, for example, as a unit of data erasure. Furthermore, the memory cell array 10 is provided with a plurality of bit lines and a plurality of word lines. Each memory cell is associated with, for example, one bit line and one word line. A detailed configuration of the memory cell array 10 will be described later.

The command register 11 holds a command CMD received by the semiconductor memory device 1 from the memory controller 2. The command CMD includes, for example, an instruction to cause the sequencer 13 to execute a read operation, a write operation, an erase operation, and the like.

The address register 12 holds address information ADD received by the semiconductor memory device 1 from the memory controller 2. The address information ADD includes, for example, a block address BAd, a page address PAd, and a column address CAd. For example, the block address BAd, the page address PAd, and the column address CAd are used for selecting the block BLK, word line, and bit line, respectively.

The sequencer 13 controls the operation of the entire semiconductor memory device 1. For example, the sequencer 13 controls the driver module 14, the row decoder module 15, the sense amplifier module 16, and the like, based on' the command CMD held in the command register 11, and executes the read operation, the write operation, the erase operation, and the like.

The driver module 14 generates a voltage used in the read operation, the write operation, the erase operation, or the like. Then, the driver module 14 applies a generated voltage to a signal line corresponding to a selected word line, based on, for example, the page address PAd held in the address register 12.

The row decoder module 15 selects a corresponding one block BLK in the memory cell array 10, based on the block address BAd held in the address register 12. Then, the row decoder module 15 transfers, for example, the voltage applied to the signal line corresponding to the selected word line to the selected word line in the selected block BLK.

In the write operation, the sense amplifier module 16 applies a desired voltage to each bit line depending on write data DAT received from the memory controller 2. Furthermore, in the read operation, the sense amplifier module 16 determines data stored in the memory cell, based on the voltage of the bit line, and reads and transfers a determination result as read data DAT to the memory controller 2.

The semiconductor memory device 1 and the memory controller 2 described above may constitute one semiconductor device by a combination thereof. Examples of such a semiconductor device include a memory card such as an SD™ card, a solid state drive (SSD), and the like.

[1-1-2] Circuit Configuration of Memory Cell Array 10

FIG. 2 is a circuit diagram illustrating an example of a circuit configuration of the memory cell array 10 included in the semiconductor memory device 1 according to the first embodiment. FIG. 2 illustrates one block BLK of the plurality of blocks BLK included in the memory cell array 10. As illustrated in FIG. 2, the block BLK includes, for example, five string units SU0 to SU4.

Each string unit SU includes a plurality of NAND strings NS respectively associated with bit lines BL0 to BLm (m is an integer greater than or equal to 1). Each NAND string NS includes, for example, memory cell transistors MT0 to MT7, and select transistors ST1 and ST2. Each memory cell transistor MT includes a control gate and a charge storage layer, and holds data in a nonvolatile manner. Each of the select transistors ST1 and ST2 is used for selecting the string unit SU during various operations.

In each NAND string NS, the memory cell transistors MT0 to MT7 are connected together in series. The drain of the select transistor ST1 is connected to each bit line BL associated. The source of the select transistor ST1 is connected to one end of the memory cell transistors MT0 to MT7 connected together in series. The drain of the select transistor ST2 is connected to the other end of the memory cell transistors MT0 to MT7 connected together in series. The source of the select transistor ST2 is connected to a source line SL.

In the same block BLK, the control gates of the memory cell transistors MT0 to MT7 are connected to the word lines WL0 to WL7, respectively. The gates of a plurality of the select transistors ST1 in the string unit SU0 are connected to a select gate line SGD0. The gates of a plurality of the select transistors ST1 in the string unit SU1 are connected to a select gate line SGD1. The gates of a plurality of the select transistors ST1 in the string unit SU2 are connected to a select gate line SGD2. The gates of a plurality of the select transistors ST1 in the string unit SU3 are connected to a select gate line SGD3. The gates of a plurality of the select transistors ST1 in the string unit SU4 are connected to a select gate line SGD4. The gates of a plurality of the select transistors ST2 are connected to a select gate line SGS.

Different column addresses are respectively assigned to the bit lines BL0 to BLm. Each bit line BL is shared by the NAND strings NS to which the same column address is assigned among the plurality of blocks BLK. Each of the word lines WL0 to WL7 is provided for each block BLK. The source line SL is shared among the plurality of blocks BLK, for example.

A set of a plurality of the memory cell transistors MT connected to a common word line WL in one string unit SU is referred to as, for example, a cell unit CU. For example, a storage capacity of the cell unit CU including the memory cell transistors MT each storing 1-bit data is defined as "1 page data". The cell unit CU can have a storage capacity greater than or equal to 2 page data depending on the number of bits of data stored in the memory cell transistor MT.

Note that, the circuit configuration of the memory cell array 10 included in the semiconductor memory device 1 according to the first embodiment is not limited to the configuration described above. For example, the number of the string units SU included in each block BLK, and the number of the memory cell transistors MT and the select transistors ST1 and ST2 included in each NAND string NS each may be freely selected.

[1-1-3] Structure of Memory Cell Array 10

Hereinafter, an example will be described of structure of the memory cell array 10 included in the semiconductor memory device 1 according to the embodiment. Note that, in the drawings referred to below, the X direction corresponds to an extending direction of the word line WL, the Y direction corresponds to an extending direction of the bit line BL, and the Z direction corresponds to the vertical direction with respect to a surface of a semiconductor substrate 20 used for formation of the semiconductor memory device 1. In the plan view, hatching is appropriately added to make it easier to see the figure. The hatching added to the plan view is not necessarily related to a material and characteristics of a constituent element to which the hatching is added. In the cross-sectional view, illustration of the configuration is appropriately omitted to make it easier to see the figure.

(Plan Layout of Semiconductor Memory Device 1)

Figure 3:
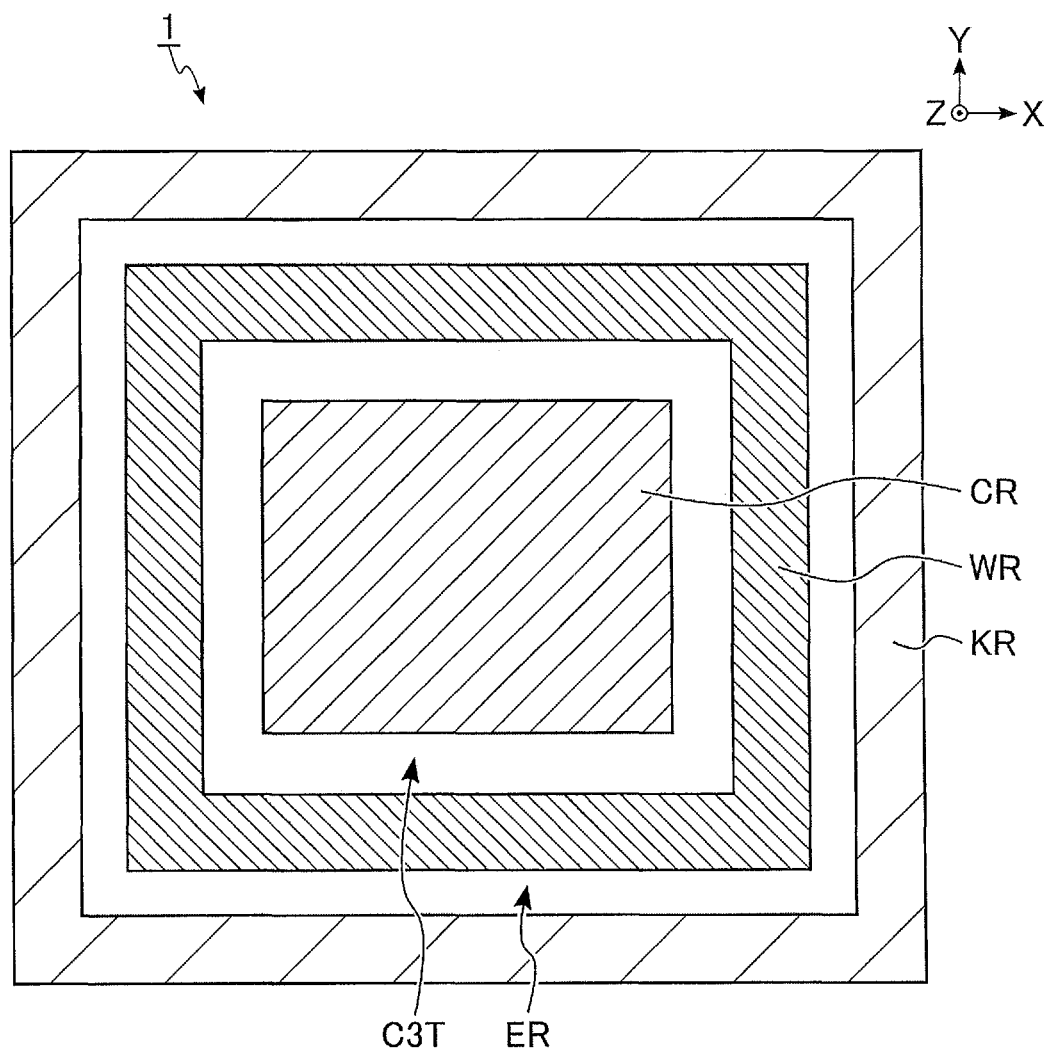
FIG. 3 is a plan view illustrating an example of a plan layout of the semiconductor memory device according to the first embodiment.

FIG. 3 is a plan view illustrating an example of a plan layout of the semiconductor memory device 1 according to the first embodiment. As illustrated in FIG. 3, the plan layout of the semiconductor memory device 1 is divided into, for example, a core region CR, a wall region WR, a kerf region KR, a contact region C3T, and an end region ER.

The core region CR is, for example, a rectangular region provided in a central portion of the semiconductor substrate 20. The memory cell array 10 is arranged in the core region CR. The core region CR can be arranged in any shape and in any region. When the semiconductor memory device 1 includes a plurality of the memory cell arrays 10, the semiconductor memory device 1 may include a plurality of the core regions CR.

The wall region WR is a square ring region provided to surround the outer periphery of the core region CR. Sealing members ESn and ESp described later are arranged in the wall region WR. When the plurality of core regions CR is provided on the semiconductor substrate 20, the wall region WR may be provided to collectively surround the plurality of core regions CR, or may be provided for each core region CR. Peripheral circuits such as the row decoder module 15 and the sense amplifier module 16 are arranged in a region surrounded by the wall region WR. The peripheral circuits have a portion arranged to overlap the memory cell array 10.

The contact region C3T is a region between the wall region WR and the core region CR. In the contact region C3T, for example, a contact is arranged for connecting the memory cell array 10 to the peripheral circuits. For example, the row decoder module 15 is electrically connected to a wiring line (the word line WL or the like) in the memory cell array 10 via the contact provided in the contact region C3T.

The kerf region KR is a square ring region provided to surround the outer periphery of the wall region WR, and is in contact with the outermost periphery of the semiconductor substrate 20. The kerf region KR is provided with, for example, an alignment mark used during manufacturing of the semiconductor memory device 1, a guard ring, and the like. A region between the kerf region KR and the wall region WR corresponds to the end region ER. A structure in the kerf region KR may be removed by a dicing process of cutting a plurality of the semiconductor memory devices 1 formed on a wafer into chips.

FIG. 4 is a plan view illustrating an example of a plan layout in the core region CR of the semiconductor memory device 1 according to the first embodiment. FIG. 4 illustrates regions corresponding to four blocks BLK0 to BLK3 included in the memory cell array 10. As illustrated in FIG. 4, the core region CR is divided into a memory region MA and hookup regions HA1 and HA2 in the X direction, for example. Furthermore, the memory cell array 10 includes a plurality of slits SLT and SHE.

The memory region MA includes the plurality of NAND strings NS. The memory region MA is sandwiched in the X direction by the hookup regions HA1 and HA2. Each of the hookup regions HA1 and HA2 is a region used for connection between stacked wiring lines (for example, the word lines WL and the select gate lines SGD and SGS) and the row decoder module 15.

Each of the plurality of slits SLT includes a portion provided to extend along the X direction and is arranged in the Y direction. Each slit SLT crosses the memory region MA and the hookup regions HA1 and HA2 in the X direction. Furthermore, each slit SLT has structure in which an insulator or a plate-shaped contact is embedded, for example. Then, each slit SLT divides wiring lines (for example, the word lines WL0 to WL7 and the select gate lines SGD and SGS) adjacent to each other via the slit SLT.

Each of the plurality of slits SHE includes a portion provided to extend along the X direction and is arranged in the Y direction. In this example, four slits SHE are arranged in each of spaces between adjacent slits SLT. Each slit SHE crosses the memory region MA in the X direction, and one end of each slit SHE is included in the hookup region HA1 and the other end is included in the hookup region HA2. Furthermore, each slit SHE has structure in which an insulator is embedded, for example. Then, each slit SHE divides wiring lines (at least, the select gate line SGD) adjacent to each other via the slit SHE.

In the plan layout of the memory cell array 10 described above, each of regions separated by the slits SLT corresponds to one block ELK. Furthermore, each of regions separated by the slits SLT and SHE corresponds to one string unit SU. Then, in the memory cell array 10, for example, the layout illustrated in FIG. 4 is repeatedly arranged in the Y direction.

Note that, the plan layout of the memory cell array 10 included in the semiconductor memory device 1 according to the first embodiment is not limited to the layout described above. For example, the number of the slits SHE arranged between the adjacent slits SLT can be designed to be any number. The number of the string units SU formed between the adjacent slits SLT can be changed based on the number of the slits SHE arranged between the adjacent slits SLT.

(Structure of Semiconductor Memory Device 1 in Memory Region MA)

Figure 5:
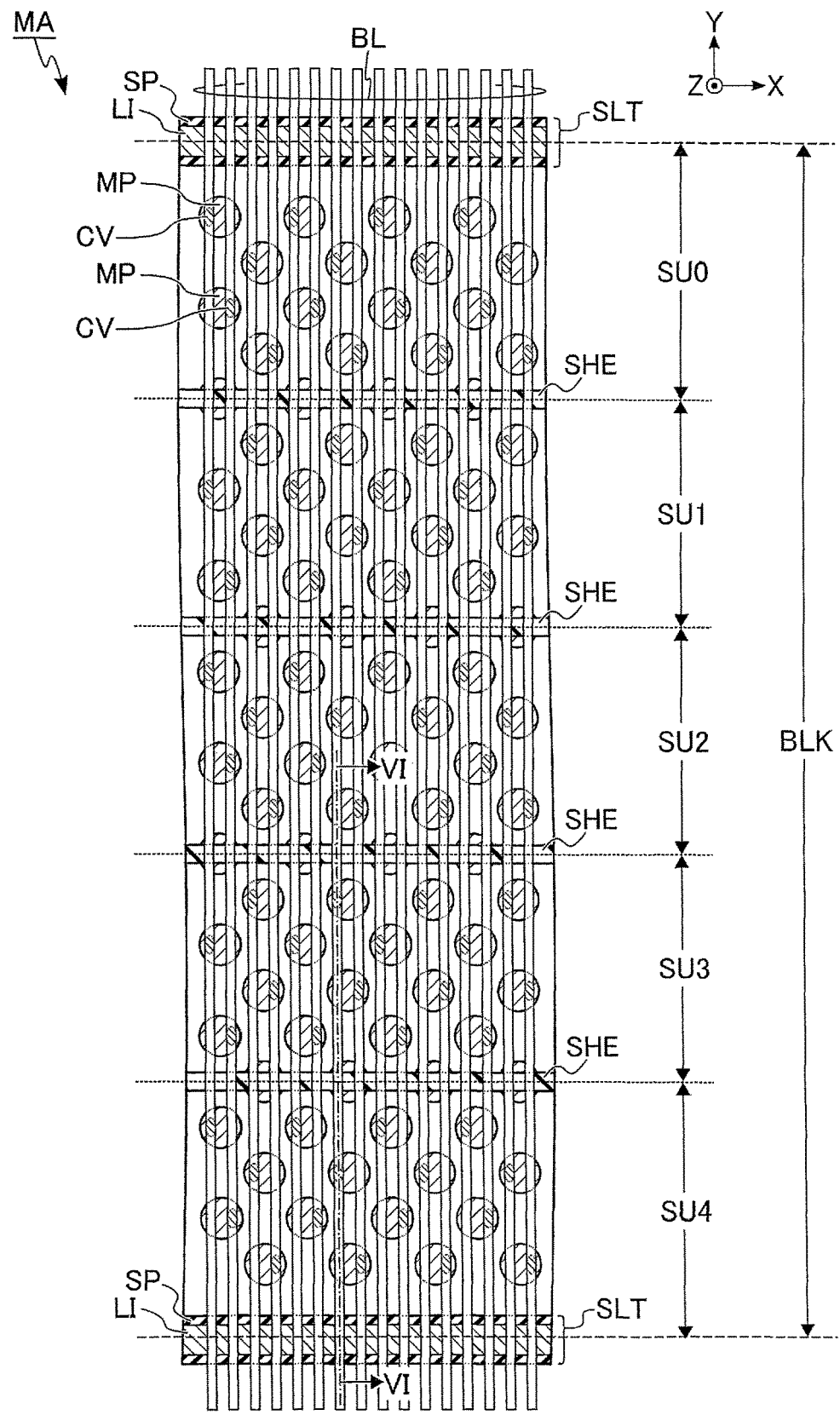
FIG. 5 is a plan view illustrating an example of a plan layout in a memory region of the semiconductor memory device according to the first embodiment.

FIG. 5 is a plan view illustrating an example of a plan layout in the memory region MA of the semiconductor memory device 1 according to the first embodiment. FIG. 5 illustrates a region including one block BLK (that is, the string units SU0 to SU4). As illustrated in FIG. 5, the semiconductor memory device 1 further includes, for example, a plurality of memory pillars MP, a plurality of contacts CV, and a plurality of bit lines BL in the memory region MA. Furthermore, each slit SLT includes a contact LI and spacers SP.

Each of the memory pillars MP functions, for example, as one NAND string NS. The plurality of memory pillars MP is arranged in a staggered pattern of, for example, 24 rows in a region between two adjacent slits SLT. Then, for example, counting from the upper side of the page, each of the memory pillar MP in the 5th row, the memory pillar MP in the 10th row, the memory pillar MP in the 15th row, and the memory pillar MP in the 20th row overlaps one slit SHE.

Each of the plurality of bit lines BL includes a portion provided to extend in the Y direction and is arranged in the X direction. Each bit line BL is arranged to overlap at least one memory pillar MP for each string unit SU. In this example, two bit lines BL are arranged to overlap one memory pillar MP. One bit line EL of the plurality of bit lines BL overlapping the memory pillar MP, and the memory pillar MP are electrically connected together via the contact CV.

For example, the contact CV is omitted between the memory pillar MP in contact with the slit SHE and the bit line BL. In other words, the contact CV is omitted between the memory pillar MP in contact with two different select gate lines SGD and the bit line BL. The number and arrangement of the memory pillars MP, the slits SHE, and the like between the adjacent slits SLT are not limited to the configuration described with reference to FIG. 5, and can be changed as appropriate. The number of the bit lines BL overlapping each memory pillar MP can be designed to be any number.

The contact LI is a conductor having a portion provided to extend in the X direction. The spacers SP are insulators provided on side surfaces of the contact LI. The contact LI is sandwiched by the spacers SP. The contact LI is separated and insulated by the spacers SP from conductors (for example, the word lines WL0 to WL7, and the select gate lines SGD and SGS) adjacent to the contact LI in the Y direction. The spacer SP is, for example, an oxide film.

Figure 6:
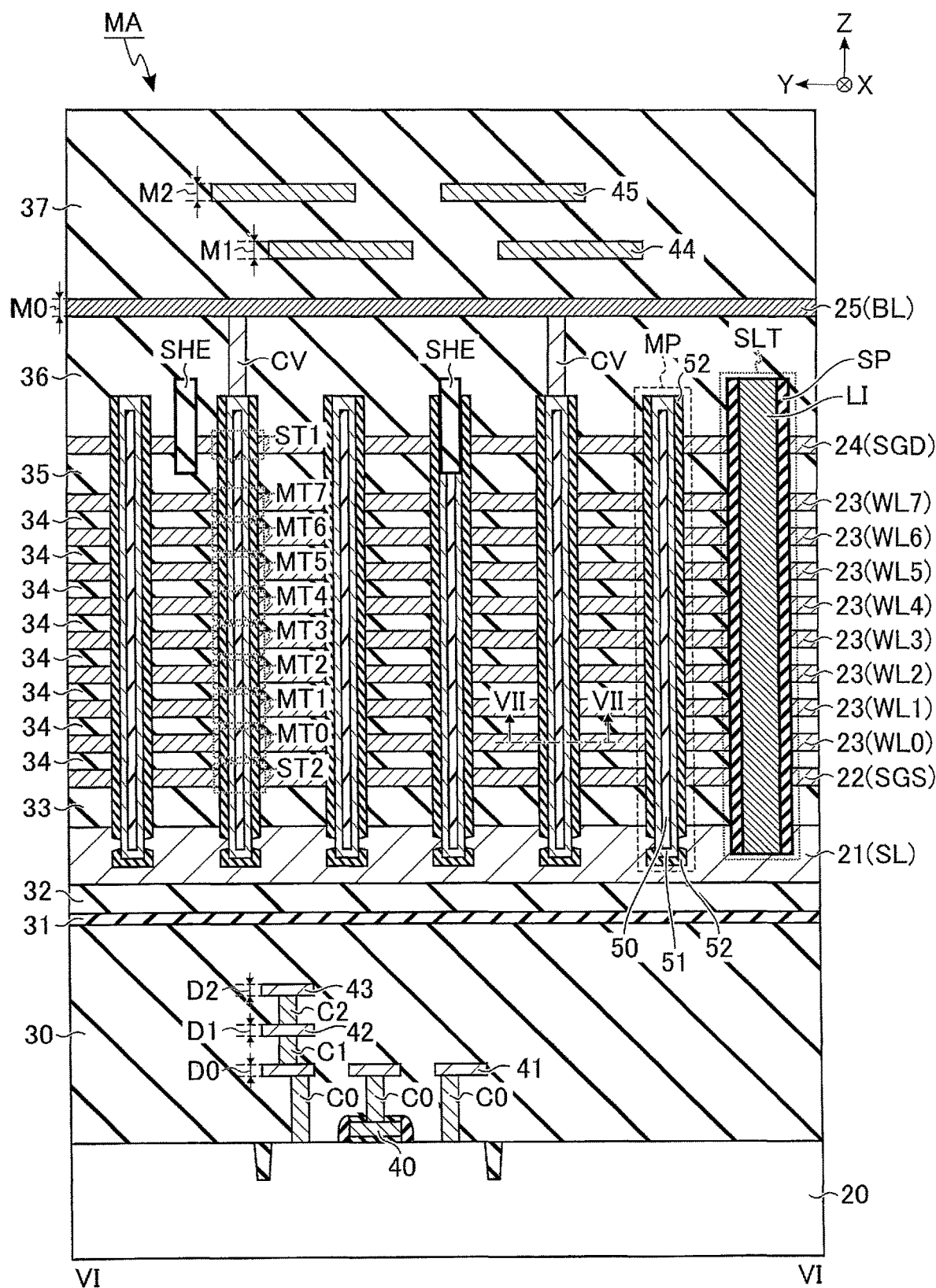
FIG. 6 is a cross-sectional view taken along a line VI-VI of FIG. 5 illustrating an example of cross-sectional structure in the memory region of the semiconductor memory device according to the first embodiment.

FIG. 6 is a cross-sectional view taken along a line VI-VI of FIG. 5 illustrating an example of cross-sectional structure in the memory region MA of the semiconductor memory device 1 according to the first embodiment. As illustrated in FIG. 6, the semiconductor memory device 1 further includes, for example, the semiconductor substrate 20, conductive layers 21 to 25, and insulating layers 30 to 37 in the memory region MA. Hereinafter, details will be described of the structure of the semiconductor memory device 1 in the memory region MA.

The semiconductor substrate 20 is, for example, a P-type semiconductor substrate. The insulating layer 30 is provided on the semiconductor substrate 20. The insulating layer 30 includes a circuit corresponding to the row decoder module 15, the sense amplifier module 16, and the like. For example, the insulating layer 30 can include conductive layers 40 to 43 and contacts C0 to C2. The conductive layer 40 is provided on the semiconductor substrate 20 via a gate insulating film. The conductive layer 40 functions as a gate electrode of a transistor provided under the memory cell array 10. A plurality of the contacts C0 is provided on each of the conductive layer 40 and the semiconductor substrate 20. The contact C0 provided on the semiconductor substrate 20 is connected to an impurity diffusion region (not illustrated) provided on the semiconductor substrate 20. The conductive layer 41 is provided on the contact C0. The contact C1 is provided on the conductive layer 41. The conductive layer 42 is provided on the contact C1. The contact C2 is provided on the conductive layer 42. The conductive layer 43 is provided on the contact C2. Hereinafter, wiring layers provided with the conductive layers 41, 42 and 43 are referred to as "D0", "D1" and "D2", respectively.

The insulating layer 31 is provided on the insulating layer 30. The insulating layer 31 contains, for example, silicon nitride. The insulating layer 31 suppresses hydrogen generated in, for example, a thermal process for forming stack structure of the memory cell array 10 from entering a transistor provided on the semiconductor substrate 20. The insulating layer 31 may be referred to as a barrier film.

The insulating layer 32 is provided on the insulating layer 31. The conductive layer 21 is provided on the insulating layer 32. The conductive layer 21 is formed in a plate shape extending along the XY plane, for example, and is used as the source line SL. The conductive layer 21 contains, for example, phosphorus-doped silicon.

The insulating layer 33 is provided on the conductive layer 21. The conductive layer 22 is provided on the insulating layer 33. The conductive layer 22 is formed in a plate shape extending along the XY plane, for example, and is used as the select gate line SGS. The conductive layer 22 contains, for example, tungsten.

The insulating layers 34 and the conductive layers 23 are alternately stacked on the conductive layer 22. The conductive layer 23 is formed in a plate shape extending along the XY plane, for example. The plurality of conductive layers 23 stacked is respectively used as word lines WL0 to WL7 in order from the semiconductor substrate 20 side. The conductive layer 23 contains, for example, tungsten.

The insulating layer 35 is provided on the uppermost conductive layer 23. The conductive layer 24 is provided on the insulating layer 35. The conductive layer 24 is formed in a plate shape extending along the XY plane, for example, and is used as the select gate line SGD. The conductive layer 24 contains, for example, tungsten.

The insulating layer 36 is provided on the conductive layer 24. The conductive layer 25 is provided on the insulating layer 36. The conductive layer 25 is formed in a line shape extending in the Y direction, for example, and is used as a bit line BL. That is, in a region not illustrated, a plurality of the conductive layers 25 is arranged along the X direction. The conductive layer 25 contains, for example, copper. Hereinafter, a wiring layer provided with the conductive layer 25 is referred to as "M0".

The insulating layer 37 is provided on the conductive layer 25. The insulating layer 37 includes a circuit and the like for connecting the memory cell array 10 to the row decoder module 15 and the sense amplifier module 16. For example, the insulating layer 37 can include conductive layers 44 and 45. The conductive layer 44 is provided in an upper layer than the conductive layer 25 and apart from the conductive layer 25. The conductive layer 45 is provided in an upper layer than the conductive layer 44 and apart from the conductive layer 44. Hereinafter, wiring layers provided with the conductive layers 44 and 45 are referred to as "M1" and "M2", respectively.

Each of the memory pillars MP is provided to extend along the Z direction, and penetrates the insulating layers 33 to 35 and the conductive layers 22 to 24. The bottom of the memory pillar MP reaches the conductive layer 21. A portion where the memory pillar MP and the conductive layer 22 intersect functions as the select transistor ST2. A portion where the memory pillar MP and one conductive layer 23 intersect functions as one memory cell transistor MT. A portion where the memory pillar MP and the conductive layer 24 intersect functions as the select transistor ST1.

Furthermore, each of the memory pillars MP includes, for example, a core member 50, a semiconductor layer 51, and a stacked film 52. The core member 50 is provided to extend along the Z direction. For example, the upper end of the core member 50 is included in an upper layer than the conductive layer 24, and the lower end of the core member 50 is included in a wiring layer provided with the conductive layer 21. The semiconductor layer 51 covers the periphery of the core member 50. A part of the semiconductor layer 51 is in contact with the conductive layer 21 via side surfaces of the memory pillar MP. The stacked film 52 covers the side surfaces and the bottom surface of the semiconductor layer 51 except for a portion where the semiconductor layer 51 and the conductive layer 21 are in contact with each other. The core member 50 contains an insulator such as silicon oxide. The semiconductor layer 51 contains, for example, silicon.

A columnar contact CV is provided on the semiconductor layer 51 in the memory pillar MP. In the illustrated region, two contacts CV corresponding to two memory pillars MP out of six memory pillars MP are illustrated. In the memory region MA, the memory pillar MP that does not overlap the slit SHE and is not connected to the contact CV is connected to a contact CV in a region not illustrated.

On the contact CV, one conductive layer 25, that is, one bit line BL is in contact with the contact CV. One contact CV is connected to one conductive layer 25 in each of spaces separated by the slits SLT and SHE. That is, to each of the conductive layers 25, the memory pillar MP provided between adjacent slits SLT and SHE, and the memory pillar MP provided between two adjacent slits SHE are electrically connected.

The slit SLT includes a portion provided along the XZ plane, for example, and divides the conductive layers 22 to 24 and the insulating layers 33 to 35. The contact LI in the slit SLT is provided along the slit SLT. A part of the upper end of the contact LI is in contact with the insulating layer 36. The lower end of the contact LI is in contact with the conductive layer 21. The contact LI is used, for example, as a part of the source line SL. The spacers SP are provided at least between the contact LI and the conductive layers 22 to 24. The contact LI is separated and insulated by the spacers SP from the conductive layers 22 to 24.

The slit SHE includes a portion provided along the XZ plane, for example, and divides at least the conductive layer 24. The upper end of the slit SHE is in contact with the insulating layer 36. The lower end of the slit SHE is in contact with the insulating layer 35. The slit SHE contains an insulator such as silicon oxide. The upper end of the slit SHE and the upper end of the slit SLT may or may not be aligned. Furthermore, the upper end of the slit SHE and the upper end of the memory pillar MP may or may not be aligned.

FIG. 7 is a cross-sectional view taken along a line VII-VII of FIG. 6 illustrating an example of cross-sectional structure of the memory pillar MP in the semiconductor memory device 1 according to the first embodiment. FIG. 7 illustrates the cross-sectional structure of the memory pillar MP in a layer parallel to the surface of the semiconductor substrate 20 and including the conductive layer 23. As illustrated in FIG. 7, the stacked film 52 includes, for example, a tunnel insulating film 53, an insulating film 54, and a block insulating film 55.

In a cross section including the conductive layer 23, the core member 50 is provided in a central portion of the memory pillar MP. The semiconductor layer 51 surrounds the side surface of the core member 50. The tunnel insulating film 53 surrounds the side surface of the semiconductor layer 51. The insulating film 54 surrounds the side surface of the tunnel insulating film 53. The block insulating film 55 surrounds the side surface of the insulating film 54. The conductive layer 23 surrounds the side surface of the block insulating film 55. Each of the tunnel insulating film 53 and the block insulating film 55 contains, for example, silicon oxide. The insulating film 54 contains, for example, silicon nitride.

In each of the memory pillars MP described above, the semiconductor layer 51 is used as a channel (current path) of the memory cell transistors MT0 to MT7 and the select transistors ST1 and ST2. The insulating film 54 is used as a charge storage layer of the memory cell transistor MT. The semiconductor memory device 1 can cause a current to flow via the memory pillar MP between the bit line BL and the contact LI by turning on the memory cell transistors MT0 to MT7 and the select transistors ST1 and ST2.

(Structure of Semiconductor Memory Device 1 in Hookup Region HA1 and Contact Region C3T)

Figure 8:
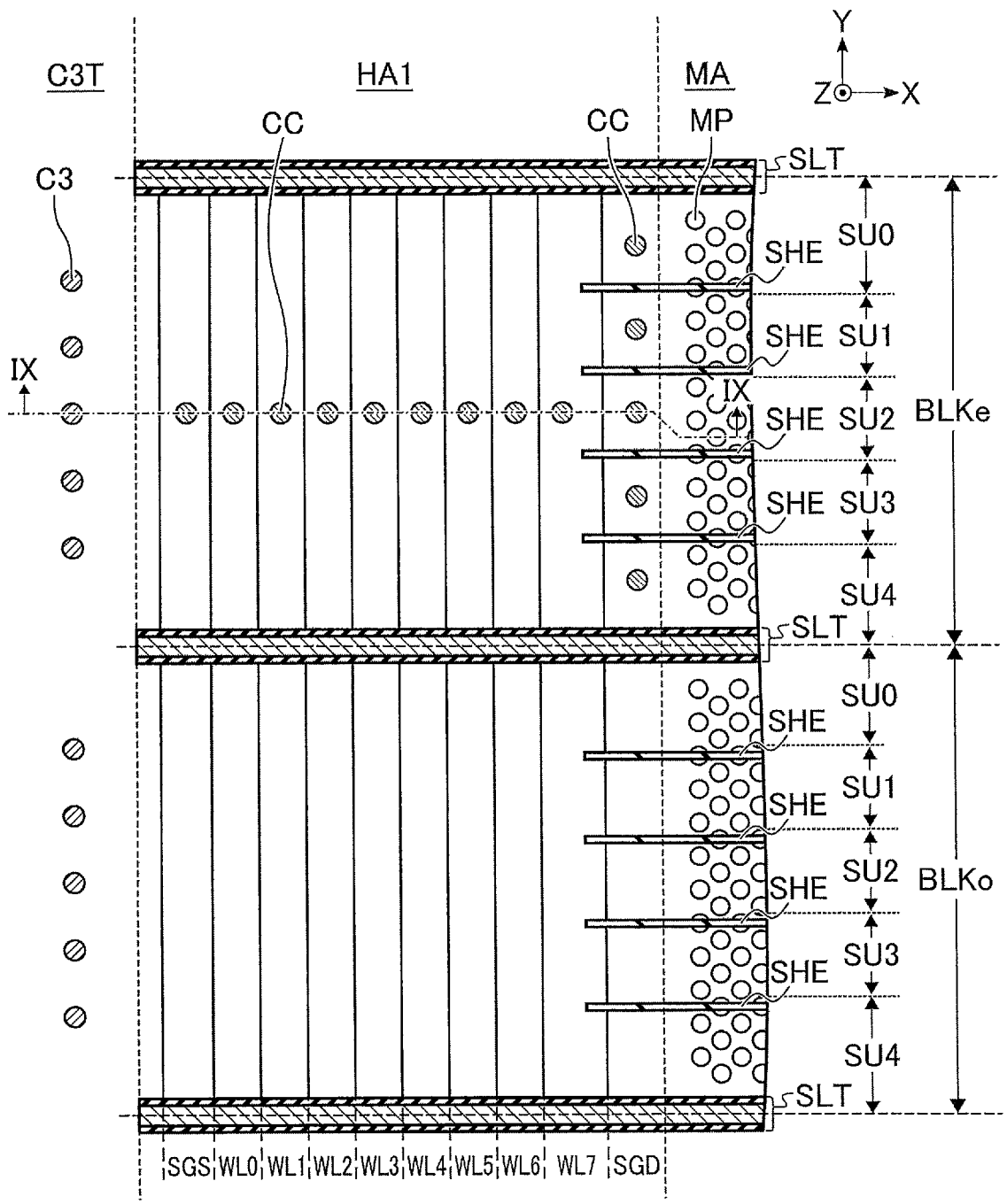
FIG. 8 is a plan view illustrating an example of a plan layout in a hookup region and a contact region of the semiconductor memory device according to the first embodiment.

FIG. 8 is a plan view illustrating an example of a plan layout in the hookup region HA1 and the contact region C3T of the semiconductor memory device 1 according to the first embodiment. FIG. 8 illustrates a region corresponding to blocks BLKe and BLKo adjacent to each other in the hookup region HA1, and a part of the memory region MA and the contact region C3T. "BLKe" corresponds to an even numbered block BLK. "BLKo" corresponds to an odd-numbered block BLK.

As illustrated in FIG. 8, the semiconductor memory device 1 includes a plurality of contacts CC in the hookup region HA1, and a plurality of contacts C3 in the contact region C3T. The contact CC is connected to any of the conductive layers provided in the memory cell array 10. The contact C3 is used, for example, for connection between the contact CC and the row decoder module 15.

Furthermore, in the hookup region HA1, each of the select gate line SGS, the word lines WL0 to WL7, and the select gate line SGD includes a portion (terrace portion) that does not overlap an upper wiring layer (conductive layer). In this example, a plurality of the terrace portions of the select gate line SGD is provided.

In the hookup region HA1, the shape of the portion that does not overlap the upper wiring layer is similar to that of a step, a terrace, a rimstone, or the like. Specifically, level differences are respectively provided between the select gate line SGS and the word line WL0, between the word line WL0 and the word line WL1, between the word line WL6 and the word line WL7, and between the word line WL7 and the select gate line SGD. In this example, staircase structure having a level difference in the X direction is formed by an end of the select gate line SGS, ends of the word lines WL0 to WL7, and an end of the select gate line SGD.

In a region where the hookup region HA1 and the block BLKe overlap, the plurality of contacts CC is provided on the terrace portions of the select gate line SGS, the word lines WL0 to WL7, and the select gate lines SGD0 to SGD4, respectively. Then, in a region where the hookup region HA1 and the block BLKo overlap, the contacts CC for the stacked wiring lines are omitted.

Although illustration is omitted, in a region where the hookup region HA2 and the block BLKo overlap, a plurality of contacts CC is provided on terrace portions of the select gate line SGS, the word lines WL0 to WL7, and the select gate lines SGD0 to SGD4, respectively. Then, in a region where the hookup region HA2 and the block BLKe overlap, the contacts CC for the stacked wiring lines are omitted.

That is, in the semiconductor memory device 1 according to the first embodiment, a plan layout of the block BLKo in the hookup region HA2 is similar to a layout in which structure of the block BLKe in the hookup region HA1 is inverted in each of the X direction and the Y direction. A plan layout of the block BLKe in the hookup region HA2 is similar to a layout in which structure of the block BLKo in the hookup region HA1 is inverted in each of the X direction and the Y direction.

FIG. 9 is a cross-sectional view taken along a line IX-IX of FIG. 8 illustrating an example of cross-sectional structure in the hookup region HA1 and the contact region C3T of the semiconductor memory device 1 according to the first embodiment. As illustrated in FIG. 9, the semiconductor memory device 1 further includes conductive layers 26 in the hookup region HAT, and a conductive layer 27 in the contact region C3T. An end of stacked wiring structure corresponding to the memory cell array 10 is provided in a staircase pattern by the end of each of the select gate line SGS, the word lines WL0 to WL7, and the select gate line SGD.

The plurality of contacts CC is provided on the terrace portions of the select gate line SGS, the word lines WL0 to WL7, and the select gate line SGD, respectively. One conductive layer 26 is provided on each contact CC. The conductive layer 26 is included in the same wiring layer as the conductive layer 25, for example. A contact V0 is provided on the conductive layer 26. In FIG. 9, the contact V0 is illustrated corresponding to the select gate line SGS among a plurality of the contacts V0. The conductive layer 44 is provided on the contact V0.

The contact C3 is provided on the conductive layer 43, and penetrates the insulating layers 31, 32, and 36. The conductive layer 27 is provided on the contact C3. In FIG. 9, one set is illustrated of the conductive layer 27 and the contact C3 associated with the select gate line SGS among a plurality of the sets of the conductive layer 27 and the contact C3. The conductive layer 27 is included in the same wiring layer as the conductive layer 26. The contact V0 is provided on the conductive layer 27 associated with the select gate line SGS. The conductive layer 44 is provided on the contact V0.

As a result, the conductive layer 22 corresponding to the select gate line SGS is electrically connected to a transistor provided in a lower layer than the insulating layer 31 via a set of the contacts CC and C3. The conductive layers 23 and 24 included in the stacked wiring structure corresponding to the memory cell array 10 each are also electrically connected to a transistor provided in a lower layer than the insulating layer 31 via a set of the contacts CC and C3, similarly to the conductive layer 22. That is, each of the select gate line SGS, the word lines WL0 to WL7, and the select gate lines SGD0 to SGD4 is electrically connected to the row decoder module 15 via a corresponding set of the contacts CC and C3.

Note that, it suffices that the semiconductor memory device 1 has a configuration in which a voltage can be applied to each of the select gate line SGS, the word lines WL0 to WL7, and the select gate lines SGD0 to SGD4 from the contact CC arranged in at least one of the hookup regions HA1 or HA2. To each wiring layer, the contact CC may be connected, in each of the hookup region HA1 and the hookup region HA2. In this case, for example, to the word line WL, the voltage is applied from both the contact CC in the hookup region HA1 and the contact CC in the hookup region HA2. Furthermore, the hookup region HA may be inserted in an intermediate portion of the memory region MA. In this case, for example, the word line WL is electrically connected to a transistor provided in a lower layer than the insulating layer 31 via a contact penetrating the stacked wiring structure of the memory cell array 10.

(Structure of Sealing Members ESn and ESp and Conductive Portion DP)

Figure 10:
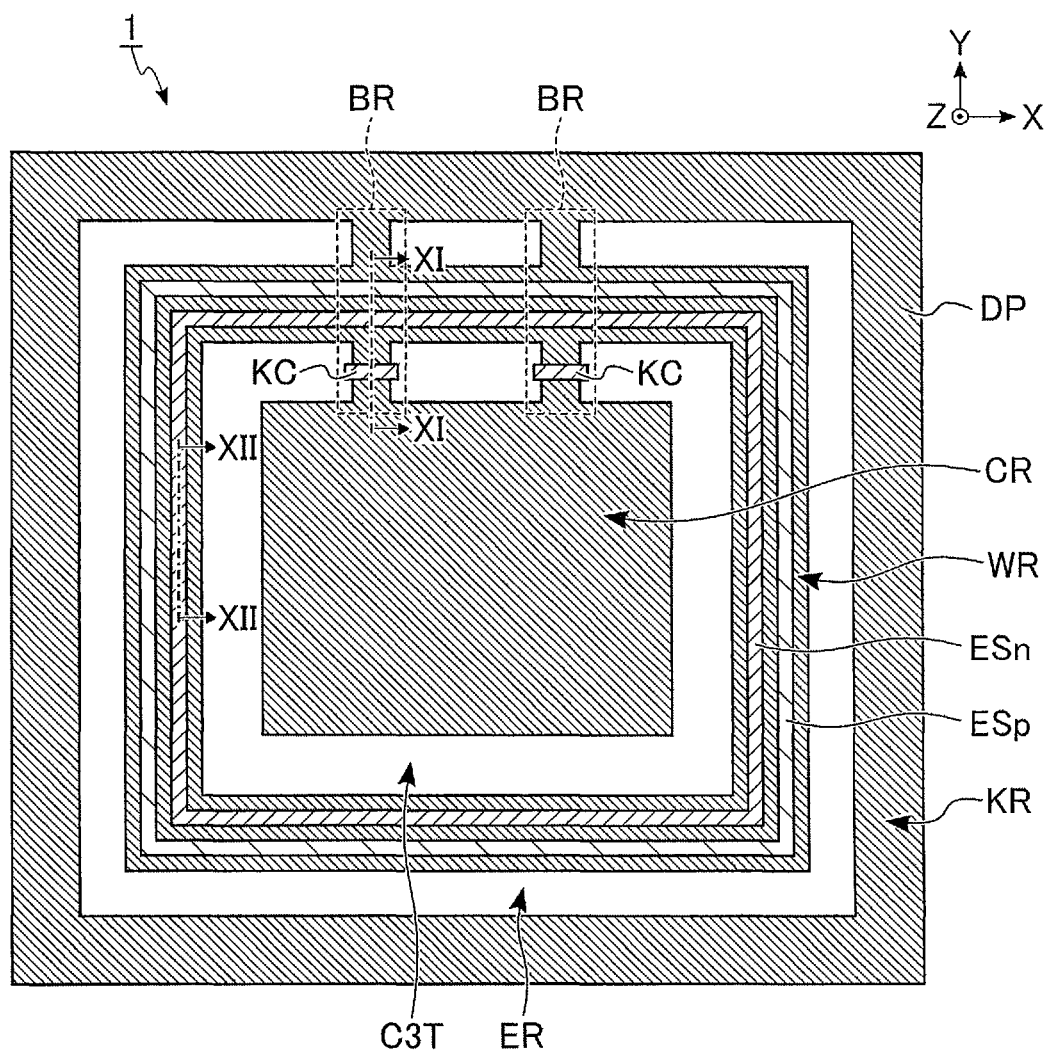
FIG. 10 is a plan view illustrating an example of a plan layout of a sealing member and a conductive portion in the semiconductor memory device according to the first embodiment.

FIG. 10 is a plan view illustrating an example of a plan layout of the sealing member ES and a conductive portion DP in the semiconductor memory device 1 according to the first embodiment. FIG. 10 illustrates the same region as the plan layout of the semiconductor memory device 1 according to the first embodiment illustrated in FIG. 3. As illustrated in FIG. 10, the semiconductor memory device 1 further includes the conductive portion DP, sealing members ESn and ESp, and a dividing portion KC.

The conductive portion DP is provided on entire surfaces of, for example, the core region CR, the wall region WR, and the kerf region KR, and includes two bridge portions BR. The bridge portion BR is provided to extend in the Y direction, for example. In the bridge portion BR, the conductive portion DP in the core region CR and the conductive portion DP in the wall region WR are connected together, and the conductive portion DP in the wall region WR and the conductive portion DP in the kerf region KR are connected together. In the bridge portion BR, a portion where the conductive portion DP in the core region CR and the conductive portion DP in the wall region WR are connected together, and a portion where the conductive portion DP in the wall region WR and the conductive portion DP in the kerf region KR are connected together do not necessarily have to be arranged on a straight line. It suffices that at least one bridge portion BR is provided, and can be arranged at any location.

The sealing member ESn is a structure capable of releasing positive charge generated inside and outside the wall region WR from the conductive portion DP to the semiconductor substrate 20. The sealing member ESp is a structure capable of releasing negative charge generated inside and outside the wall region WR from the conductive portion DP to the semiconductor substrate 20. Each of the sealing members ESn and ESp is provided in a square ring to surround the outer periphery of the core region CR in the wall region WR. The sealing member ESp surrounds the outer periphery of the sealing member ESn and is separated from the sealing member ESn. Each of the sealing members ESn and ESp divides the conductive portion DP provided in the wall region WR and is electrically connected to the conductive portion DP. Each of the sealing members ESn and ESp can suppress occurrence of arcing that can occur during etching of a deep hole, for example, in a manufacturing process of the semiconductor memory device 1.

Furthermore, each of the sealing members ESn and ESp can suppress permeation of water or the like from the outside of the wall region WR into the core region CR. Each of the sealing members ESn and ESp can suppress stress generated in an interlayer insulating film (for example, tetraethoxysilane (TEOS)) of the semiconductor memory device 1. Furthermore, each of the sealing members ESn and ESp can also be used as a crack stopper. That is, each of the sealing members ESn and ESp can suppress a crack from reaching the inside of the semiconductor memory device 1 when the crack occurs in the peripheral portion of a chip on which the semiconductor memory device 1 is formed in the dicing process. Each of the sealing members ESn and ESp may be referred to as an "edge seal" or a "crack stopper".

The dividing portion KC divides the conductive portion DP of the bridge portion BR. Conductive portions DP adjacent to each other via the dividing portion KC are insulated from each other by the dividing portion KC. In this example, the dividing portion KC is provided at each of a portion where each of the two bridge portions BR and the contact region C3T overlap. It suffices that the dividing portion KC insulates at least the conductive portion DP connected to the sealing members ESn and ESp from the conductive portion DP arranged in the core region CR. A plurality of the dividing portions KC may be provided on the bridge portion BR. The dividing portion KC may be referred to as a "kerf cut".

Figure 11:
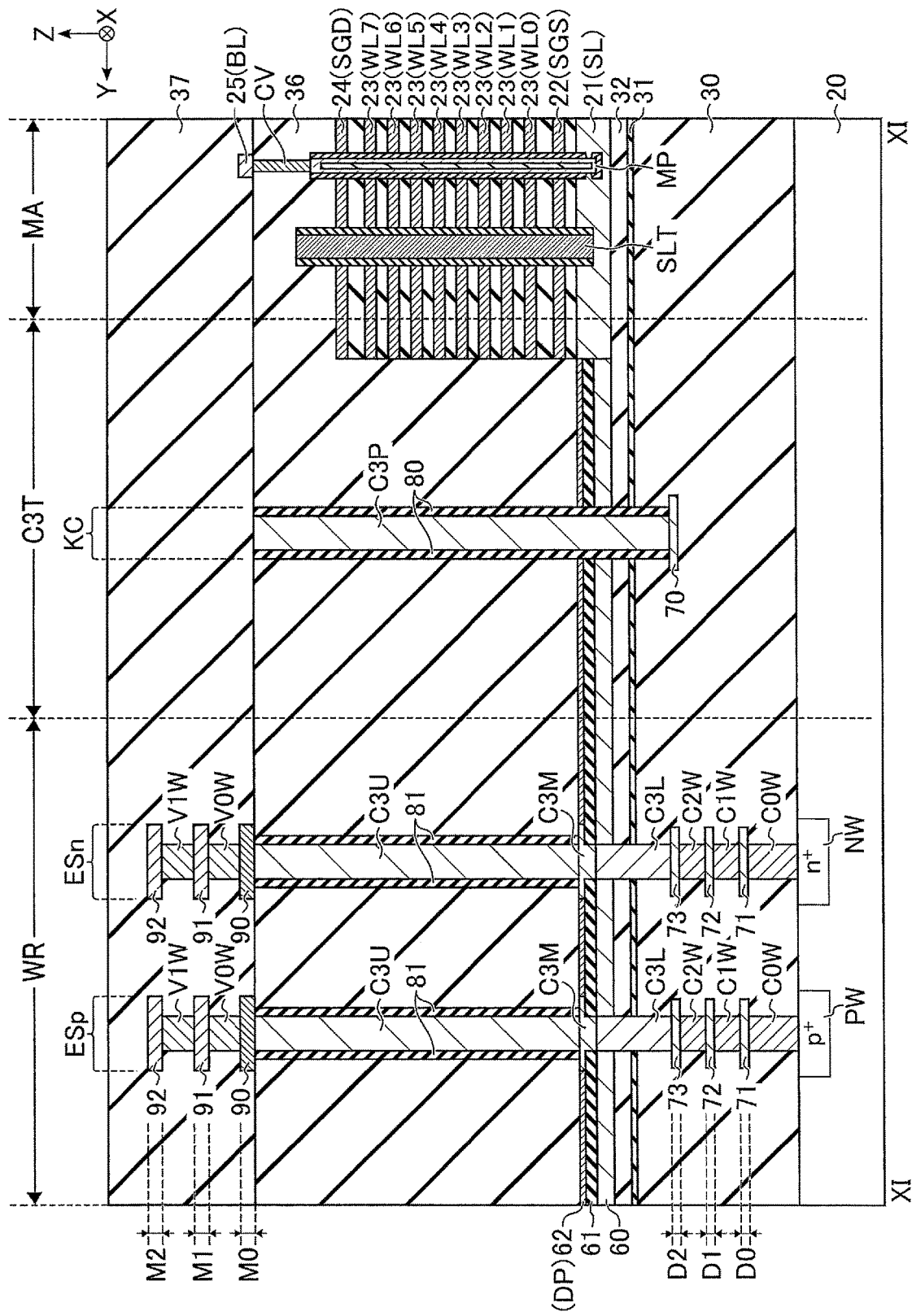
FIG. 11 is a cross-sectional view taken along a line XI-XI of FIG. 10 illustrating an example of cross-sectional structure in the contact region and a wall region of the semiconductor memory device according to the first embodiment.

FIG. 11 is a cross-sectional view taken along a line XI-XI of FIG. 10 illustrating an example of cross-sectional structure in the contact region C3T and the wall region WR of the semiconductor memory device 1 according to the first embodiment. FIG. 11 includes a cross section along the bridge portion BR, and also displays a part of the memory region MA. As illustrated in FIG. 11, the semiconductor memory device 1 further includes a conductive layer 60, an insulating layer 61, and a conductive layer 62. The semiconductor memory device 1 includes a conductive layer 70, spacers 80, and a contact C3P in the contact region C3T. The semiconductor memory device 1 includes two sets of conductive layers 71, 72, 73, 90, 91, and 92, and contacts C0W, C1W, C2W, C3L, C3M, C3U, V0W, and V1W in the wall region WR. The semiconductor substrate 20 includes an N-type impurity diffusion region NW and a P-type impurity diffusion region PW.

The conductive layer 60 is provided on the insulating layer 32. The insulating layer 61 is provided on the conductive layer 60. The conductive layer 62 is provided on the insulating layer 61. The upper surface of the conductive layer 62 and the upper surface of the conductive layer 21 are aligned. A set of the conductive layer 60, the insulating layer 61, and the conductive layer 62 is provided at the same height as the source line SL. A planar shape of the set of the conductive layer 60, the insulating layer 61, and the conductive layer 62 corresponds to a planar shape of the conductive portion DP. In the vicinity of the boundary between the memory region MA and the contact region C3T, the conductive layer 60 and the conductive layer 21 are electrically connected together and contiguously provided. In the vicinity of the boundary between the memory region MA and the contact region C3T, the conductive layer 62 and the conductive layer 21 are electrically connected together and contiguously provided. The conductive layer 62 is used as the conductive portion DP. The conductive layer 62 is, for example, silicon.

The conductive layer 70 is included in the wiring layer D2. The contact C3P is provided on the conductive layer 70. The contact C3P divides the insulating layers 31 and 32, the conductive layer 60, the insulating layer 61, the conductive layer 62, and the insulating layer 36. The contact C3P is a plate-shaped conductor extending along the XZ plane. The spacers 80 are insulators provided on the side surfaces of the contact C3P. The contact C3P is sandwiched by the spacers 80. The contact C3P is separated and insulated by the spacers 80 from conductors (for example, the conductive layer 60 and the conductive layer 62) adjacent to the contact C3P in the Y direction. The spacer 80 is, for example, a silicon oxide film. A set of the contact C3P and the spacers 80 corresponds to the dividing portion KC.

The conductive layers 71, 72, 73, 90, 91, and 92 are included in the wiring layers D0, D1, D2, M0, M1, and M2, respectively. The contact C0W is provided on the semiconductor substrate 20. The conductive layer 71 is provided on the contact C0W. The contact C1W is provided on the conductive layer 71. The conductive layer 72 is provided on the contact C1W. The contact C2W is provided on the conductive layer 72. The conductive layer 73 is provided on the contact C2W. The contact C3L is provided on the conductive layer 73. The contact C3L is in contact with and electrically connected to the conductive layer 60. A set of the contacts C0W, C1W, C2W, and C3L and the conductive layers 71, 72, and 73 divides the insulating layer 30. Furthermore, the contact C3L divides the insulating layers 31 and 32 and the conductive layer 60.

The contact C3M is provided on the contact C3L. The contact C3M divides the insulating layer 61 and the conductive layer 62. The upper end of the contact C3M is included in a layer (height) provided with the source line SL. Side surfaces of the contact C3M are in contact with the conductive layer 62. In other words, a side surface portion adjacent to the upper end of the contact C3M is in contact with the conductive layer 62. Side surfaces of a connecting portion of the contacts C3L and C3M are aligned. The width in the Y direction of a portion of the contact C3M by which the conductive layer 62 is divided is wider than the width in the Y direction of a portion of the contact C3M by which the insulating layer 61 is divided. In other words, the width in the Y direction of the contact C3M at the contact portion between the contact C3M and the conductive layer 62 is wider than the width in the Y direction of the contact C3M at the contact portion between the contact C3L and the contact C3M.

The contact C3U is provided on the contact C3M. The contact C3U divides the insulating layer 36. The upper surface of the contact C3U and the upper surface of the contact C3P are aligned. The height of the upper surfaces of the contacts C3U and C3P is higher than the upper surface of the memory pillar MP. Spacers 81 are insulators provided on side surfaces of the contact C3U. The contact C3U is sandwiched by, for example, the spacers 81. The contact C3U is separated by, for example, the spacers 81 from the insulating layer 36 adjacent in the Y direction to the contact C3U. The spacer 81 is, for example, a silicon oxide film. That is, the contact C3U includes side walls of oxide film, whereas, for example, the contacts C3L and C3M do not include side walls of oxide film.

The conductive layers 90, 91, and 92 are included in the wiring layers M0, M1, and M2, respectively. The conductive layer 90 is provided on the contact C3U. The contact V0W is provided on the conductive layer 90. The conductive layer 91 is provided on the contact V0W. The contact V1W is provided on the conductive layer 91. The conductive layer 92 is provided on the contact V1W. A set of the contacts V0W and V1W and the conductive layers 90, 91, and 92 divides the insulating layer 37.

Each of the contacts C0W, C1W, C2W, C3L, C3M, C3U, V0W, and V1W is, for example, metal. A set of the conductive layers 71, 72, 73, 90, 91, and 92 and the contacts C0W, C1W, C2W, C3L, C3M, C3U, V0W, and V1W corresponds to any of the sealing members ESn and ESp. The set of the conductive layers 71, 72, 73, 90, 91, and 92 and the contacts C0W, C1W, C2W, C3L, C3M, C3U, V0W, and V1W corresponding to the sealing member ESn is connected to the N-type impurity diffusion region NW of the semiconductor substrate 20. The set of the conductive layers 71, 72, 73, 90, 91, and 92 and the contacts C0W, C1W, C2W, C3L, C3M, C3U, V0W, and V1W corresponding to the sealing member ESp is connected to the P-type impurity diffusion region PW of the semiconductor substrate 20.

Figure 12:
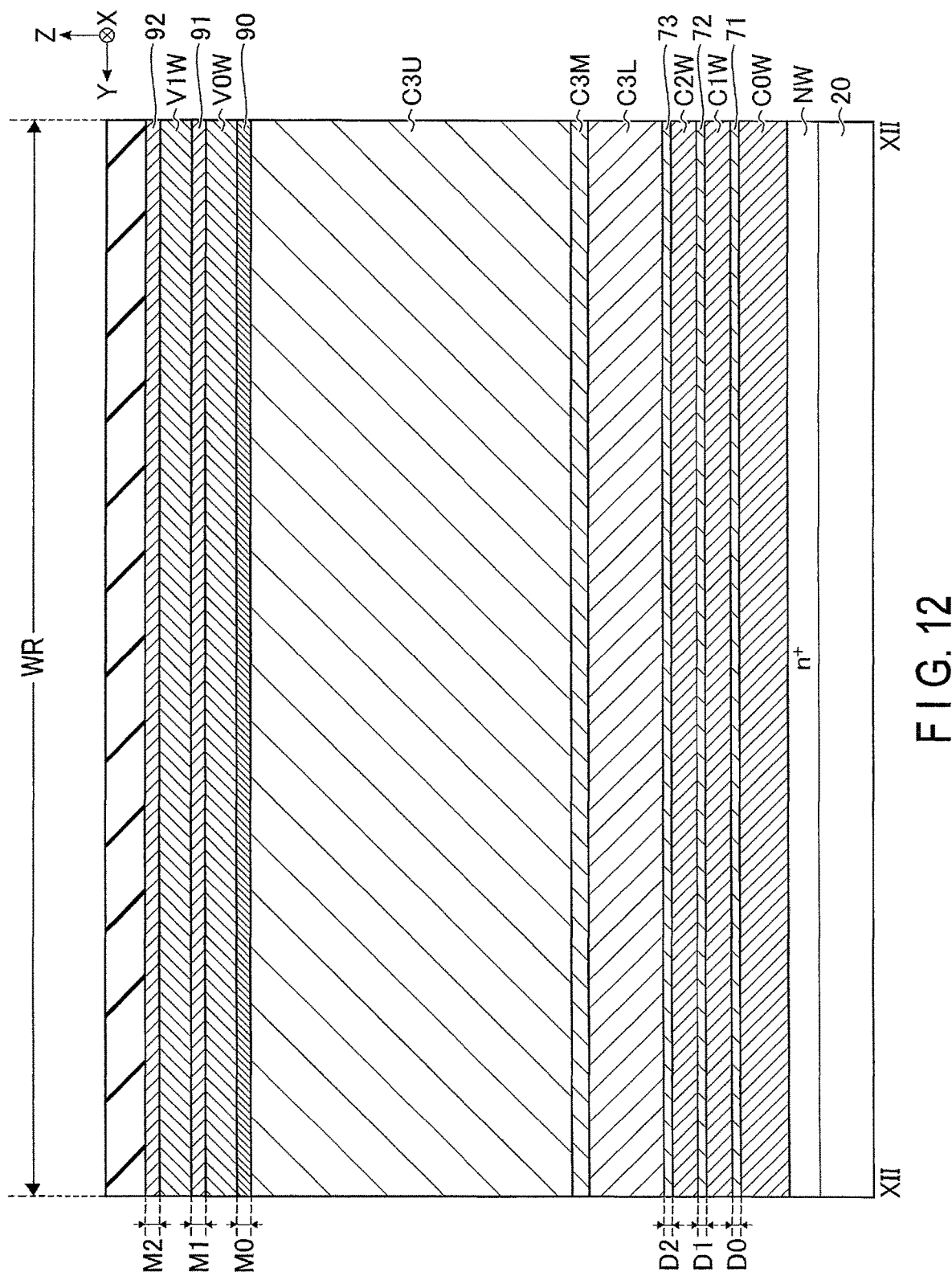
FIG. 12 is a cross-sectional view taken along a line XII-XII of FIG. 10 illustrating an example of cross-sectional structure in the wall region of the semiconductor memory device according to the first embodiment.

FIG. 12 is a cross-sectional view taken along a line XII-XII of FIG. 10 illustrating an example of cross-sectional structure in the wall region WR of the semiconductor memory device 1 according to the first embodiment. FIG. 12 illustrates a cross section along an extending direction of the sealing member ESn. As illustrated in FIG. 12, each of the contacts C0W, C1W, C2W, C3L, C3M, C3U, V0W, and V1W and the conductive layers 71 to 73 and 90 to 92 included in the sealing member ESn includes a portion extending in the Y direction. Furthermore, in a region not illustrated, each of the contacts C0W, C1W, C2W, C3L, C3M, C3U, V0W, and V1W and the conductive layers 71 to 73 and 90 to 92 included in the sealing member ESn also includes a portion extending in the X direction.

As a result, each of the contacts C0W, C1W, C2W, C3L, C3M, C3U, V0W, and V1W and the conductive layers 71 to 73 and 90 to 92 in the sealing member ESn is provided in a square ring, for example, and surrounds the core region CR. The sealing member ESn can be regarded as a wall between the core region CR and the kerf region KR. Cross-sectional structure of the sealing member ESp is similar to cross-sectional structure of the sealing member ESn, except for the type of the impurity diffusion region connected to the bottom.

Note that, it suffices that the sealing member ESn is connected to at least the N-type impurity diffusion region NW. The N-type impurity diffusion region NW does not necessarily have to be provided in a square ring as long as it includes a sufficient region as a discharge path. The N-type impurity diffusion region NW is formed, for example, in a P-type well region of the semiconductor substrate 20. Similarly, it suffices that the sealing member ESp is connected to at least the P-type impurity diffusion region PW. The P-type impurity diffusion region PW does not necessarily have to be provided in a square ring as long as it includes a sufficient region as a discharge path. The P-type impurity diffusion region PW is formed, for example, in the P-type well region of the semiconductor substrate 20.

[1-2] Method for Manufacturing Semiconductor Memory Device 1

Figure 13:
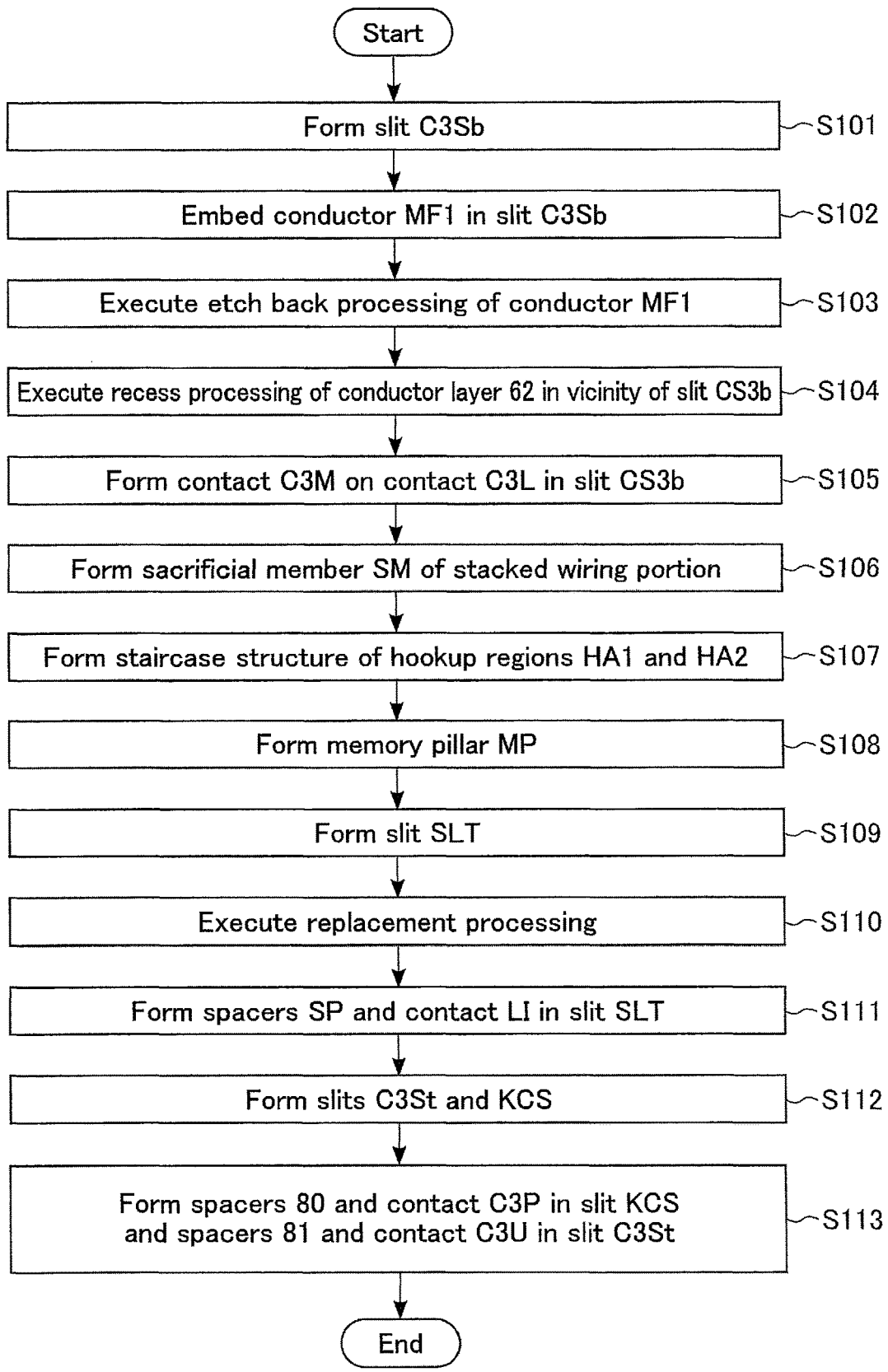
FIG. 13 is a flowchart illustrating an example of a method for manufacturing the semiconductor memory device according to the first embodiment.

FIG. 13 is a flowchart illustrating an example of a method for manufacturing the semiconductor memory device 1 according to the first embodiment. Each of FIGS. 14 to 26 is a cross-sectional view illustrating an example of cross-sectional structure during manufacturing of the semiconductor memory device 1 according to the first embodiment. Each of FIGS. 14 to 26 illustrates the same region as the cross-sectional structure of the semiconductor memory device 1 according to the first embodiment illustrated in FIG. 11, and illustrates a region where the sealing members ESn and ESp and the dividing portion KC are formed. Hereinafter, with reference to FIG. 13 as appropriate, an example will be described of a series of manufacturing processes from formation of a source line portion SLP used for formation of the source line SL to formation of the contacts C3U and C3P.

Figure 14:
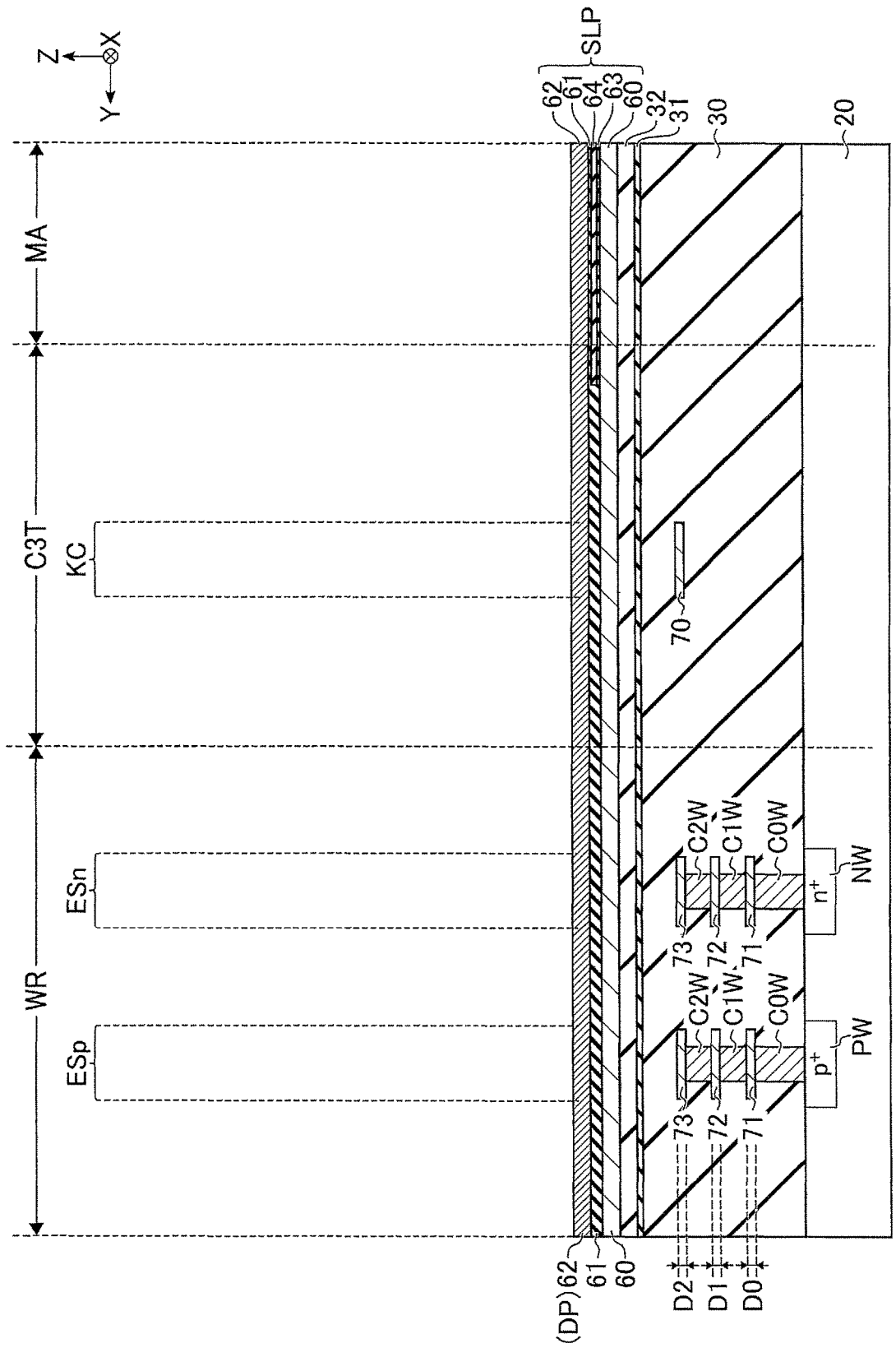

Before processing illustrated in FIG. 13 is executed, as illustrated in FIG. 14, a configuration from the peripheral circuit on the semiconductor substrate 20 to the source line portion SLP is formed. Briefly, on the semiconductor substrate 20, the N-type impurity diffusion region NW is formed corresponding to a region where the sealing member ESn is formed, and the P-type impurity diffusion region PW is formed in a region where the sealing member ESp is formed. The contact C0W is formed on each of the N-type impurity diffusion region NW and the P-type impurity diffusion region PW. The conductive layer 71 is formed on the contact C0W and in the wiring layer D0. The contact C1W is formed on the conductive layer 71. The conductive layer 72 is formed on the contact C1W and in the wiring layer D1. The contact C2W is formed on the conductive layer 72. The conductive layer 73 is formed on the contact C2W and in the wiring layer D2. Furthermore, in the wiring layer D2, the conductive layer 70 is also formed in the region where the dividing portion KC is formed. The conductive layers 70 to 73 and the contacts C0W to C2W are covered with the insulating layer 30. The insulating layer 30 can include a plurality of types of insulating layers.

On the insulating layer 30 including the conductive layers 70 to 73 and the contacts C0W to C2W, the insulating layers 31 and 32, the conductive layer 60, an insulating layer 63, and a sacrificial member 64 are formed in this order. Then, the insulating layer 63 and the sacrificial member 64 provided outside the memory region MA are removed, and the insulating layer 61 and the conductive layer 62 are formed in this order. At this time, it is sufficient that the sacrificial member 64 is removed at a portion corresponding to the dividing portion KC and portions corresponding to the sealing members ESn and ESp. Furthermore, the insulating layer 63 may remain in the contact region C3T and the wall region WR. The height of the insulating layer 61 may or may not be uniform in the memory region MA, the contact region C3T, and the wall region WR. The thickness of the conductive layer 62 is thicker than that of the conductive layer 62 illustrated in FIG. 11. A set of the conductive layer 60, the insulating layer 63, the sacrificial member 64, the insulating layer 61, and the conductive layer 62 provided in the memory region MA corresponds to the source line portion SLP. Then, the processing of steps S101 to S113 is executed in order.

Figure 15:
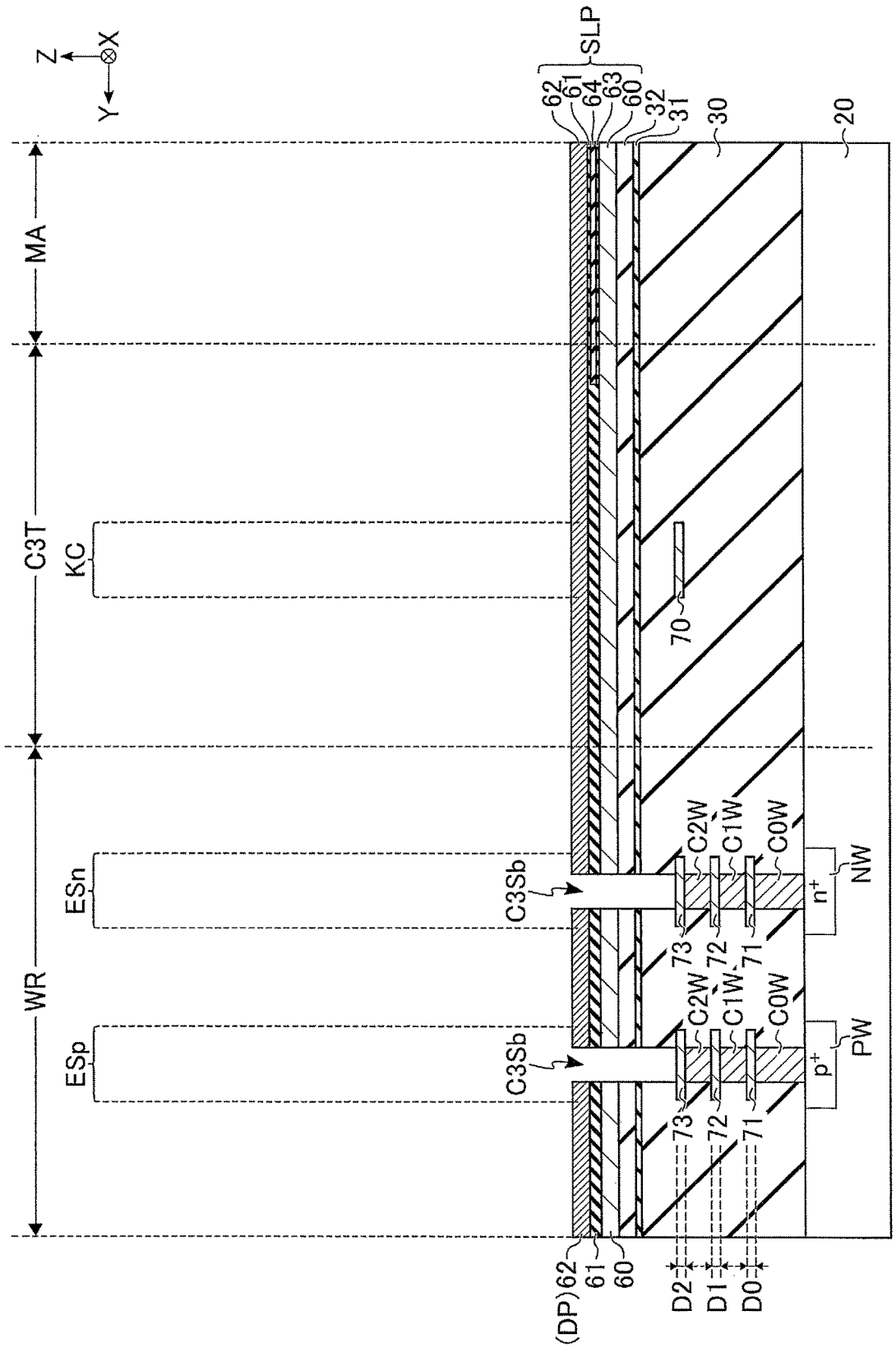

By the processing of step S101, as illustrated in FIG. 15, slits C3Sb are formed. Specifically, first, a mask is formed in which the region where the sealing member ESn is formed and the region where the sealing member ESp is formed are each opened. Then, anisotropic etching using the mask is executed, and the slits C3Sb are formed that divide the conductive layer 62, the insulating layer 61, the conductive layer 60, the insulating layers 32 and 31, and a part of the insulating layer 30. At the bottom of each slit C3Sb, a surface of the conductive layer 73 is exposed.

By the processing of step S102, as illustrated in FIG. 16, a conductor MF1 is embedded in the slit C3Sb. The conductor MF1 is formed by, for example, Chemical Vapor Deposition (CVD). As the conductor MF1, for example, tungsten is used.

Figure 17:
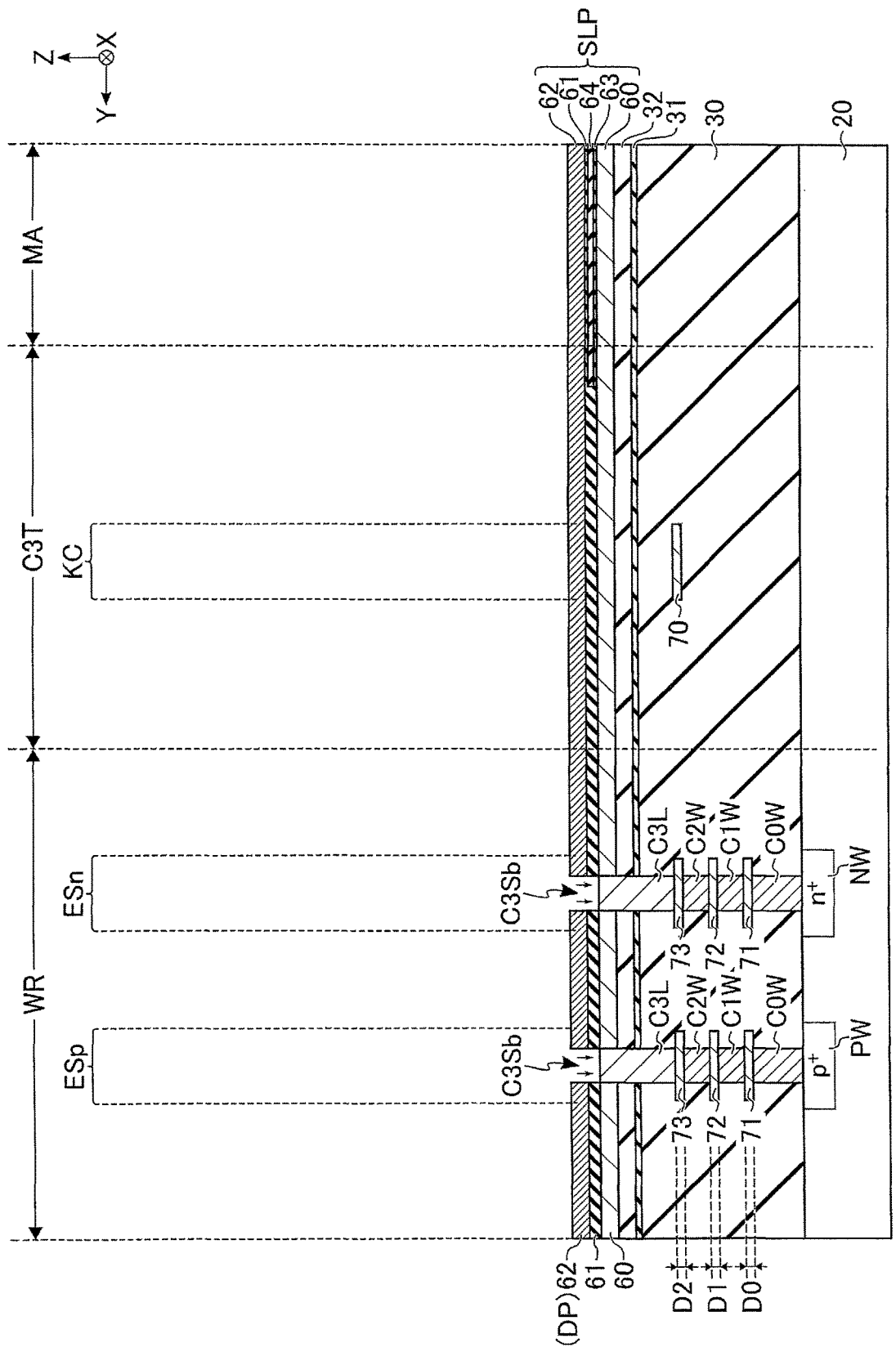

By the processing of step S103, as illustrated in FIG. 17, etch back processing of the conductor MF1 is executed. By the etch back processing, the conductor MF1 on the conductive layer 62 is removed. Furthermore, the upper surface of the conductor MF1 in the slit C3Sb is processed to be included in the height of a layer in which the insulating layer 61 is formed, for example. At this time, the conductor MF1 remaining in the lower part of the slit C3Sb corresponds to the contact C3L.

Figure 18:
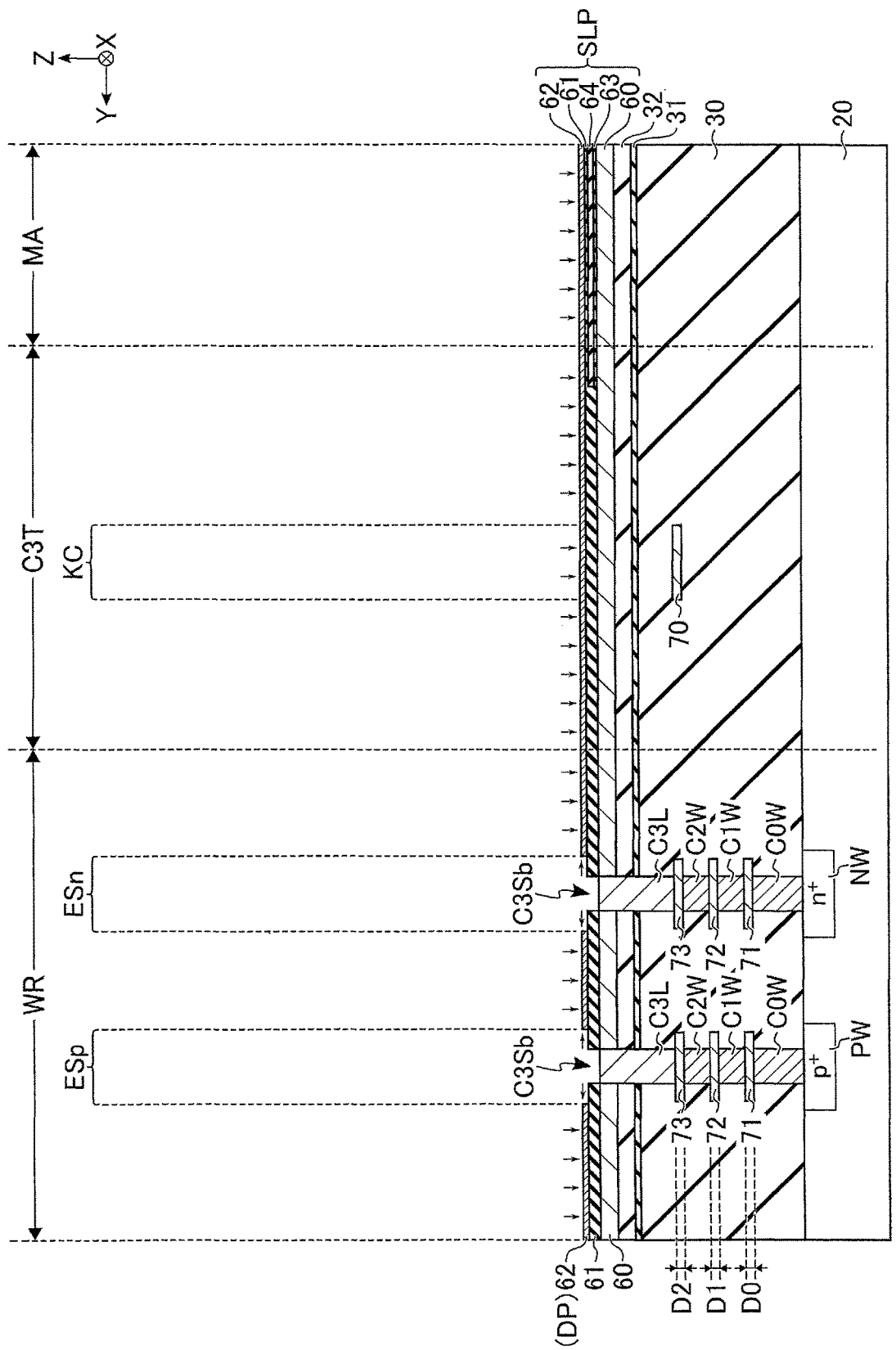

By the processing of step S104, as illustrated in FIG. 18, recess processing of the conductive layer 62 in the vicinity of the slit C3Sb is executed. In the recess processing, isotropic etching processing is executed, such as wet etching processing. By the recess processing, the thickness of the conductive layer 62 is processed to be the thickness similar to that of the conductive layer 62 illustrated in FIG. 11, for example. Furthermore, the conductive layer 62 is laterally removed at the upper part of the slit C3Sb. As a result, the width of the slit C3Sb at the height of the conductive layer 62 becomes wider than the width of the slit C3Sb at the height of the insulating layer 61.

Figure 19:
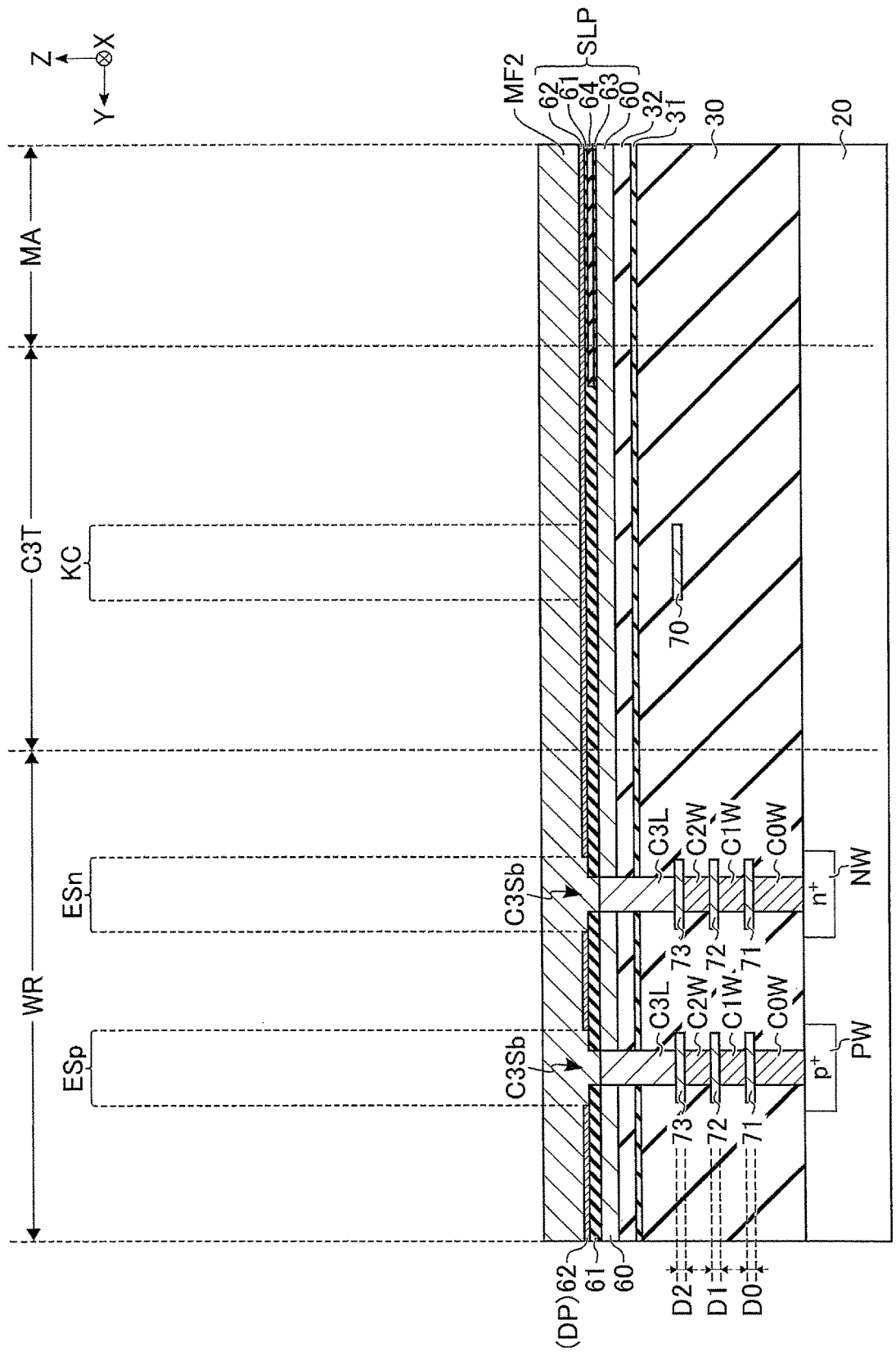
Figure 20:
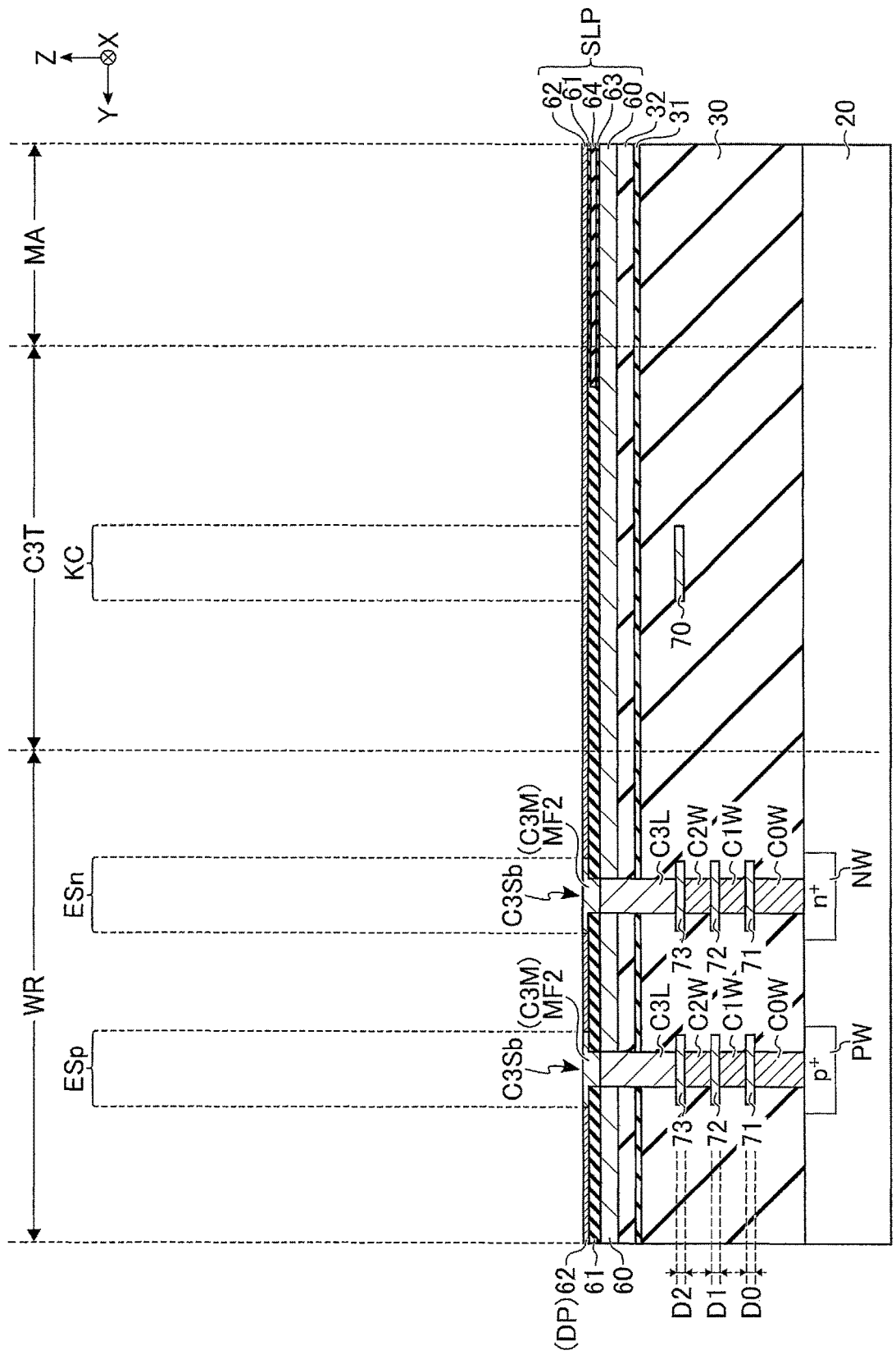

By the processing of step S105, the contact C3M is formed on the contact C3L in the slit C3Sb. Specifically, as illustrated in FIG. 19, a conductor MF2 is formed, and is embedded in the upper part of the slit C3Sb. Then, as illustrated in FIG. 20, etch back processing is executed so that the conductor MF2 remains on the upper part of the slit C3Sb. The conductor MF2 remaining on the upper part of the slit C3Sb corresponds to the contact C3M.

By the processing of step S106, a sacrificial member SM of a stacked wiring portion is formed. Specifically, the insulating layers and the sacrificial members SM are alternately stacked on the conductive layer 62.

Figure 21:
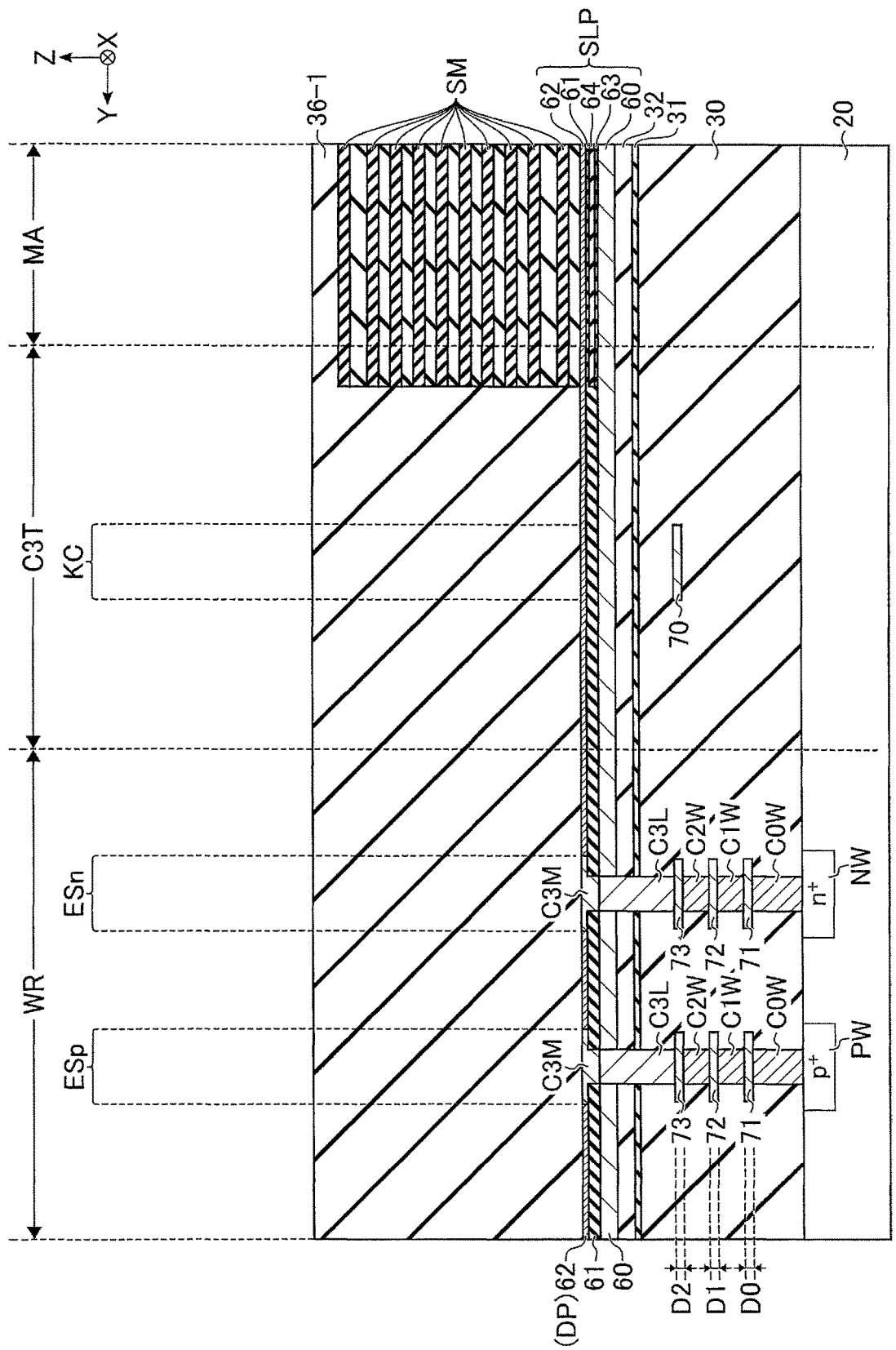

By the processing of step S107, staircase structure in the hookup regions HA1 and HA2 is formed. Although illustration is omitted, for example, by repetition of slimming processing and etching processing, staircase structure of the sacrificial members SM is formed in each of the hookup regions HA1 and HA2. At this time, the sacrificial members SM formed in each of the contact region C3T and the wall region WR are removed. Then, a level difference formed by the staircase structure of the sacrificial members SM is filled with an insulating layer 36-1. After that, as illustrated in FIG. 21, a surface of the insulating layer 36-1 is flattened by, for example, Chemical Mechanical Polishing (CMP).

Figure 22:
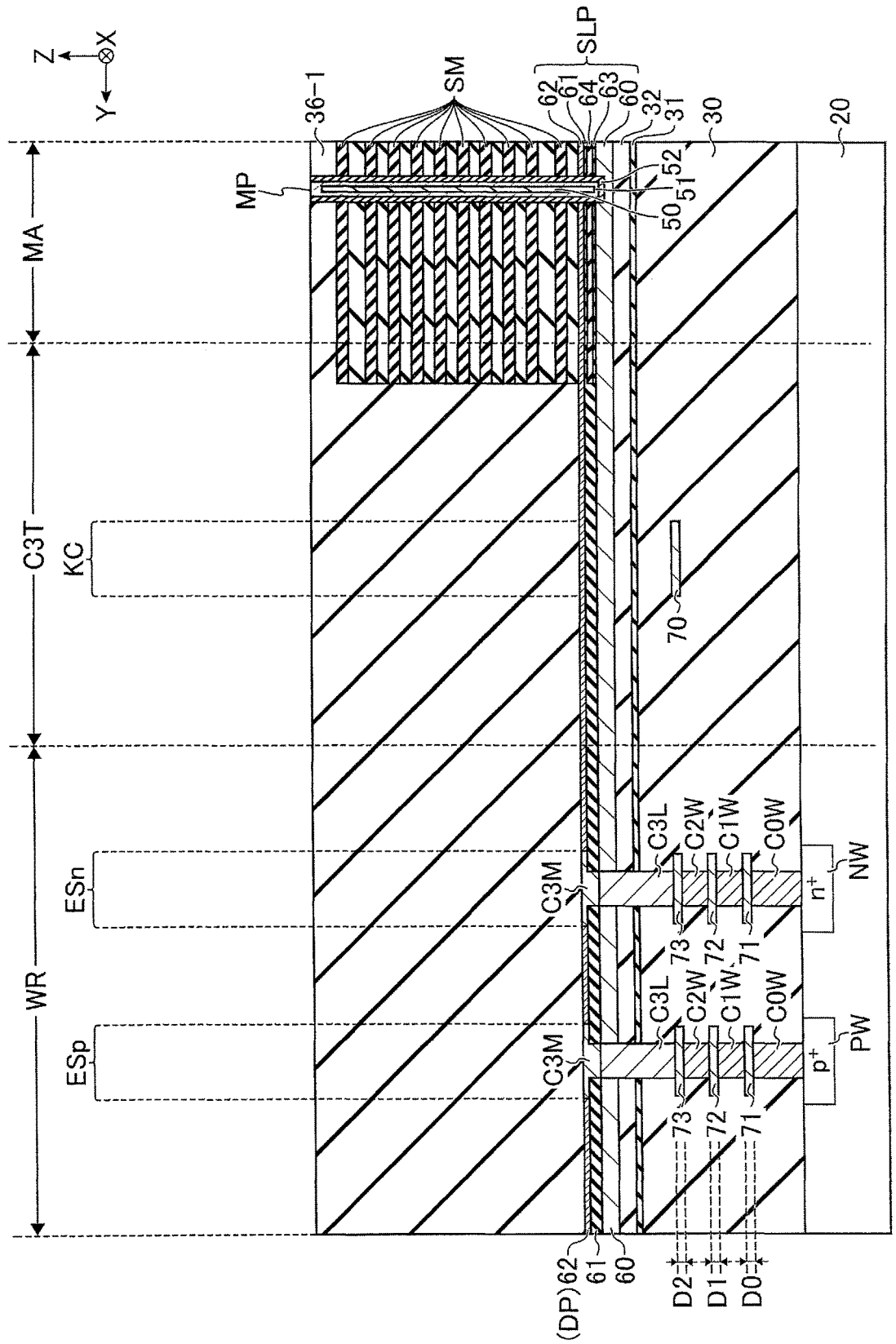

By the processing of step S108, as illustrated in FIG. 22, the memory pillar MP is formed. Specifically, first, by photolithography or the like, a mask is formed in which a region corresponding to the memory pillar MP is opened. By anisotropic etching using the mask, a hole is formed penetrating the insulating layer 36-1, the stacked sacrificial members SM, the conductive layer 62, the insulating layer 61, the sacrificial member 64, and the insulating layer 63. At the bottom of the hole, a part of the conductive layer 60 is exposed. Then, the stacked film 52 (that is, the block insulating film 55, the insulating film 54, and the tunnel insulating film 53), the semiconductor layer 51, and the core member 50 are formed in this order on the side surface and the bottom surface of the hole. Then, a part of the core member 50 provided in the upper part of the hole is removed, and the semiconductor layer 51 is formed in a portion where the core member 50 is removed.

By the processing of step S109, the slit SLT is formed. Specifically, although illustration is omitted, first, by photolithography or the like, a mask is formed in which a region corresponding to the slit SLT is opened. By anisotropic etching processing using the mask, the slit SLT is formed that divides an insulating layer 36-2, the stacked sacrificial members SM, the conductive layer 62, and the insulating layer 61. The insulating layer 36-2 is a set of the insulating layer 36-1 and an insulating layer formed on the insulating layer 36-1 before formation of the slit SLT. At the bottom of the slit SLT, the sacrificial member 64 is exposed.

Figure 23:
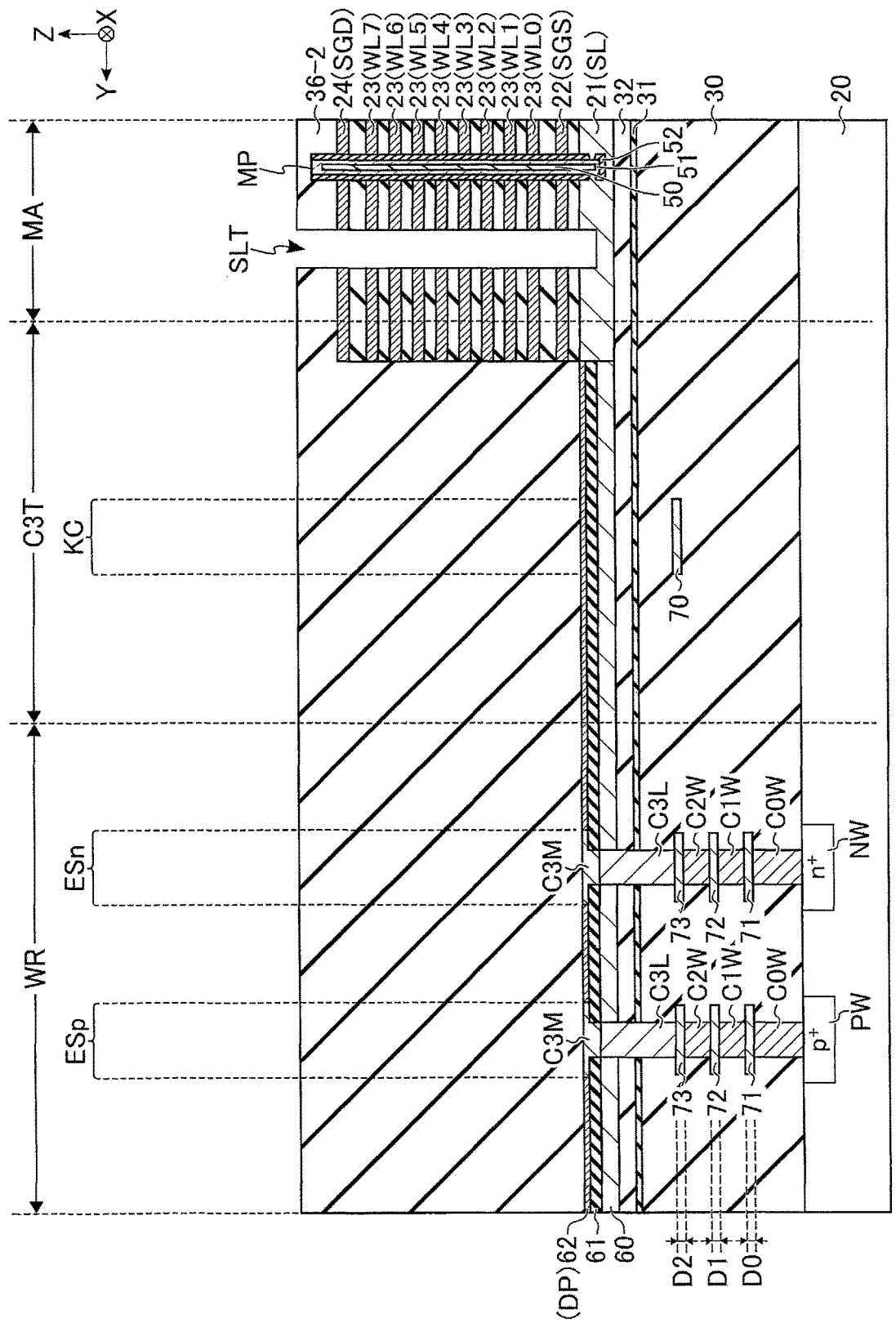

By the processing of step S110, as illustrated in FIG. 23, replacement processing is executed. In the replacement processing, replacement processing of the source line portion SLP and replacement processing of the stacked wiring lines are executed in order.

In the replacement processing of the source line portion SLP, the sacrificial member 64 is selectively removed via the slit SLT, for example, by wet etching. Subsequently, for example, by wet etching, the insulating layers 61 and 63 of the source line portion SLP and a part of the stacked film 52 on the side surface of the memory pillar MP are selectively removed via the slit SLT. Then, a conductor (for example, silicon) is embedded in a space formed in the source line portion SLP. As a result, the conductive layer 21 is formed by the conductor and the conductive layers 60 and 62, and the conductive layer 21 and the semiconductor layer 51 in the memory pillar MP are electrically connected together.

In the replacement processing of the stacked wiring lines, the stacked sacrificial members SM are selectively removed via the slit SLT by wet etching with thermal phosphoric acid or the like. Then, a conductor is embedded in a space from which the sacrificial members SM have been removed, via the slit SLT. For example, CVD is used for formation of the conductor in this process. After that, the conductor formed inside the slit SLT is removed by etch back processing, and the conductor formed in the adjacent wiring layer is separated. As a result, the conductive layer 22 functioning as the select gate line SGS, the plurality of conductive layers 23 each functioning as the word line WL, and the conductive layer 24 functioning as the select gate line SGD are formed. The conductive layers 22 to 24 formed in this process may contain a barrier metal. In this case, in the formation of the conductor after the removal of the sacrificial members SM, for example, a film of titanium nitride is formed as a barrier metal, and then tungsten is formed.

Figure 24:
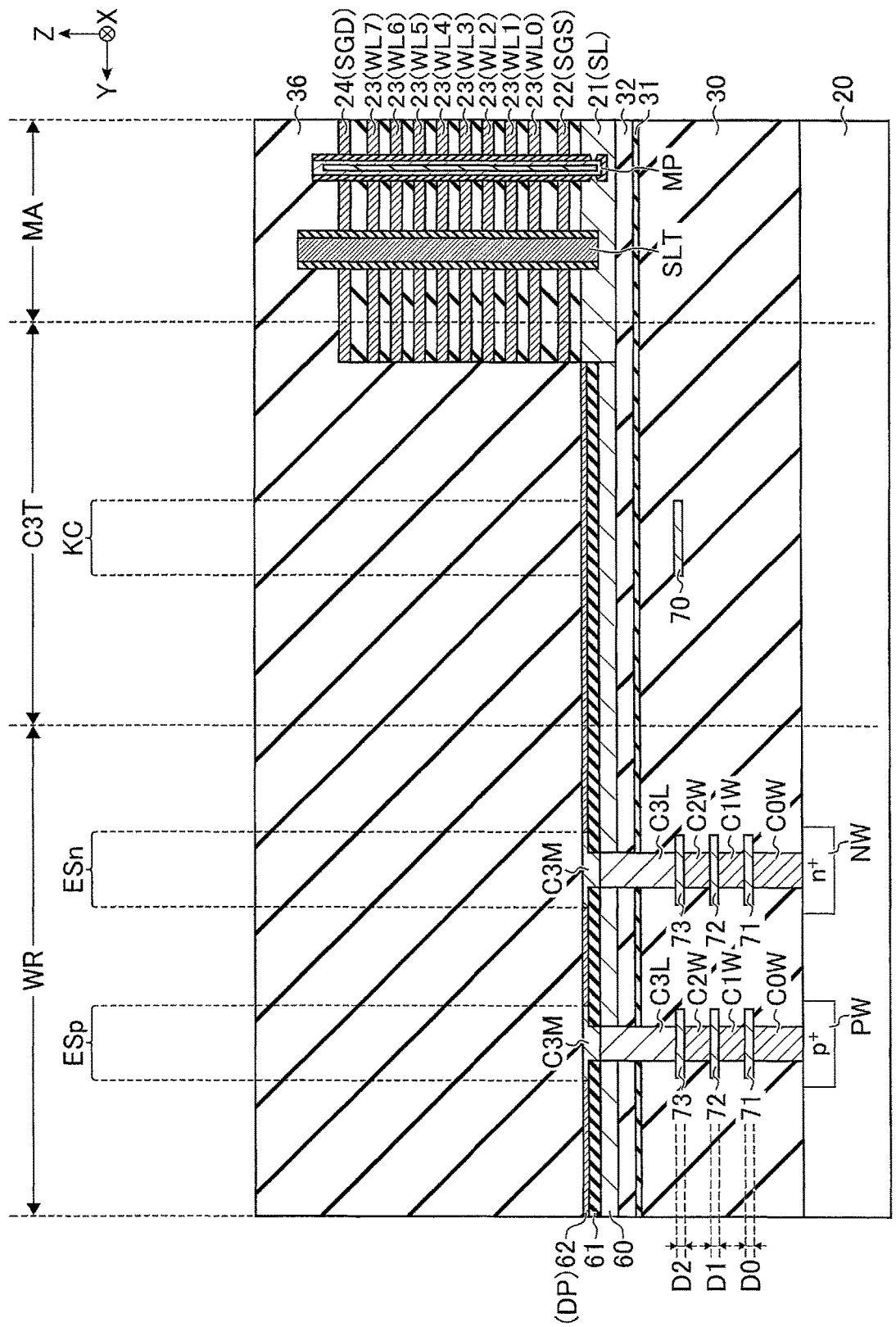

By the processing of step S111, as illustrated in FIG. 24, the spacers SP and the contact LI are formed in the slit SLT. Specifically, first, an insulating film corresponding to the spacers SP is formed by CVD or the like. The insulating film is formed not only on the side surfaces of the slit SLT but also on the bottom of the slit SLT. Subsequently, etch back processing is executed, and the insulating film formed on the bottom of the slit SLT is removed. As a result, the conductive layer 21 is exposed at the bottom of the slit SLT. Then, a conductor is embedded in the slit SLT, and the conductor outside the slit SLT is removed. The conductor formed in the slit SLT corresponds to the contact LI. After that, when an insulating layer is formed on the insulating layer 36-2, structure of the insulating layer 36 illustrated in FIG. 11 is formed.

Figure 25:
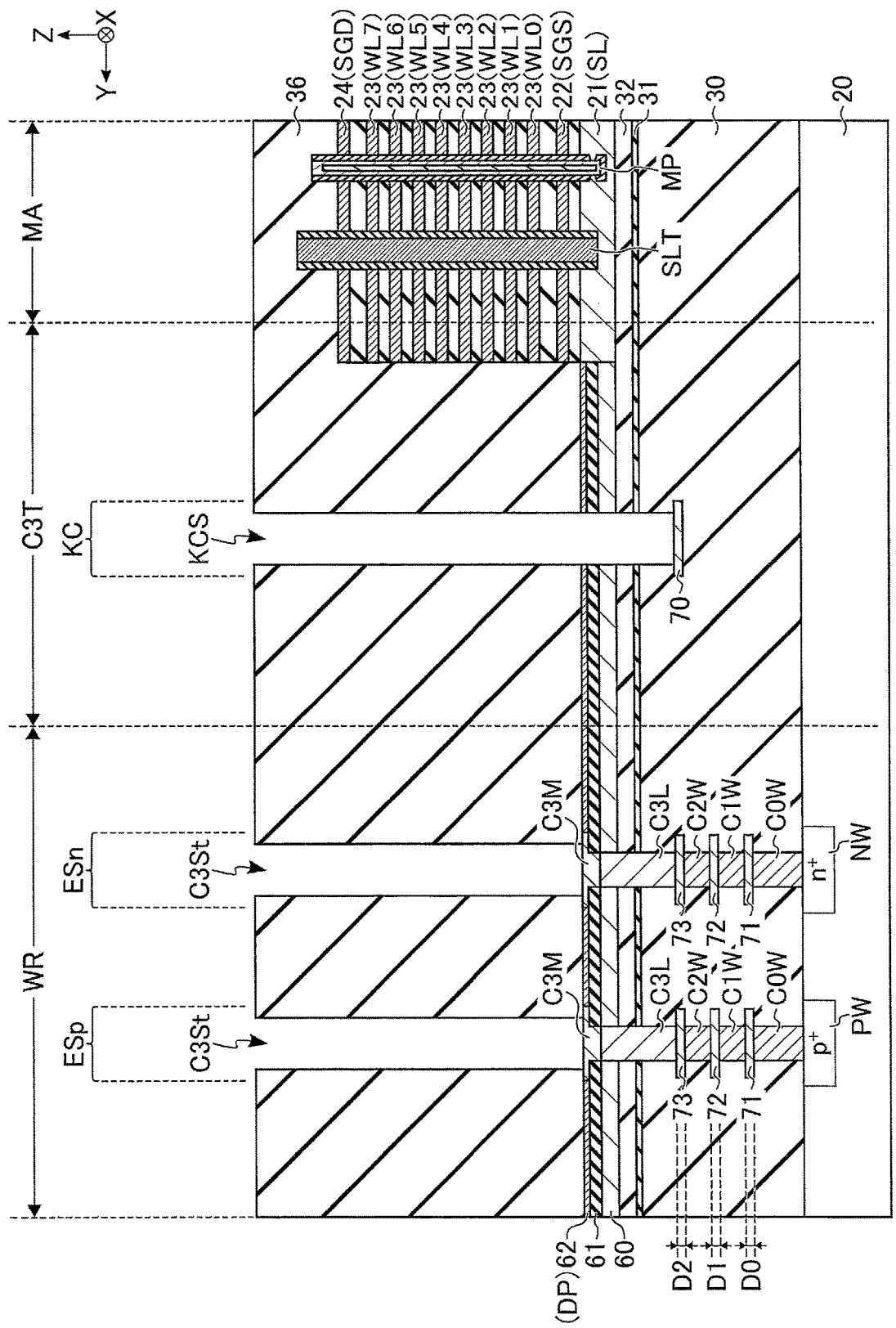

By the processing of step S112, slits C3St and KCS are formed as illustrated in FIG. 25. Specifically, by photolithography or the like, a mask is formed in which a region corresponding to the dividing portion KC, a region corresponding to the sealing member ESn, and a region corresponding to the sealing member ESp are opened. By anisotropic etching processing using the mask, the slit KCS is formed in the region corresponding to the dividing portion KC, and the slit C3St is formed in each of the region corresponding to the sealing member ESn and the region corresponding to the sealing member ESp. The slit KCS divides the insulating layer 36, the conductive layer 62, the insulating layer 61, the conductive layer 60, the insulating layers 32 and 31, and a part of the insulating layer 30, and a surface of the conductive layer 70 is exposed at the bottom of the slit KCS. The slit C3St divides the insulating layer 36, and a surface of the contact C3M is exposed at the bottom of the slit C3St.

Figure 26:
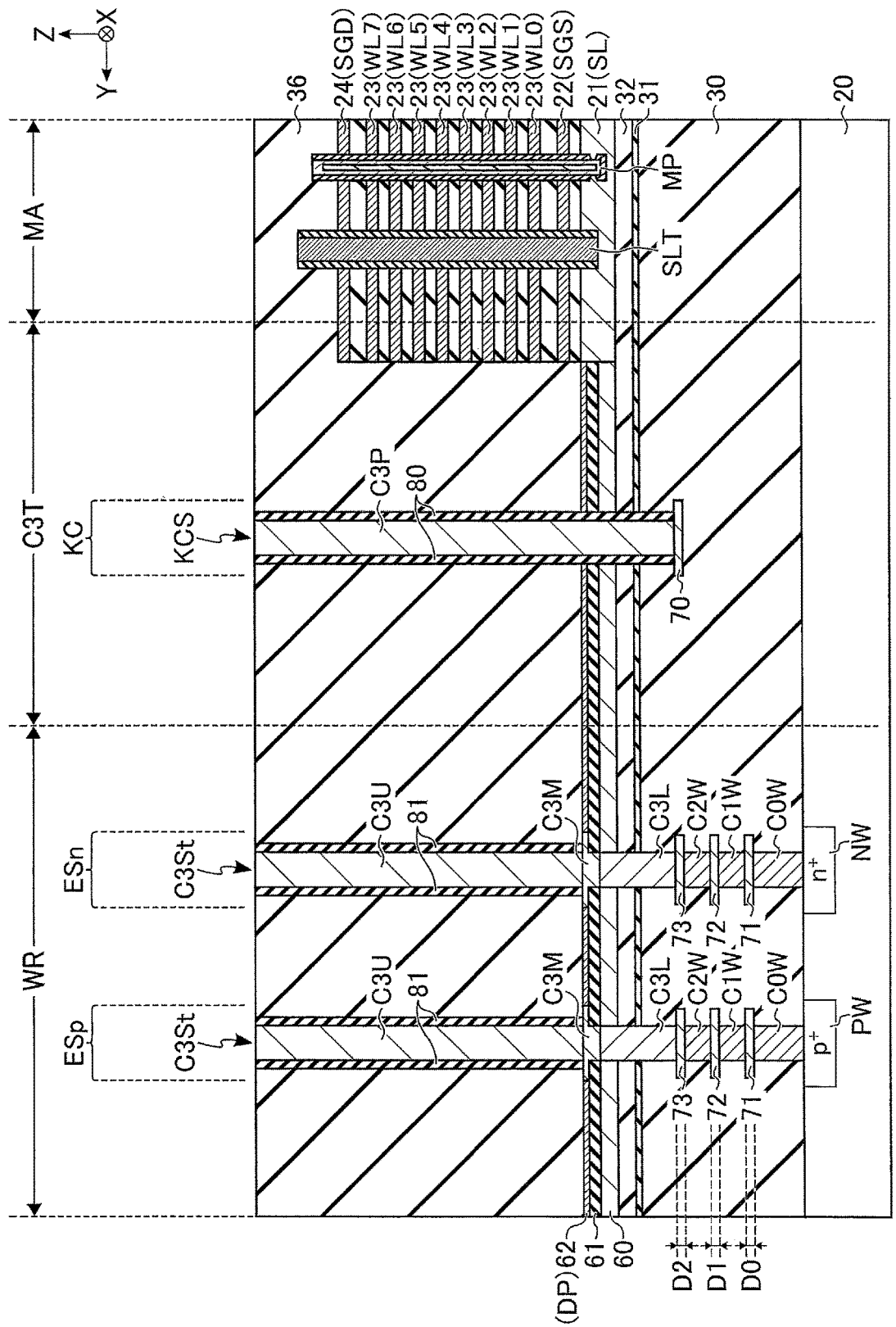

By the processing of step S113, as illustrated in FIG. 26, the spacers 80 and the contact C3P are formed in the slit KCS, and the spacers 81 and the contact C3U are formed in the slit C3St. Specifically, first, an insulating film corresponding to the spacers 80 and 81 is formed by CVD or the like. The insulating film is formed not only on side surfaces of each of the slits KCS and C3St, but also on the bottom of each of the slits KCS and C3St. Subsequently, etch back processing is executed, and the insulating film formed on the bottom of each of the slits KCS and C3St is removed. As a result, the conductive layer 70 is exposed at the bottom of the slit KCS, and the contact C3M is exposed at the bottom of the slit C3St. Then, a conductor is embedded in each of the slits KCS and C3St, and the conductor outside the slits KCS and C3St is removed. The conductor formed in the slit KCS corresponds to the contact C3P. The conductor formed in the slit C3St corresponds to the contact C3U.

As a result, corresponding to the sealing member ESn, structure is formed in which the square ring contacts C3L, C3M, and C3U are connected together. Corresponding to the sealing member ESp, structure is formed in which the square ring contacts C3L, C3M, and C3U are connected together. Corresponding to the dividing portion KC, structure is formed in which the conductive layers 60 and 62 corresponding to the conductive portion DP are divided by the spacers 80. Note that, the manufacturing processes described above are merely examples, and other processing may be inserted between the manufacturing processes, or the order of the manufacturing processes may be changed as long as no problem occurs.

[1-3] Effects of the First Embodiment

According to the semiconductor memory device 1 according to the embodiment described above, a yield of the semiconductor memory device 1 can be improved. Hereinafter, details of effects of the semiconductor memory device 1 according to the embodiment will be described with reference to a comparative example.

In a manufacturing process of a semiconductor memory device in which memory cells are three-dimensionally stacked, for example, a memory hole is formed in a structure in which sacrificial members and insulating members are alternately stacked, and a semiconductor member and the like corresponding to the memory cell and the like are formed in the memory hole. In an etching process of forming the memory hole, positive charge is stored at the bottom of the memory hole as the etching progresses, and a conductor (for example, the source line SL) reached by the bottom of the memory hole may be positively charged. Then, a bias difference between the positively charged conductor and the negatively charged wafer becomes large, and arcing due to the bias difference may occur between the conductor and the wafer. Such arcing can occur, in particular, during processing of high aspect ratio memory holes and slits.

Figure 27:
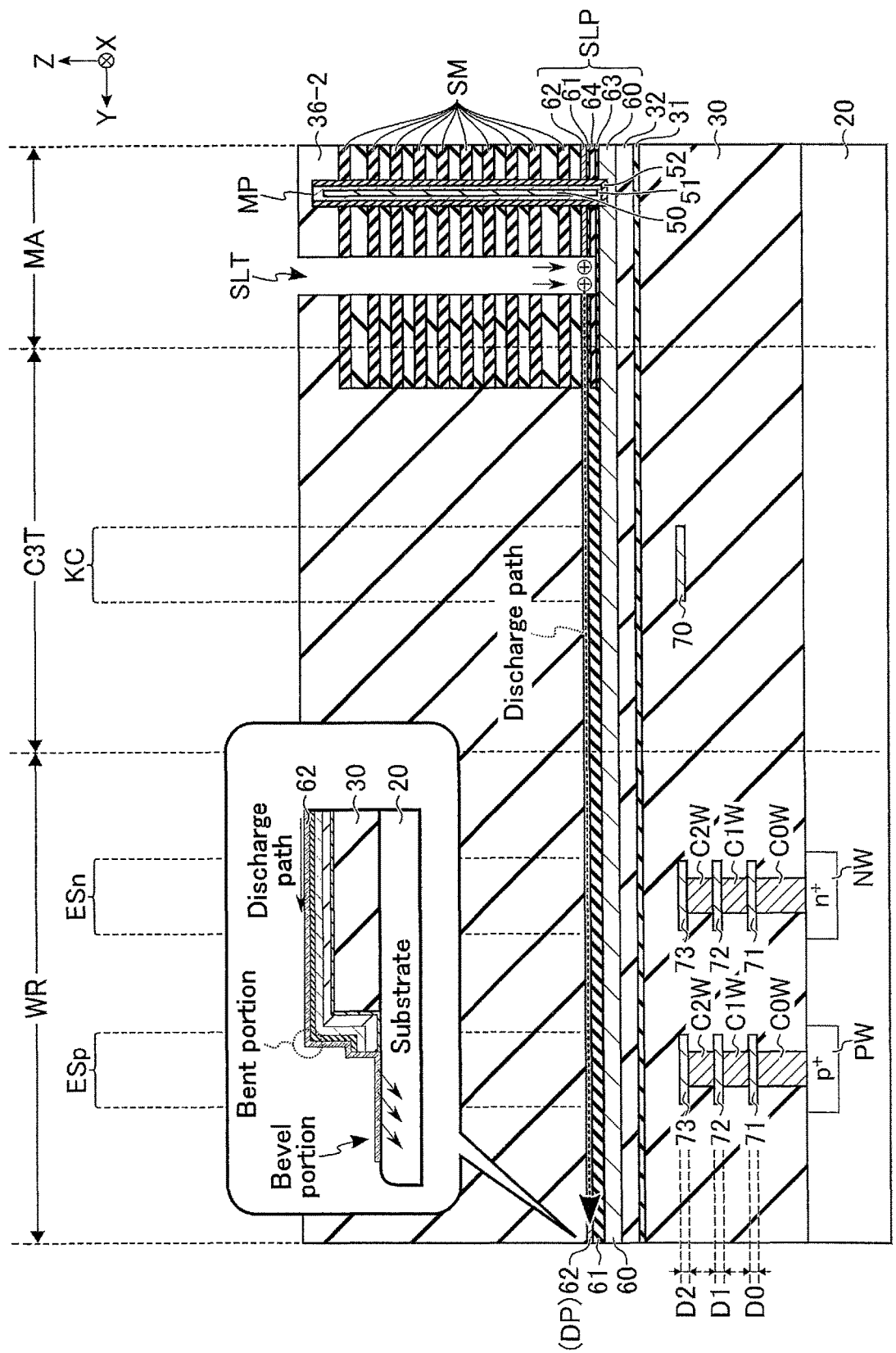
FIG. 27 is a cross-sectional view illustrating an example of cross-sectional structure during manufacturing of a semiconductor memory device according to a comparative example of the first embodiment.

FIG. 27 is a cross-sectional view illustrating an example of cross-sectional structure during manufacturing of a semiconductor memory device 1 according to the comparative example of the first embodiment. As illustrated in FIG. 27, the semiconductor memory device 1 according to the comparative example of the first embodiment has structure before the replacement processing and in which the contacts C3L and C3M are omitted, with respect to the structure of the semiconductor memory device 1 illustrated in FIG. 23. As a countermeasure against arcing, as in the comparative example of the first embodiment, it is conceivable to prepare structure (conductive portion DP) in which the conductive layer 62 in the memory region MA and the conductive layer 62 in the kerf region KR are electrically connected together, as a discharge path during a high aspect ratio etching process. Such a conductive layer 62 is provided to be in contact with, for example, a bevel portion of the wafer (semiconductor substrate 20).

As a result, in the high aspect ratio etching process in the semiconductor memory device 1 according to the comparative example of the first embodiment, for example, the positive charge stored in the bottom of the slit SLT can be discharged to the semiconductor substrate 20 via the conductive layer 62 (conductive portion DP) in contact with the bevel portion of the wafer. As a result, the semiconductor memory device 1 according to the comparative example of the first embodiment can suppress the bias difference between the source line SL and the semiconductor substrate 20, and can suppress the occurrence of arcing. Note that, when the conductive layer 62 in the kerf region KR and the conductive layer 62 in the memory region MA have the same potential, the semiconductor memory device 1 cannot be controlled. For this reason, after the countermeasure against arcing is no longer required (for example, after the processing of the slit SLT), the conductive layer 62 in the kerf region KR and the conductive layer 62 in the memory region MA are electrically divided from each other by the dividing portion KC.

On the other hand, when the conductive layer 62 is formed to be in contact with the bevel portion of the wafer as in the semiconductor memory device 1 according to the comparative example of the first embodiment, the conductive layer 62 includes a bent portion in the peripheral portion of the wafer. There is a possibility that such a bent portion of the conductive layer 62 is divided when over-polishing occurs in a flattening process included in the manufacturing process of the semiconductor memory device 1. When the bent portion of the conductive layer 62 is divided, the discharge path provided as the countermeasure against arcing is divided, and the conductive layer 62 can be positively charged during the high aspect ratio etching process. That is, there is a case where the conductive layer 62 (conductive portion DP) cannot suppress the occurrence of arcing during the high aspect ratio etching process.

Figure 28:
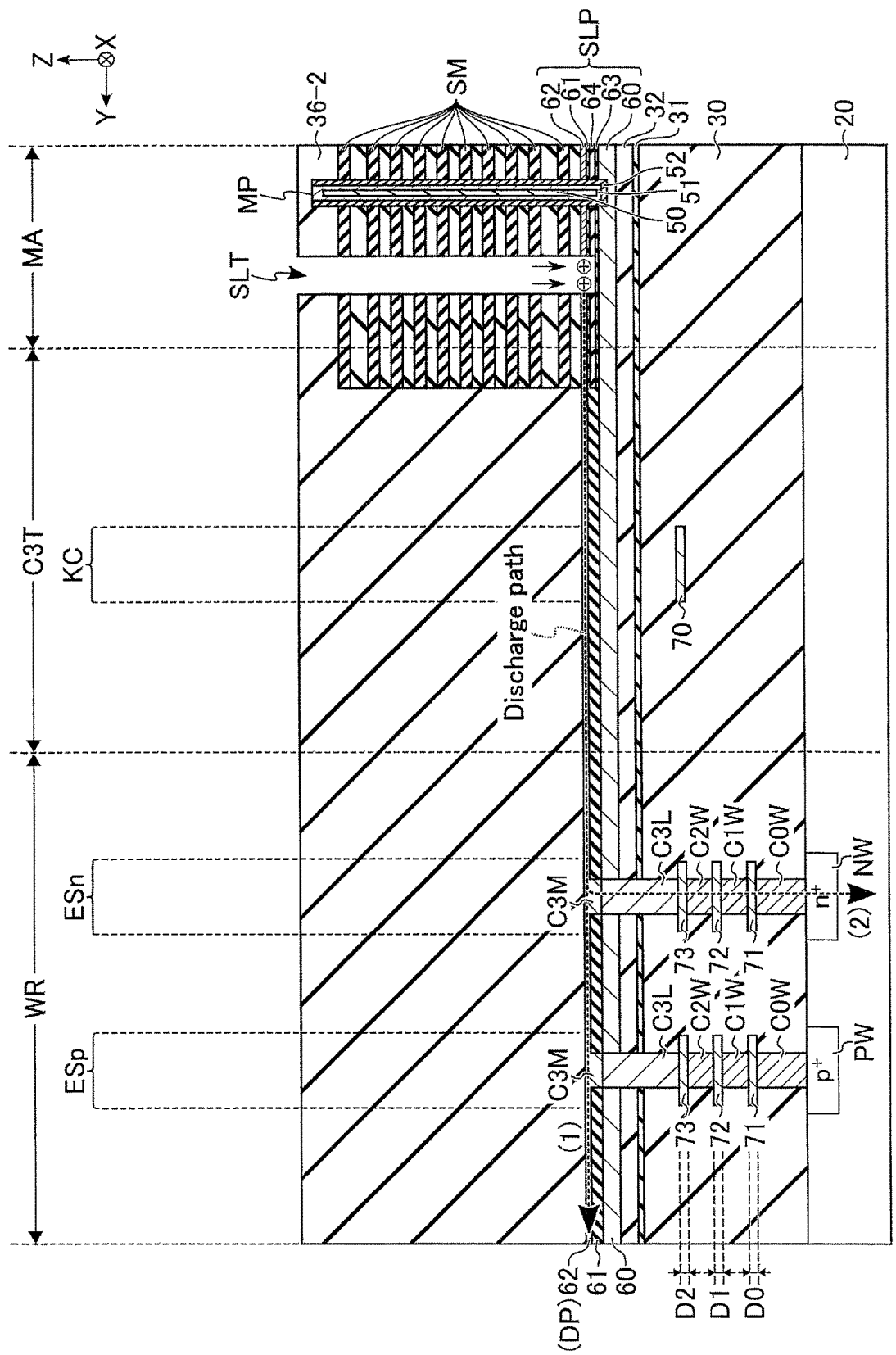
FIG. 28 is a cross-sectional view illustrating an example of the cross-sectional structure during manufacturing of the semiconductor memory device according to the first embodiment.

On the other hand, the semiconductor memory device 1 according to the first embodiment has structure in which the conductive layer 62 (conductive portion DP) is electrically connected to conductor members in the sealing members ESn and ESp connected to the semiconductor substrate 20, in the high aspect ratio etching process. FIG. 28 is a cross-sectional view illustrating an example of the cross-sectional structure during manufacturing of the semiconductor memory device 1 according to the first embodiment. FIG. 28 illustrates structure in which the contacts C3L and C3M are added to the structure illustrated in FIG. 27. As illustrated in FIG. 28, the semiconductor memory device 1 according to the first embodiment includes two types of discharge paths (1) and (2) in the high aspect ratio etching process.

The discharge path (1) corresponds to the positive charge discharge path described in the comparative example of the first embodiment. The discharge path (2) corresponds to a positive charge discharge path via the sealing member ESn and/or ESp. Specifically, for example, the positive charge stored in the bottom of the slit SLT can be discharged to the semiconductor substrate 20 via the conductive layer 62 and the contacts C3M and C3L of the sealing member ESn. Similarly, for example, the negative charge stored in the bottom of the slit SLT can be discharged to the semiconductor substrate 20 via the conductive layer 62 and the contacts C3M and C3L of the sealing member ESp. Since the discharge path (2) is provided in the wall region WR, division of the discharge path by over-polishing in the flattening process cannot occur.

As described above, the semiconductor memory device 1 according to the first embodiment includes a discharge path not through the bevel portion of the wafer between the source line SL and the semiconductor substrate 20, in the high aspect ratio etching process. As a result, the semiconductor memory device 1 according to the first embodiment can suppress the bias difference between the source line SL and the semiconductor substrate 20, and can suppress the occurrence of arcing, in the high aspect ratio etching process, as compared with the comparative example of the first embodiment. Thus, the semiconductor memory device 1 according to the first embodiment can improve the yield as compared with the comparative example of the first embodiment.

Furthermore, the semiconductor memory device 1 according to the first embodiment can cause the electric charge stored in the source line SL to be discharged to the semiconductor substrate 20 by the discharge path (2) via the sealing member ESn and ES even when the discharge path (1) via the bevel portion of the wafer is divided. As a result, the semiconductor memory device 1 according to the first embodiment can suppress a decrease in the yield due to the occurrence of arcing even when over-polishing occurs in the flattening process.

Furthermore, in the semiconductor memory device 1 according to the first embodiment, structure related to the discharge path (2) is formed in lower parts of the sealing members ESn and ESp. For this reason, the structure related to the discharge path (2) has few restrictions on the layout of the semiconductor memory device 1, and can be introduced without increasing a chip region. Thus, the semiconductor memory device 1 according to the first embodiment can suppress an increase in manufacturing cost of the semiconductor memory device 1.

Furthermore, the semiconductor memory device 1 according to the first embodiment has structure in which the contact C3M is provided between the contact C3L and the contact C3U. The contact C3M has structure in which the region of the upper surface is expanded by the recess processing in step S104. As a result, the semiconductor memory device 1 according to the first embodiment can reduce a degree of difficulty of alignment during formation of the contact C3U on the contact C3M, and can suppress a decrease in the yield due to misalignment of the contacts C3M and C3U.

Note that, in the semiconductor memory device 1 according to the first embodiment, structure related to the discharge path (1) may be omitted. For example, it is sufficient that the conductive layer 62 (conductive portion DP) is provided at least in a region inside from the wall region WR. Even in such a case, the semiconductor memory device 1 can suppress the occurrence of arcing in the high aspect ratio etching process by the discharge path via the contacts C3M and C3L of the sealing member ESn, and the discharge path via the contacts C3M and C3L of the sealing member ESp.

[2] Second Embodiment

A semiconductor memory device 1 according to a second embodiment includes sealing members ESn and ESp each having structure different from that of the semiconductor memory device 1 according to the first embodiment. Hereinafter, a description will be given of a point different from the first embodiment, for the semiconductor memory device 1 according to the second embodiment.

[2-1] Configuration of Semiconductor Memory Device 1

Figure 29:
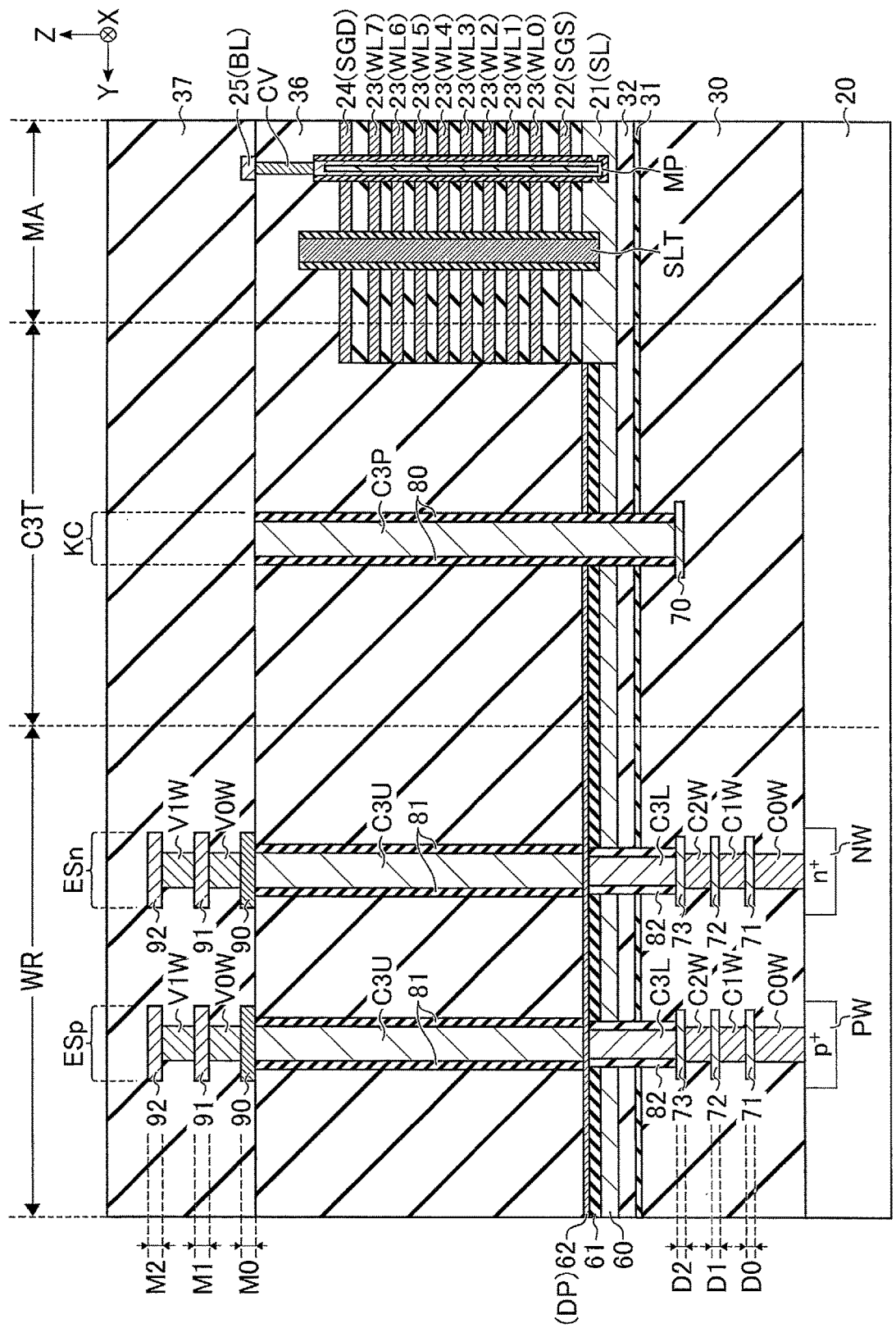
FIG. 29 is a cross-sectional view illustrating an example of cross-sectional structure in a contact region and a wall region of a semiconductor memory device according to a second embodiment.

FIG. 29 is a cross-sectional view illustrating an example of cross-sectional structure in a contact region C3T and a wall region WR of the semiconductor memory device 1 according to the second embodiment. FIG. 29 illustrates the same region as the cross-sectional structure of the semiconductor memory device 1 according to the first embodiment illustrated in FIG. 11. As illustrated in FIG. 29, in the semiconductor memory device 1 according to the second embodiment, structure of a connecting portion of contacts C3L and C3U is different from that of the first embodiment.

Specifically, the contact C3L in the second embodiment divides an insulating layer 61, a conductive layer 60, insulating layers 32 and 31, and a part of an insulating layer 30. Then, an insulating film 82 is provided on side surfaces of the contact C3L. The insulating film 82 divides and insulates the contact C3L from the insulating layer 61, the conductive layer 60, the insulating layers 32 and 31, and the part of the insulating layer 30 divided by the contact C3L. The insulating film 82 contains, for example, silicon nitride. A conductive layer 62 is provided on the contact C3L. That is, the upper end of the contact C3L is in contact with the bottom surface of the conductive layer 62. As described above, in the second embodiment, a contact C3M is omitted, and the conductive layer 62 is not divided by the contact C3L.

In a region corresponding to the sealing member ESn, the contact C3U is provided on the conductive layer 62 above the contact C3L. It is preferable that the contacts C3L and C3U provided in the region corresponding to the sealing member ESn have overlapping portions in a plan view. In a region corresponding to the sealing member ESp, the contact C3U is provided on the conductive layer 62 above the contact C3L. It is preferable that the contacts C3L and C3U provided in the region corresponding to the sealing member ESp have overlapping portions in a plan view. Other configurations of the semiconductor memory device 1 according to the second embodiment are similar to those of the first embodiment.

[2-2] Method for Manufacturing Semiconductor Memory Device 1

Figure 30:
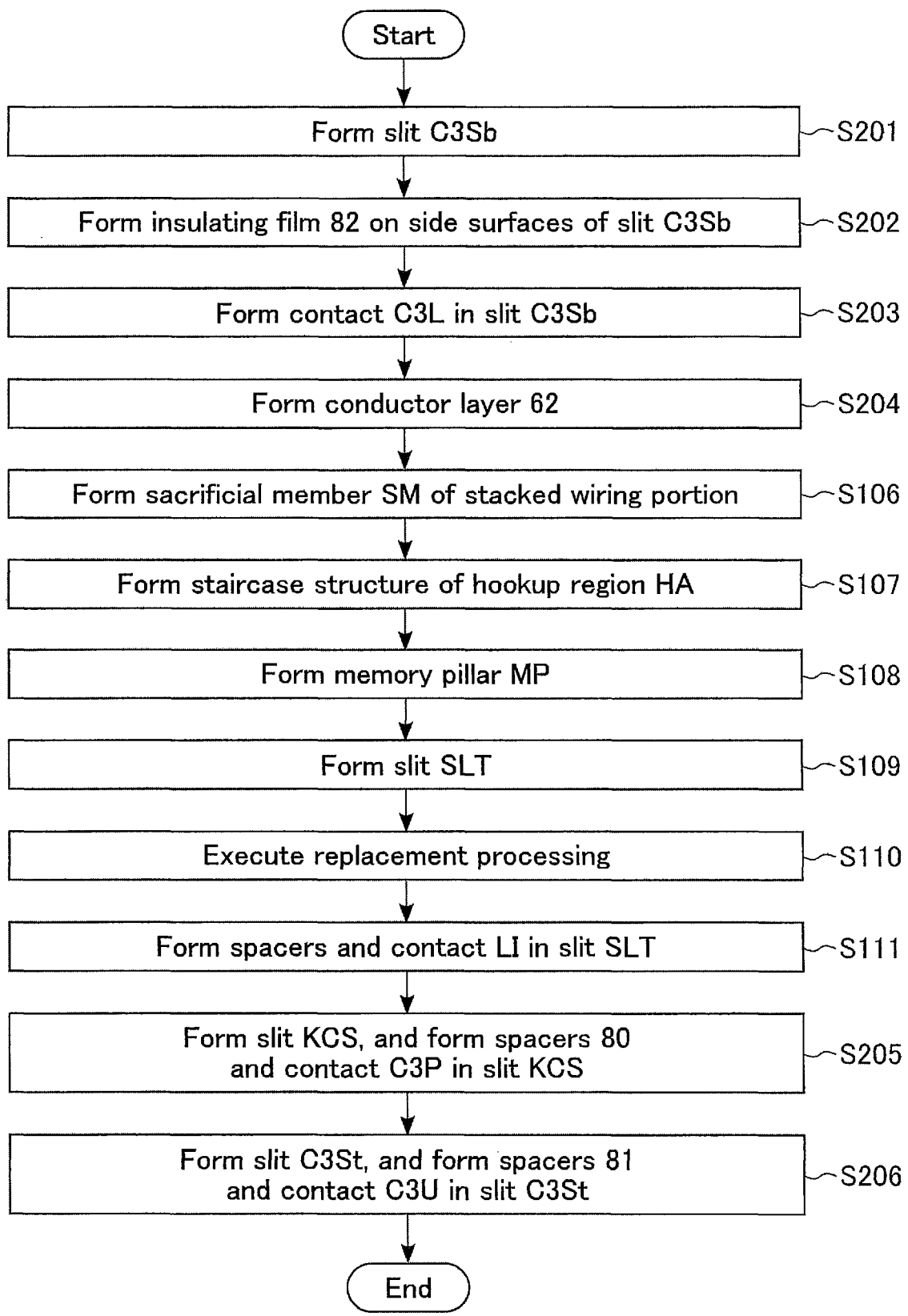
FIG. 30 is a flowchart illustrating an example of a method for manufacturing the semiconductor memory device according to the second embodiment.

FIG. 30 is a flowchart illustrating an example of a method for manufacturing the semiconductor memory device 1 according to the second embodiment. Each of FIGS. 31 to 39 is a cross-sectional view illustrating an example of cross-sectional structure during manufacturing of the semiconductor memory device 1 according to the second embodiment. Each of FIGS. 31 to 39 illustrates the same region as the cross-sectional structure of the semiconductor memory device 1 according to the second embodiment illustrated in FIG. 29. Hereinafter, with reference to FIG. 30 as appropriate, an example will be described of a series of manufacturing processes from formation of a source line portion SLP used for formation of a source line SL to formation of the contacts C3U and C3P.

Figure 31:
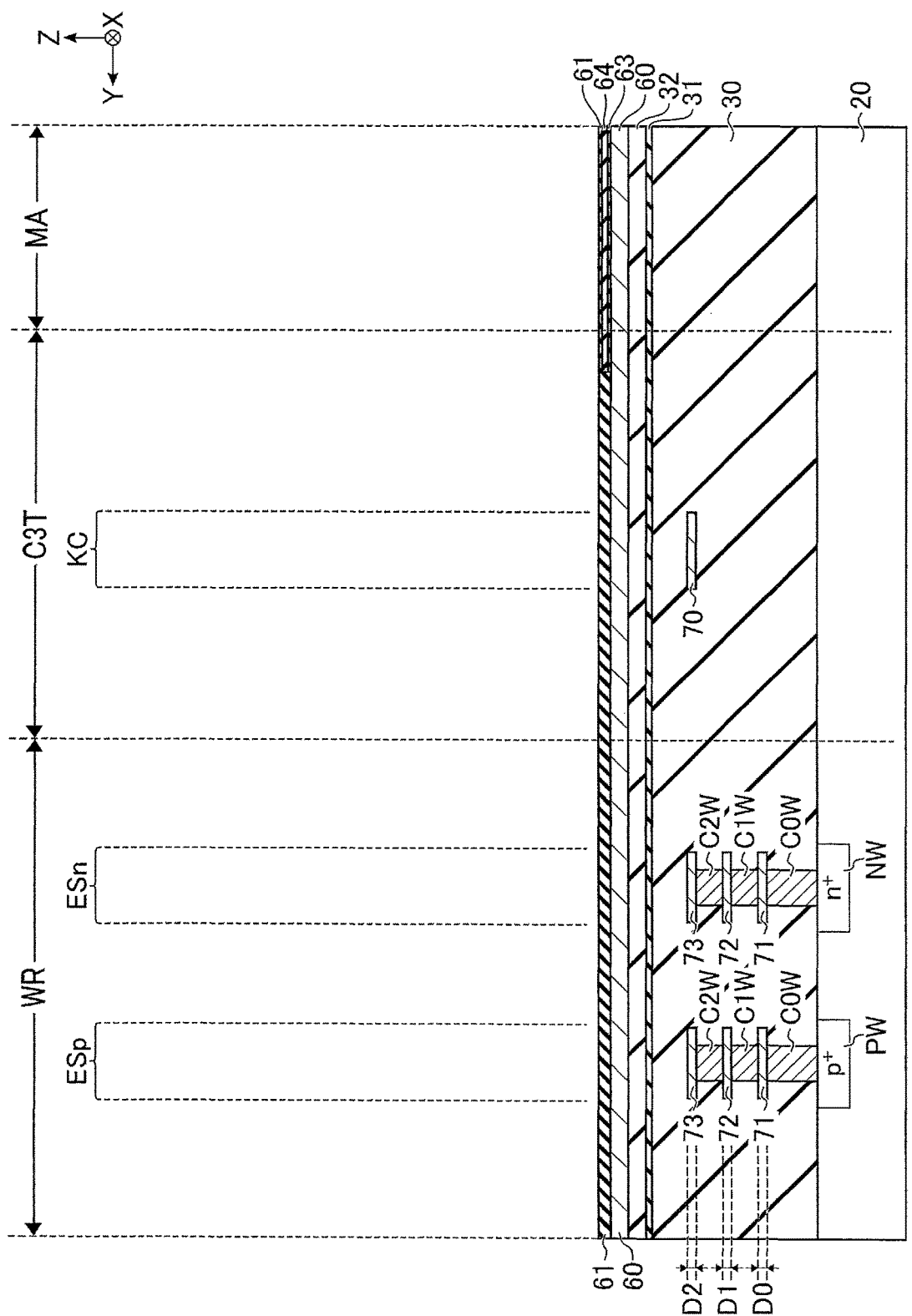

Before processing illustrated in FIG. 30 is executed, as illustrated in FIG. 31, a configuration from a peripheral circuit on a semiconductor substrate 20 to a part of the source line portion SLP is formed. Briefly, conductive layers 70 to 73 and contacts C0W to C2W are formed similarly to the first embodiment. On the insulating layer 30 including the conductive layers 70 to 73 and the contacts C0W to C2W, the insulating layers 31 and 32, the conductive layer 60, an insulating layer 63, and a sacrificial member 64 are formed in this order. Then, the insulating layer 63 and the sacrificial member 64 provided outside a memory region MA are removed, and the insulating layer 61 is formed. It is sufficient that the sacrificial member 64 is removed at a portion corresponding to a dividing portion KC and portions corresponding to the sealing members ESn and ESp. Furthermore, the insulating layer 63 may remain in the contact region C3T and the wall region WR. The height of the insulating layer 61 may or may not be uniform in the memory region MA, the contact region C3T, and the wall region WR. After that, the processing of steps S201 to S204 is executed in order.

Figure 32:
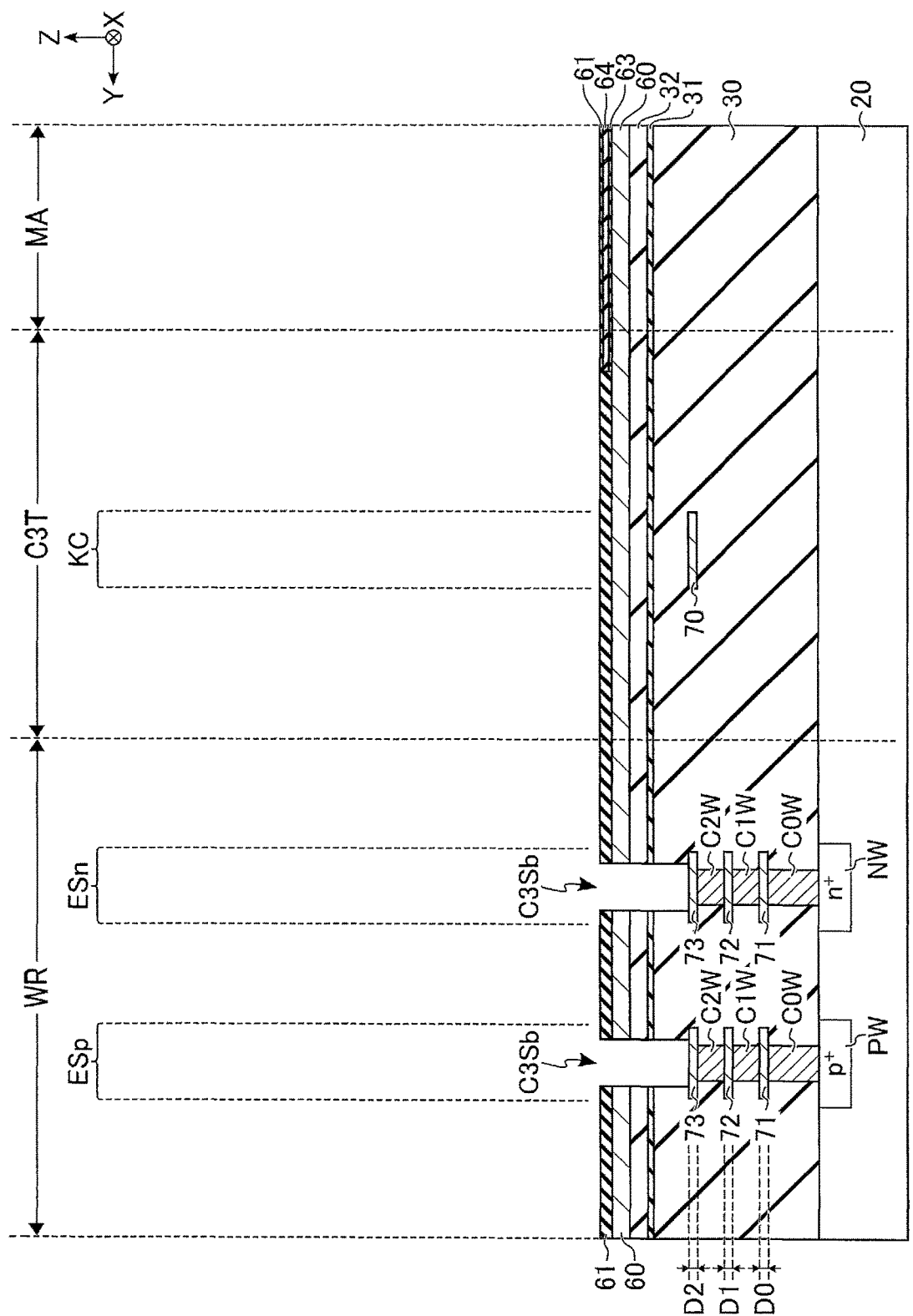

By the processing of step S201, as illustrated in FIG. 32, slits C3Sb are formed. Specifically, first, a mask is formed in which a region where the sealing member ESn is formed and a region where the sealing member ESp is formed are each opened. Then, anisotropic etching using the mask is executed, and the slits C3Sb are formed that divide the insulating layer 61, the conductive layer 60, the insulating layers 32 and 31, and a part of the insulating layer 30. At the bottom of each slit C3Sb, a surface of the conductive layer 73 is exposed.

Figure 33:
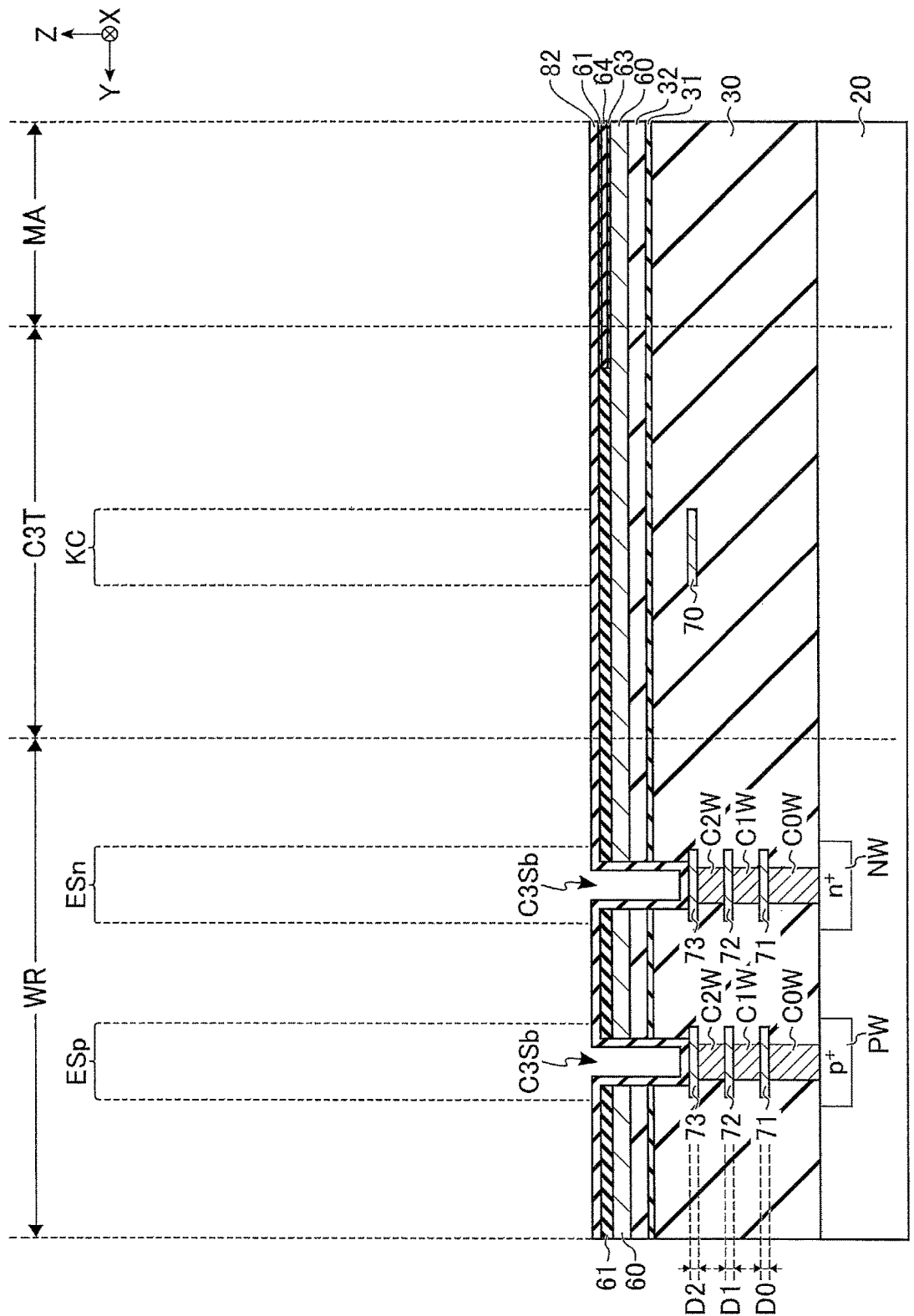
Figure 34:
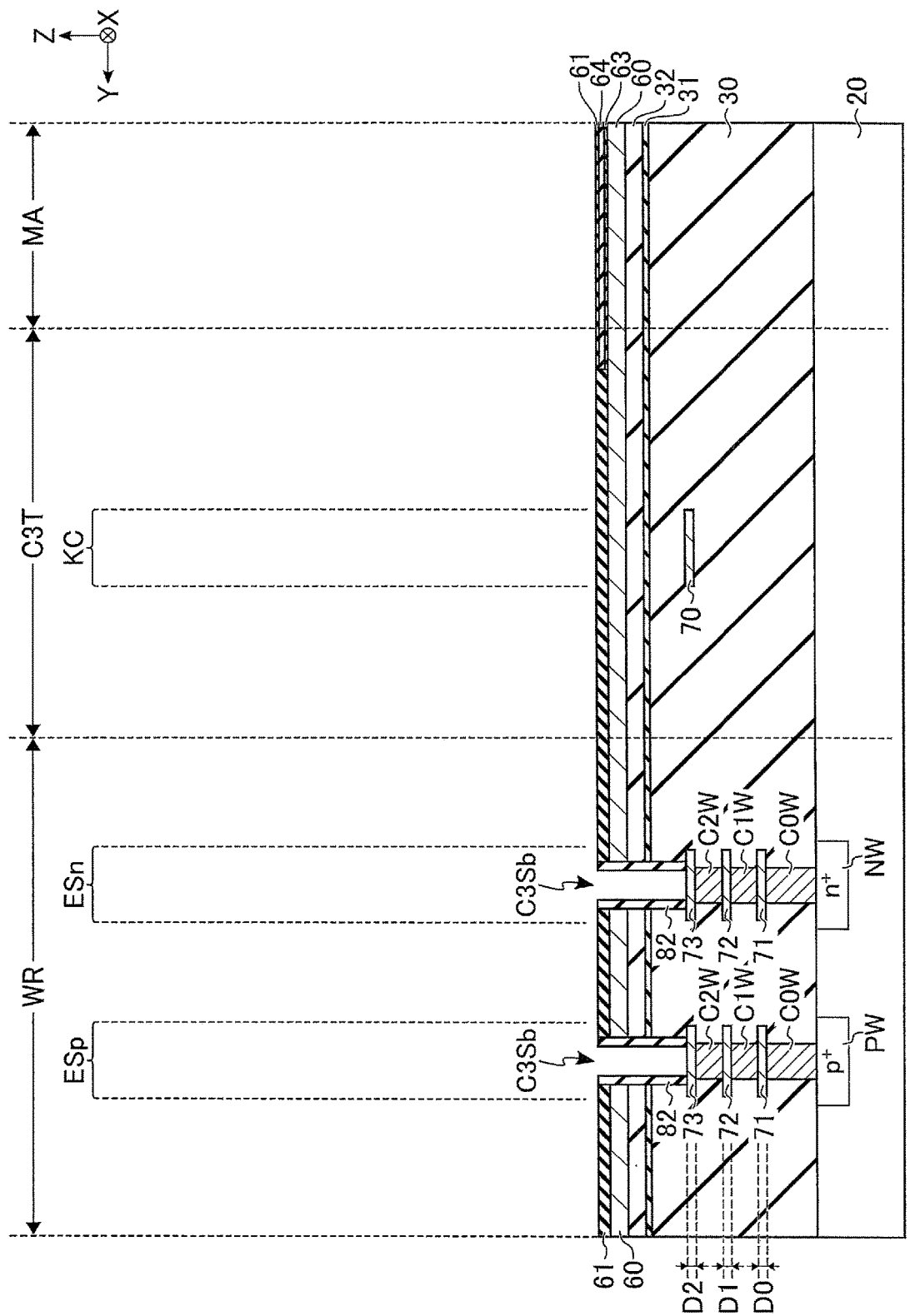

By the processing of step S202, the insulating film 82 is formed on the side surfaces of the slit C3Sb. Specifically, as illustrated in FIG. 33, the insulating film 82 is formed on the upper surface of the insulating layer 61 and the side surfaces and the bottom surface of the slit C3Sb by, for example, CVD. Then, as illustrated in FIG. 34, etch back processing is executed so that the insulating film 82 remains on the side surfaces of the slit C3Sb. As a result, the insulating film 82 on the insulating layer 61 is removed, and the surface of the conductive layer 73 is exposed at the bottom of the slit C3Sb.

Figure 35:
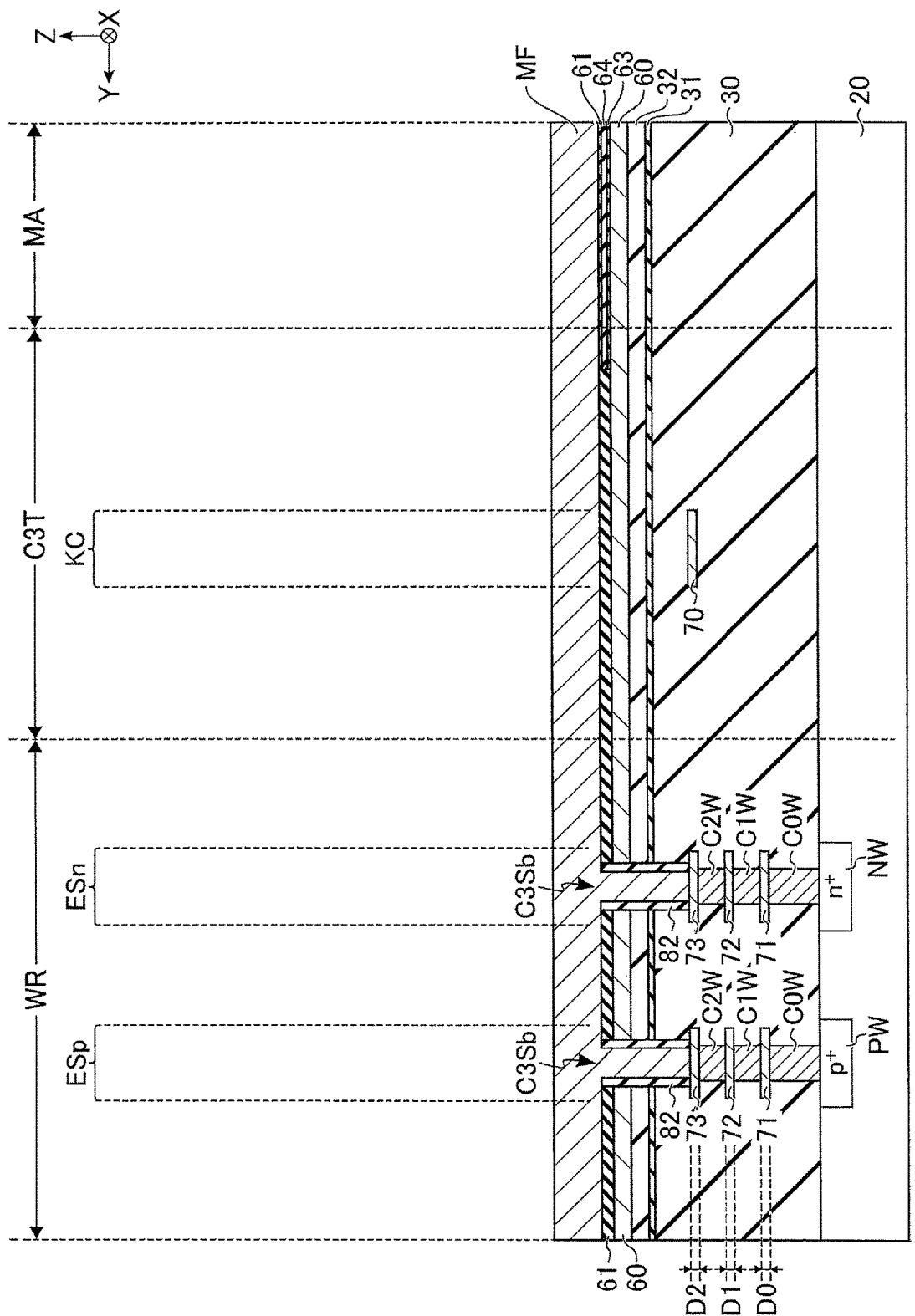
Figure 36:
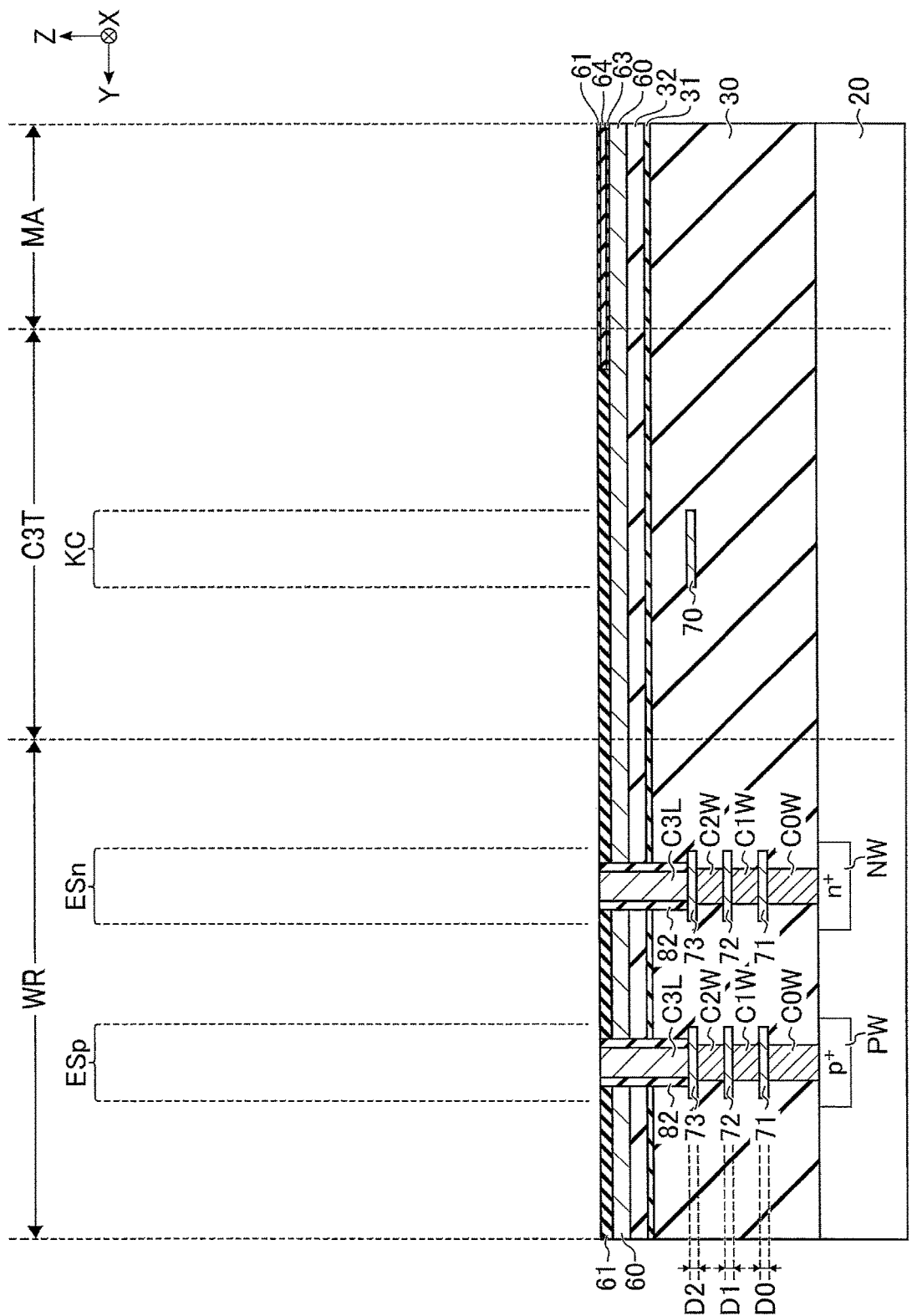

By the processing of step S203, the contact C3L is formed in the slit C3Sb. Specifically, as illustrated in FIG. 35, a conductor MF is formed, and is embedded in the slit C3Sb. Then, as illustrated in FIG. 36, etch back processing is executed so that the conductor MF remains in the slit C3Sb. The conductor MF remaining in the slit C3Sb corresponds to the contact C3L.

Figure 37:
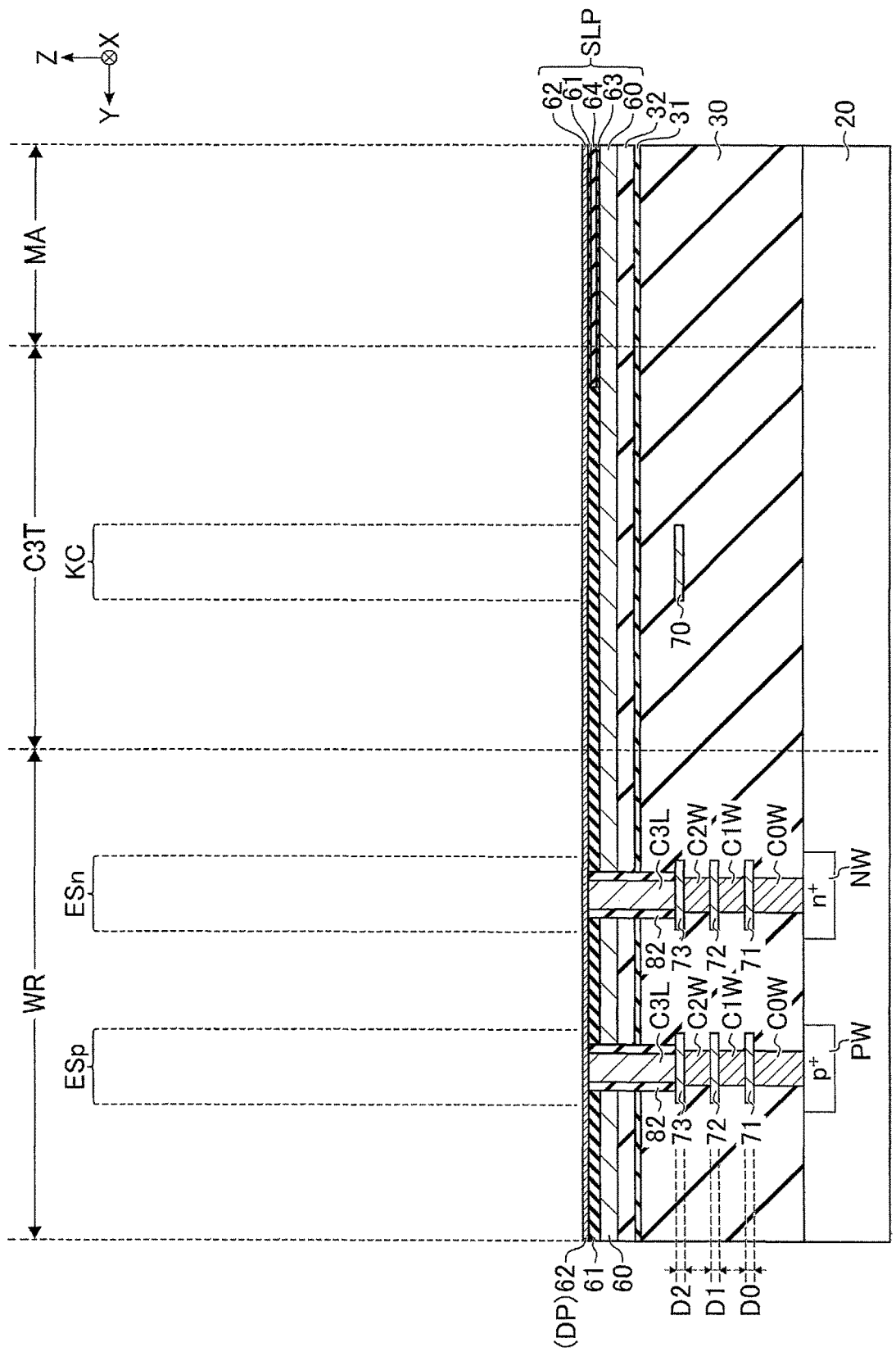

By the processing of step S204, as illustrated in FIG. 37, the conductive layer 62 is formed. The thickness of the conductive layer 62 is equivalent to the thickness of the conductive layer 62 illustrated in FIG. 29. After that, the processing of steps S106 to Sill is executed in order.

By the processing of step S106, a sacrificial member SM of a stacked wiring portion is formed similarly to the first embodiment. By the processing of step S107, staircase structure of hookup regions HA1 and HA2 is formed similarly to the first embodiment. By the processing of step S108, a memory pillar MP is formed similarly to the first embodiment. By the processing of step S109, a slit SLT is formed similarly to the first embodiment. By the processing of step S110, replacement processing is executed similarly to the first embodiment. By the processing of step S111, spacers SP and a contact LI are formed in the slit SLT similarly to the first embodiment. After that, the processing of steps S205 and S206 is executed in order.

Figure 38:
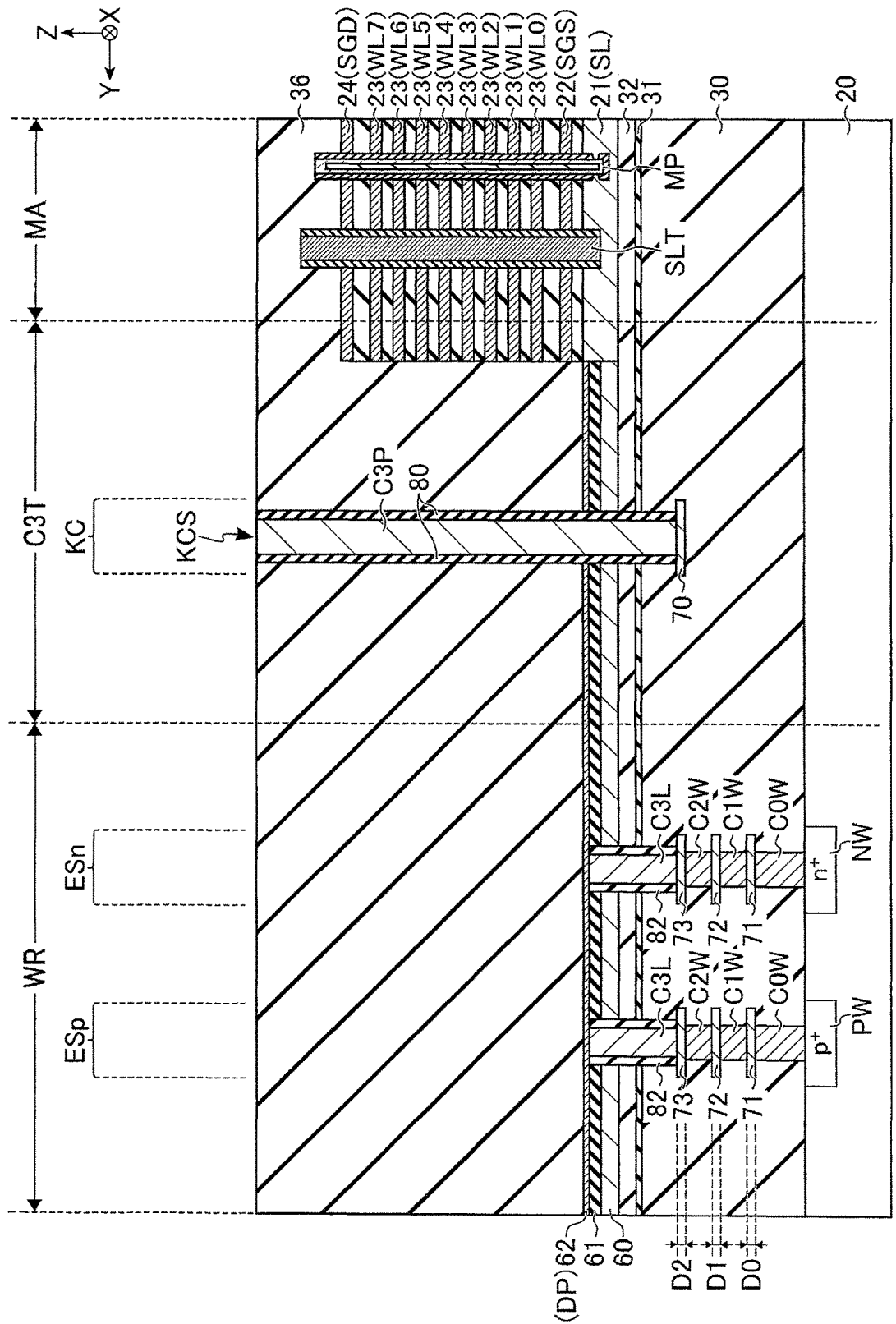

By the processing of step S205, as illustrated in FIG. 38, a slit KCS is formed, and spacers 80 and the contact C3P are formed in the slit KCS. Specifically, first, by photolithography or the like, a mask is formed in which a region corresponding to the dividing portion KC is opened. By anisotropic etching processing using the mask, the slit KCS is formed in the region corresponding to the dividing portion KC. Then, the spacers 80 and the contact C3P are formed in the slit KCS similarly to the first embodiment.

By the processing of step S206, as illustrated in FIG. 39, a slit C3St is formed, and spacers 81 and the contact C3U are formed in the slit C3St. Specifically, first, by photolithography or the like, a mask is formed in which the region corresponding to the sealing member ESn and the region corresponding to the sealing member ESp are opened. By anisotropic etching processing using the mask, the slit C3St is formed in each of the region corresponding to the sealing member ESn and the region corresponding to the sealing member ESp. Then, the spacers 81 and the contact C3U are formed in the slit C3St similarly to the first embodiment.

As a result, corresponding to the sealing member ESn, structure of the contacts C3L and C3U connected together via the conductive layer 62 is formed. Corresponding to the sealing member ESp, structure of the contacts C3L and C3U connected together via the conductive layer 62 is formed. Corresponding to the dividing portion KC, structure is formed in which the conductive layers 60 and 62 corresponding to a conductive portion DP are divided by the spacers 80. Note that, the manufacturing processes described above are merely examples, and other processing may be inserted between the manufacturing processes, or the order of the manufacturing processes may be changed as long as no problem occurs. Furthermore, the formation of the spacers 80 and the contact C3P in the slit KCS and the formation of the spacers 81 and the contact C3U in the slit C3St may be executed at once. In the second embodiment, it is sufficient that a process of forming the slit KCS and a process of forming the slit C3St are separated from each other.

[2-3] Effects of the Second Embodiment

According to the semiconductor memory device 1 according to the second embodiment described above, a yield of the semiconductor memory device 1 can be improved. Hereinafter, detailed effects will be described of the semiconductor memory device 1 according to the second embodiment.

In a semiconductor memory device in which memory cells are three-dimensionally stacked, for example, peripheral circuits are formed such as a row decoder module 15 and a sense amplifier module 16 for controlling a memory cell array 10, and then stacked wiring structure of the memory cell array 10 is formed. The stacked wiring structure can be a generation source of hydrogen in a formation process of the stacked wiring structure. Then, such hydrogen causes a decrease in performance of transistors of the peripheral circuits, and can cause a decrease in the yield.

On the other hand, to prevent hydrogen generated in the formation process of the stacked wiring structure from entering the peripheral circuits, the semiconductor memory device 1 according to the first embodiment includes a barrier film (for example, the insulating layer 31) between the stacked wiring structure and the peripheral circuits. However, in the structure of the semiconductor memory device 1 according to the first embodiment, hydrogen can enter the peripheral circuits via the contact (metal) of the sealing members ESn and ESp.

Figure 40:
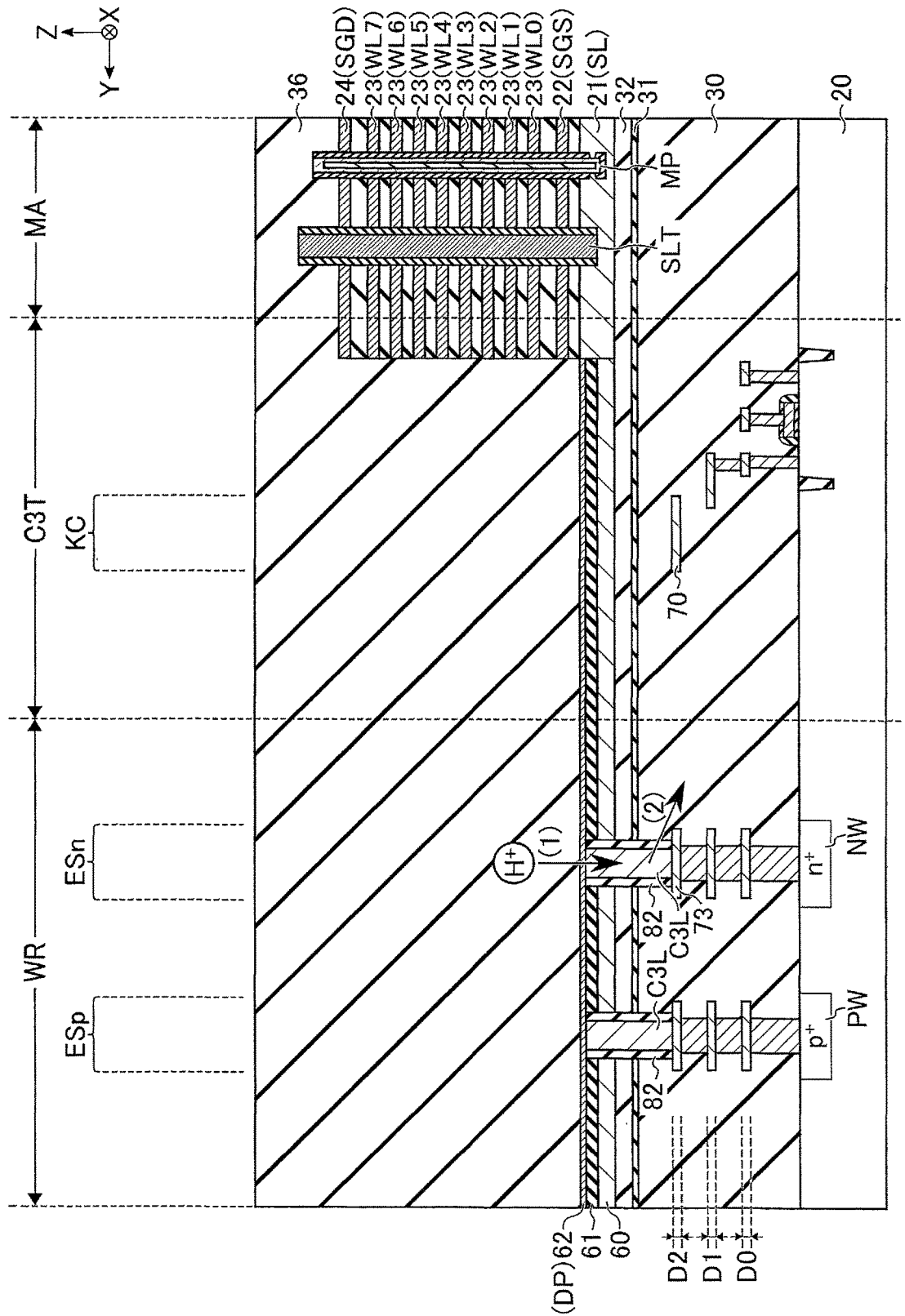

Thus, the semiconductor memory device 1 according to the second embodiment has structure in which the insulating film 82 is provided as a barrier film on side walls of the contact C3L of each of the sealing members ESn and ESp. Furthermore, in the semiconductor memory device 1 according to the second embodiment, the contacts C3L and C3U are connected to each other via the conductive layer 62 (conductive portion DP), in each of the sealing members ESn and ESp. FIG. 40 is a cross-sectional view illustrating an example of the cross-sectional structure during manufacturing of the semiconductor memory device 1 according to the second embodiment. FIG. 40 illustrates the structure of the semiconductor memory device 1 in a state in which the stacked wiring structure is formed after the structure illustrated in FIG. 37 is formed. As illustrated in FIG. 40, for example, hydrogen (Hi generated in an upper layer than the conductive layer 62 tends to enter the peripheral circuits via the contact C3L of the sealing member ESn.

On the other hand, in the semiconductor memory device 1 according to the second embodiment, since the conductive layer 62 is formed of, for example, polysilicon, passage of hydrogen from an insulating layer 36 toward the contact C3L is suppressed (path (1)). Moreover, since a material similar to the insulating layer 31 as the barrier film is used for the insulating film 82, for example, the insulating film 82 suppresses passage of hydrogen from the contact C3L toward the insulating layer 30 more strongly than the conductive layer 62 (path (2)).

As described above, the semiconductor memory device 1 according to the second embodiment can suppress hydrogen from entering the peripheral circuit, by the conductive layer 62 and the insulating film 82, and can suppress a decrease in performance of the transistors in the peripheral circuits. Thus, the semiconductor memory device 1 according to the second embodiment can suppress a decrease in the yield due to the decrease in performance of the transistors in the peripheral circuits.

Furthermore, the semiconductor memory device 1 according to the second embodiment has structure in which the contact C3L in the sealing members ESn and ESp electrically connected to the semiconductor substrate 20 is electrically connected to the conductive layer 62 (conductive portion DP), similarly to the first embodiment. As a result, the semiconductor memory device 1 according to the second embodiment can suppress the bias difference between the source line SL and the semiconductor substrate 20 in a high aspect ratio etching process, and can suppress occurrence of arcing, similarly to the first embodiment. Thus, the semiconductor memory device 1 according to the second embodiment can suppress a decrease in the yield due to the occurrence of arcing, similarly to the first embodiment.

[3] Third Embodiment

A semiconductor memory device 1 according to a third embodiment includes a sealing member ES and a conductive portion DP each having structure different from that of the semiconductor memory device 1 according to the first embodiment. Hereinafter, a description will be given of a point different from the first and second embodiments, for the semiconductor memory device 1 according to the third embodiment.

[3-1] Configuration of Semiconductor Memory Device 1

Figure 41:
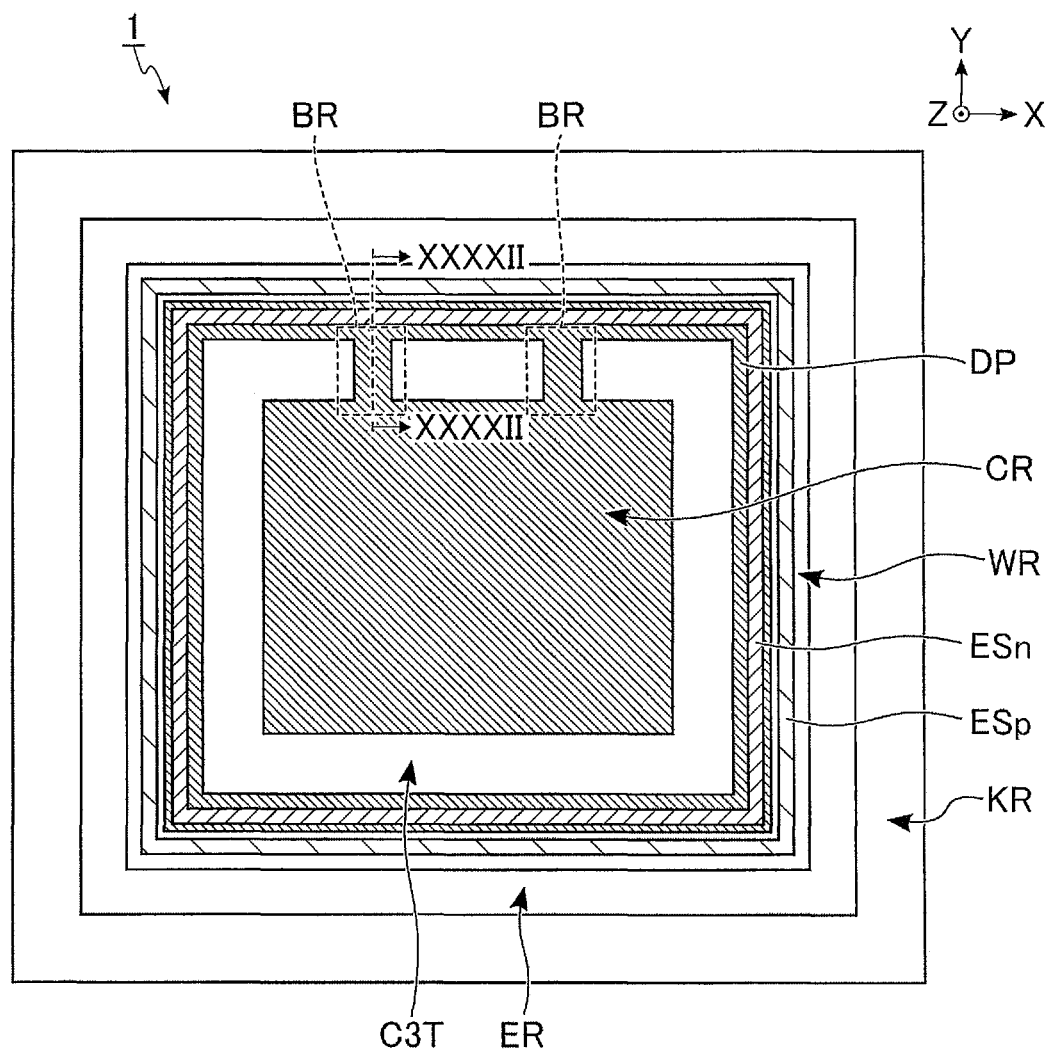
FIG. 41 is a plan view illustrating an example of a plan layout of a sealing member and a conductive portion in a semiconductor memory device according to a third embodiment.

FIG. 41 is a plan view illustrating an example of a plan layout of the sealing member ES and the conductive portion DP in the semiconductor memory device 1 according to the third embodiment. FIG. 41 illustrates the same region as the plan layout of the semiconductor memory device 1 according to the first embodiment illustrated in FIG. 3. As illustrated in FIG. 41, in the semiconductor memory device 1 according to the third embodiment, a range in which the conductive portion DP is provided is different from that of the first embodiment, and a dividing portion KC is omitted.

Specifically, the outer periphery of the conductive portion DP in the third embodiment is arranged between the sealing member ESn and a sealing member ESp. The conductive portion DP in the third embodiment is connected to the sealing member ESn and is not connected to the sealing member ESp. Then, in the third embodiment, the dividing portion KC of each of bridge portions BR is omitted. For this reason, in the semiconductor memory device 1 according to the third embodiment, the conductive portion DP in a core region CR and the conductive portion DP in a wall region WR are electrically connected together.

Figure 42:
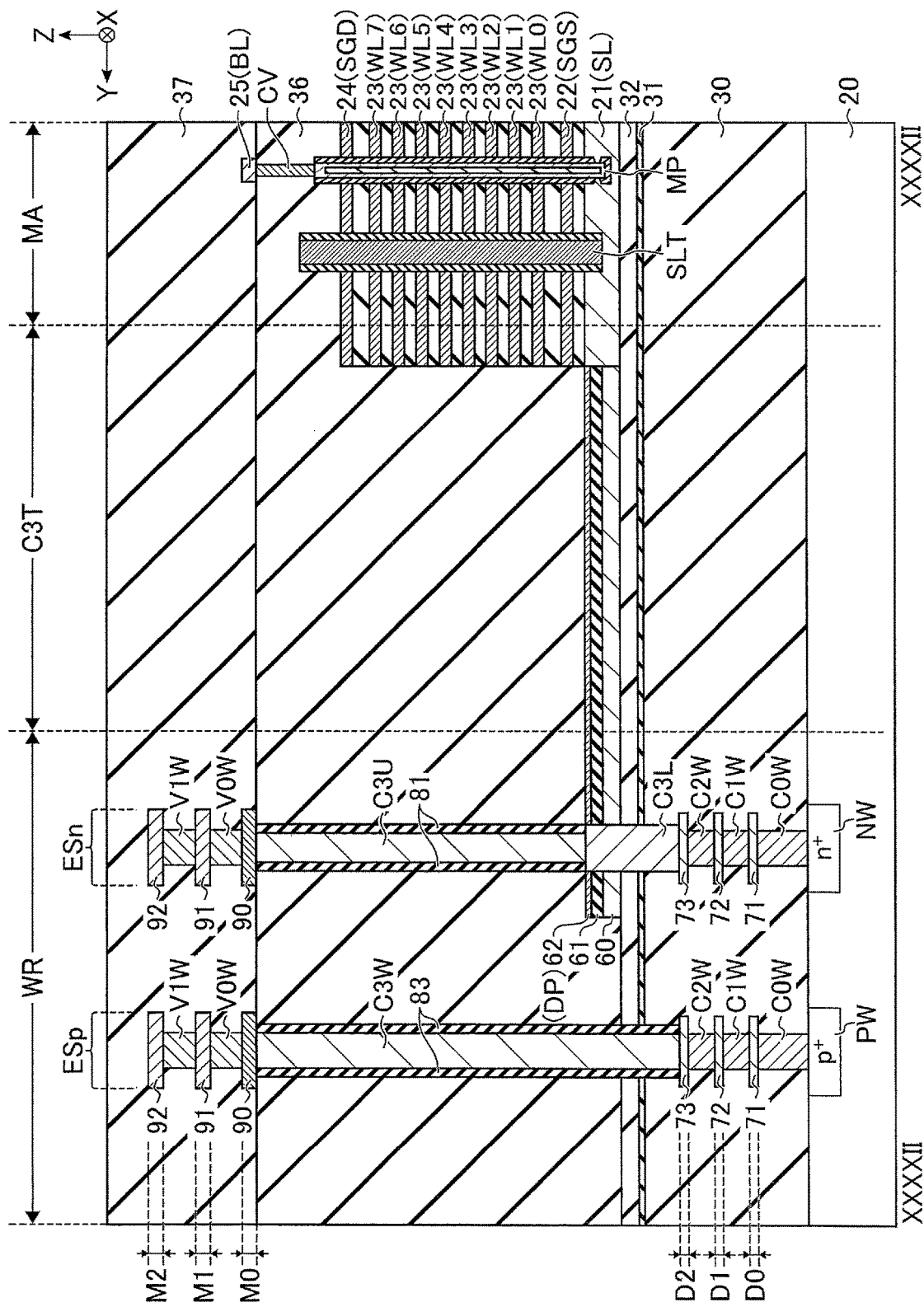
FIG. 42 is a cross-sectional view taken along a line XXXXII-XXXXII of FIG. 41 illustrating an example of cross-sectional structure in a contact region and a wall region of the semiconductor memory device according to the third embodiment.

FIG. 42 is a cross-sectional view taken along a line XXXXII-XXXXII of FIG. 41 illustrating an example of cross-sectional structure in a contact region C3T and the wall region WR of the semiconductor memory device 1 according to the third embodiment. As illustrated in FIG. 42, in the semiconductor memory device 1 according to the third embodiment, the structure of the sealing member ESn and structure of the sealing member ESp are different from each other.

The sealing member ESn in the third embodiment has, for example, square ring structure and includes contacts C0W, C1W, C2W, C3L, C3U, V0W, and V1W and conductive layers 71 to 73 and 90 to 92. In the sealing member ESn, the contact C3L is provided on the conductive layer 73, the contact C3U is provided on the contact C3L, and the conductive layer 90 is provided on the contact C3U. The contact C3L of the sealing member ESn divides a conductive layer 62, an insulating layer 61, and a conductive layer 60, and is electrically connected to the conductive layers 62 and 60. That is, the upper end of the contact C3L of the sealing member ESn is included in a layer (height) provided with a source line SL. Furthermore, the side surfaces of the contact C3L of the sealing member ESn are in contact with the conductive layer 62. Specifically, side surface portions adjacent to the upper end of the contact C3L, of the sealing member ESn is in contact with the conductive layer 62. Spacers 81 are provided on side surfaces of the contact C3U of the sealing member ESn. That is, in the third embodiment, for example, an oxide film is provided on the side surfaces of the contact C3U, and no oxide film is provided on the side surfaces of the contact C3L.

The sealing member ESp in the third embodiment has, for example, square ring structure and includes contacts C0W, C1W, C2W, C3W, V0W, and V1W and conductive layers 71 to 73 and 90 to 92. In the sealing member ESp, the contact C3W is provided on the conductive layer 73, and the conductive layer 90 is provided on the contact C3W. The contact C3W of the sealing member ESp divides insulating layers 36, 32, and 31, and a part of an insulating layer 30. Spacers 83 are provided on side surfaces of the contact C3W of the sealing member ESp. The spacer 83 is, for example, a silicon oxide film. Other configurations of the semiconductor memory device 1 according to the third embodiment are similar to those of the first embodiment.

[3-2] Method for Manufacturing Semiconductor Memory Device 1

Figure 43:
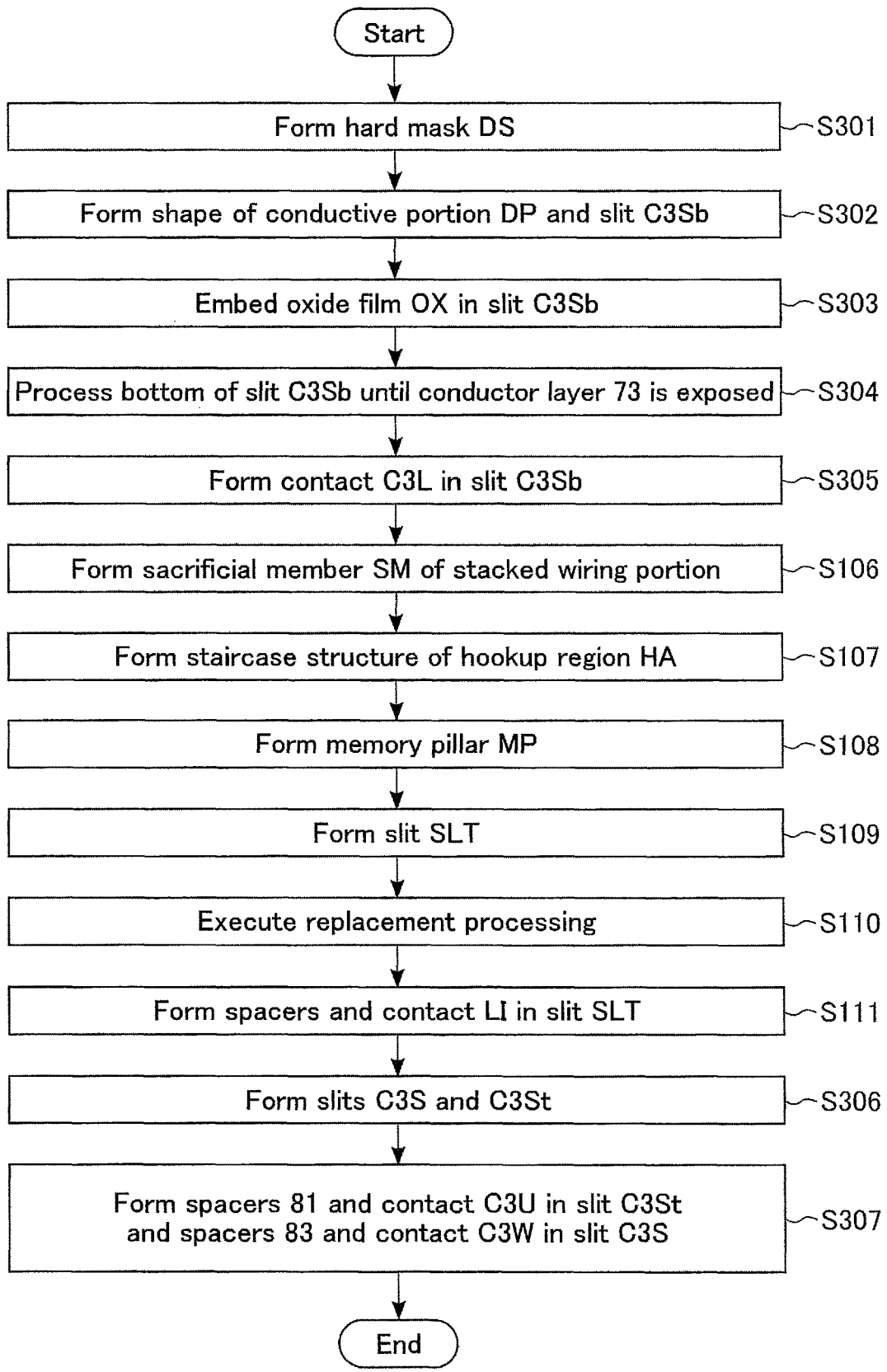
FIG. 43 is a flowchart illustrating an example of a method for manufacturing the semiconductor memory device according to the third embodiment.

FIG. 43 is a flowchart illustrating an example of a method for manufacturing the semiconductor memory device 1 according to the third embodiment. Each of FIGS. 44 to 52 is a cross-sectional view illustrating an example of cross-sectional structure of the semiconductor memory device 1 according to the third embodiment during manufacturing. Each of FIGS. 44 to 52 illustrates the same region as the cross-sectional structure of the semiconductor memory device 1 according to the third embodiment illustrated in FIG. 42. Hereinafter, with reference to FIG. 43 as appropriate, an example will be described of a series of manufacturing processes from formation of a source line portion SLP used for formation of the source line SL to formation of the contacts C3U and C3W.

Before processing illustrated in FIG. 43 is executed, a configuration from peripheral circuits on a semiconductor substrate 20 to the source line portion SLP is formed. Briefly, although illustration is omitted, an N-type impurity diffusion region NW, a P-type impurity diffusion region PW, conductive layers 70 to 73, and contacts C0W to C2W are formed similarly to the first embodiment. The insulating layers 31 and 32, the conductive layer 60, an insulating layer 63, and a sacrificial member 64 are formed in this order on the insulating layer 30 including the conductive layers 70 to 73 and the contacts C0W to C2W. Then, the insulating layer 63 and the sacrificial member 64 provided outside a memory region MA are removed, and the insulating layer 61 and the conductive layer 62 are formed in this order. It is sufficient that the sacrificial member 64 is removed at portions corresponding to the sealing members ESn and ESp. Furthermore, the insulating layer 63 may remain in the contact region C3T and the wall region WR. The height of the insulating layer 61 may or may not be uniform in the memory region MA, the contact region C3T, and the wall region WR. The thickness of the conductive layer 62 is, for example, equivalent to the thickness of the conductive layer 62 illustrated in FIG. 42. Then, the processing of steps S301 to S304 is executed in order.

Figure 44:
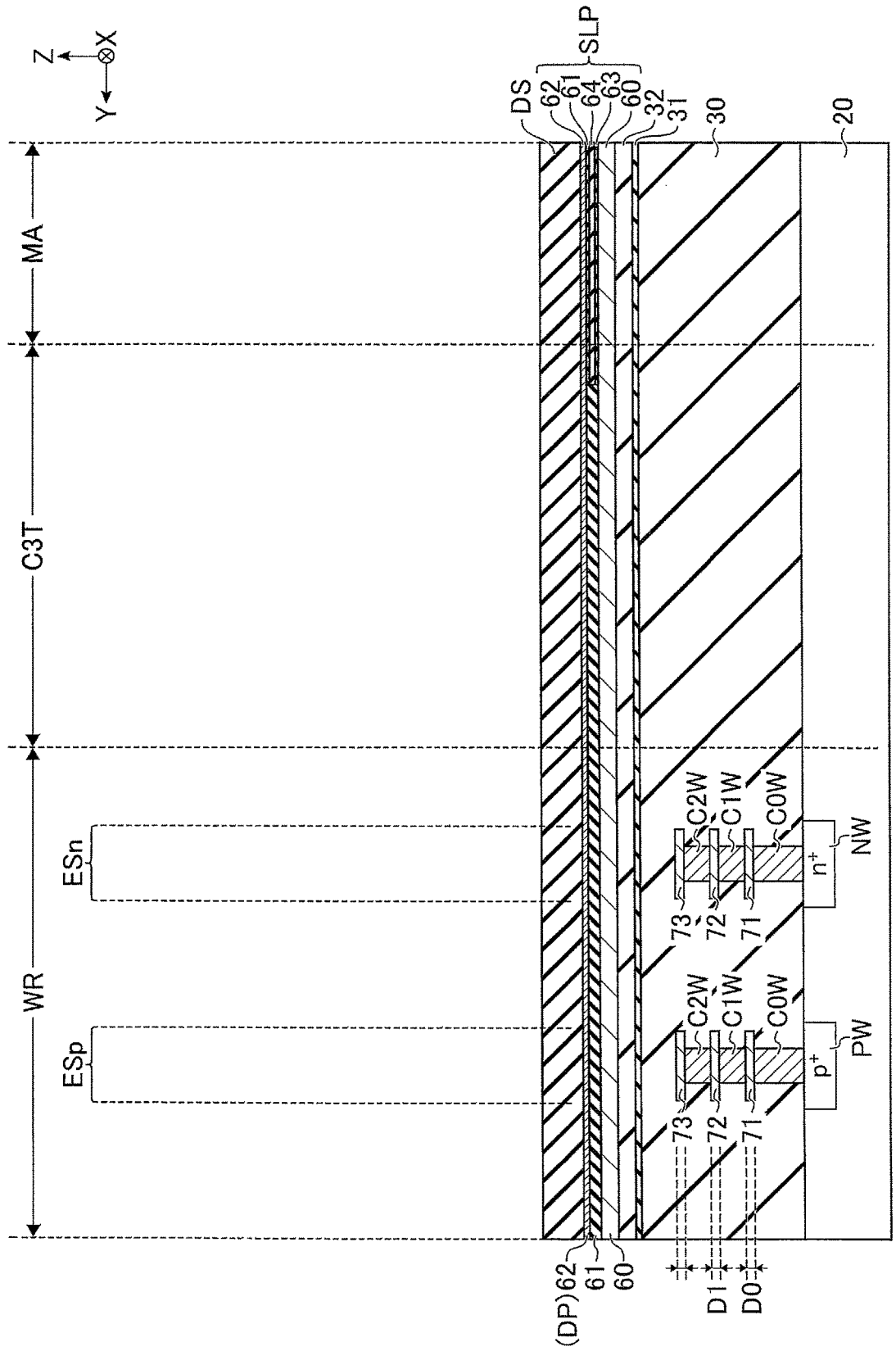

By the processing of step S301, as illustrated in FIG. 44, a hard mask DS is formed. The hard mask DS is formed on the conductive layer 62. As the hard mask DS, for example, a material is used different from an organic resist material used in photolithography.

Figure 45:
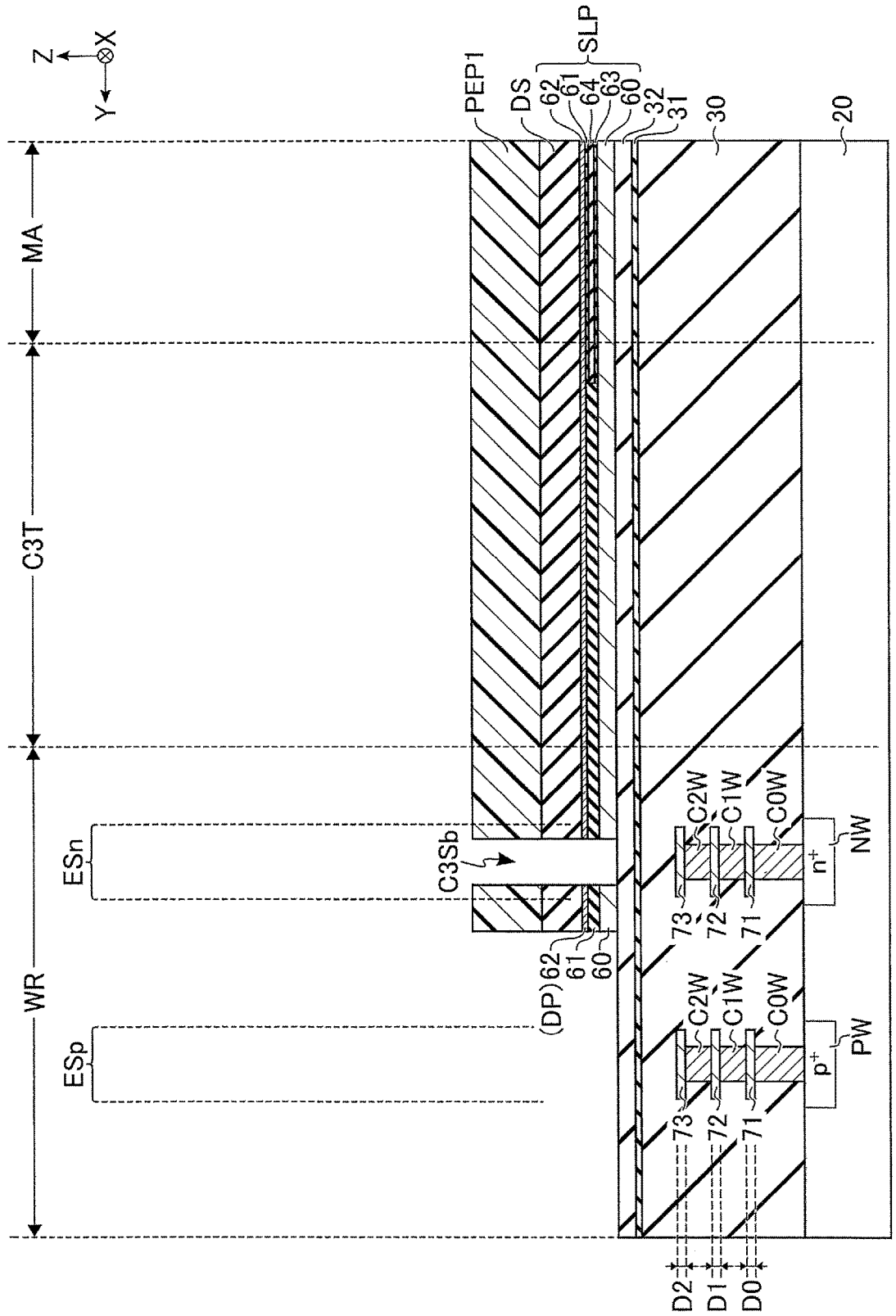

By the processing of step S302, as illustrated in FIG. 45, the shape of the conductive portion DP, and a slit C3Sb are formed. Specifically, first, a mask PEP1 is formed in which a region where the contact C3L in the sealing member ESn is formed and a region outside from a point between the sealing members ESn and ESp are each opened. Then, anisotropic etching using the mask PEP1 is executed, and the slit C3Sb is formed that divides the hard mask DS, the conductive layer 62, the insulating layer 61, and the conductive layer 60. At the bottom of the slit C3Sb, for example, a surface of the insulating layer 32 is exposed. After that, the mask PEP1 is removed.

Figure 46:
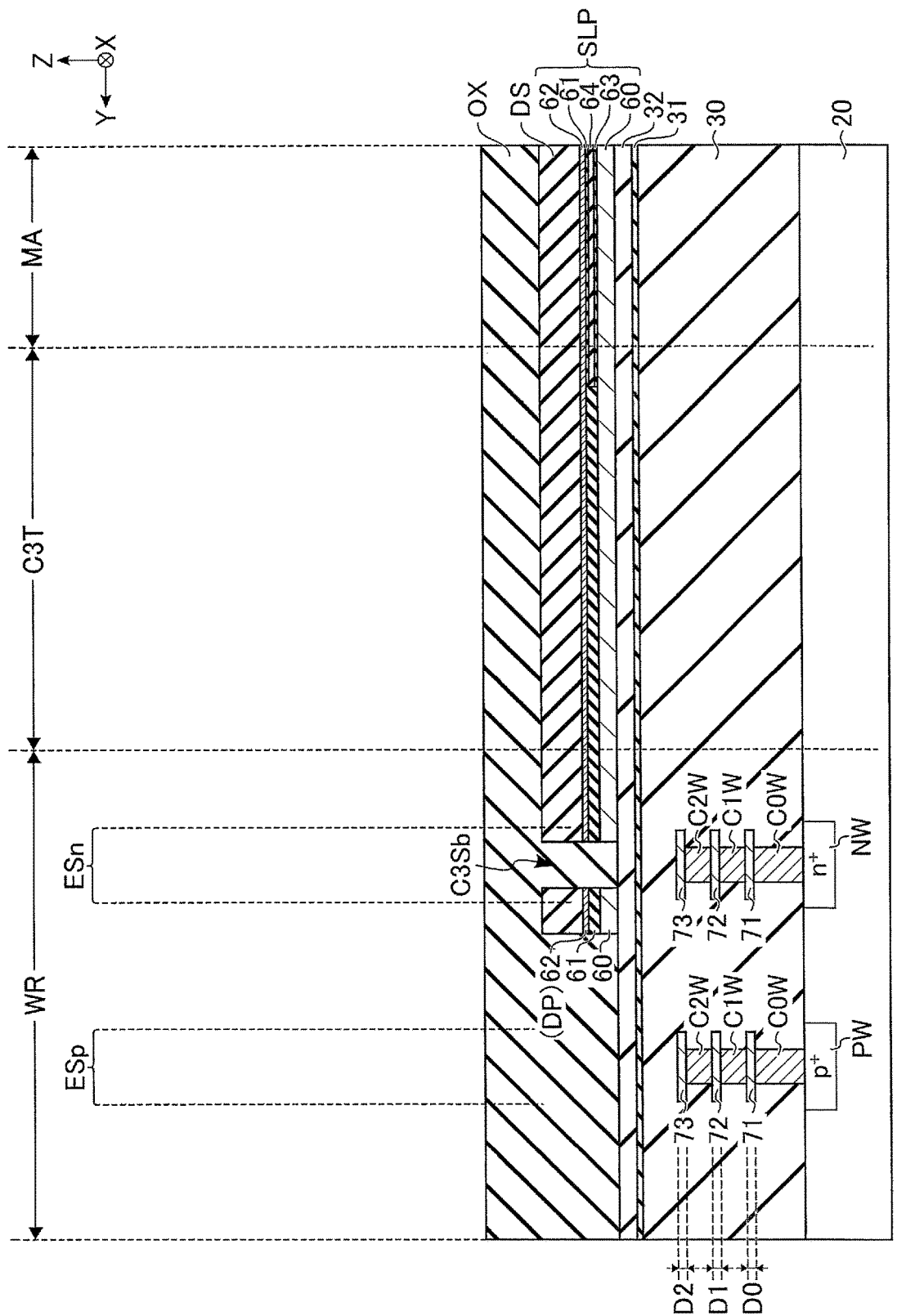

By the processing of step S303, an oxide film OX is embedded in the slit C3Sb. Specifically, as illustrated in FIG. 46, the oxide film OX is formed, for example, by Chemical Vapor Deposition (CVD). It suffices that the oxide film OX is filled at least in the slit C3Sb. Then, as illustrated in FIG. 47, the oxide film OX provided on the hard mask DS is removed, for example, by etch back processing. In this processing, it is sufficient that at least the oxide film OX in the slit C3Sb remains.

By the processing of step S304, as illustrated in FIG. 48, the bottom of the slit C3Sb is processed until a surface of the conductive layer 73 is exposed. Specifically, first, a mask PEP2 is formed in which a region where the slit C3Sb is formed is included and a region wider than the slit C3Sb is opened. Then, anisotropic etching using the mask PEP2 is executed, and a part of the hard mask DS and the oxide film OX in the slit C3Sb are removed. As a result, the surface of the conductive layer 73 is exposed at the bottom of the slit C3Sb. After that, the mask PEP2 is removed.

Figure 49:
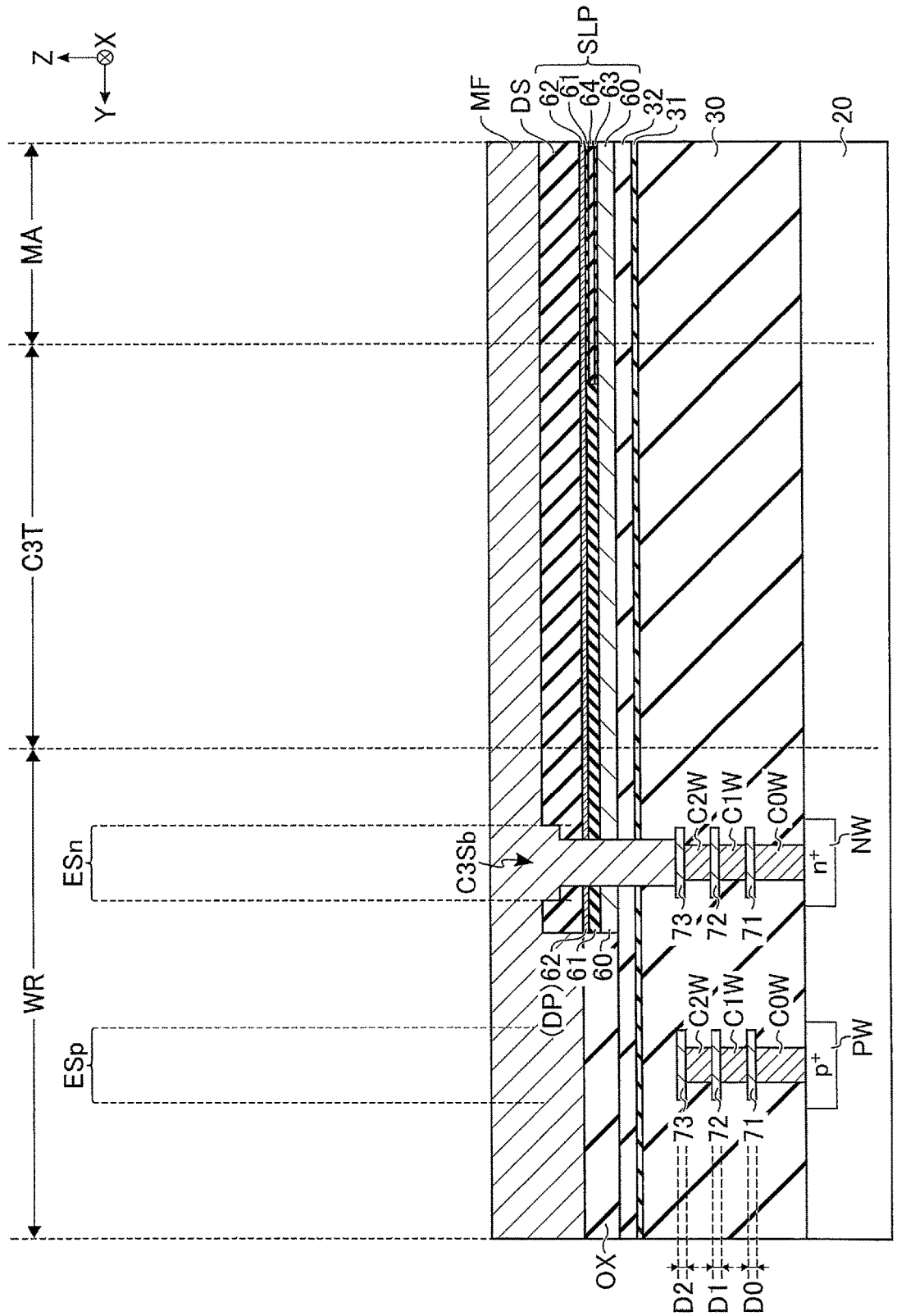

By the processing of step S305, the contact C3L is formed in the slit C3Sb. Specifically, as illustrated in FIG. 49, a conductor MF is formed, and is embedded in the slit C3Sb. Then, as illustrated in FIG. 50, etch back processing is executed so that the conductor MF remains in the slit C3Sb. The conductor MF remaining in the slit C3Sb corresponds to the contact C3L. Then, as illustrated in FIG. 51, the hard mask DS is removed. A level difference of the conductive layer 60, the insulating layer 61, and the conductive layer 62 inside and outside a region between the sealing members ESn and ESp is filled with, for example, the oxide film OX. After that, the processing of steps S106 to S111 is executed in order.

By the processing of step S106, a sacrificial member SM of a stacked wiring portion is formed similarly to the first embodiment. By the processing of step S107, staircase structure of hookup regions HA1 and HA2 is formed similarly to the first embodiment. By the processing of step S108, a memory pillar MP is formed similarly to the first embodiment. By the processing of step S109, a slit SLT is formed similarly to the first embodiment. By the processing of step S110, replacement processing is executed similarly to the first embodiment. By the processing of step S111, spacers SP and a contact LI are formed in the slit SLT similarly to the first embodiment. After that, the processing of steps S306 and S307 is executed in order.

By the processing of step S306, slits C3S and C3St are formed although illustration is omitted. Specifically, by photolithography or the like, a mask is formed in which a region corresponding to the slit C3S and a region corresponding to the slit C3St are opened. By anisotropic etching processing using the mask, the slit C3St is formed in a region corresponding to the sealing member ESn, and the slit C3S is formed in a region corresponding to the sealing member ESp. The slit C3St divides the insulating layer 36, and a surface of the contact C3L is exposed at the bottom of the slit C3St. The slit C3S divides the insulating layer 36, the oxide film OX, the insulating layers 32 and 31, and a part of the insulating layer 30, and the surface of the conductive layer 73 is exposed at the bottom of the slit C3S.

Figure 52:
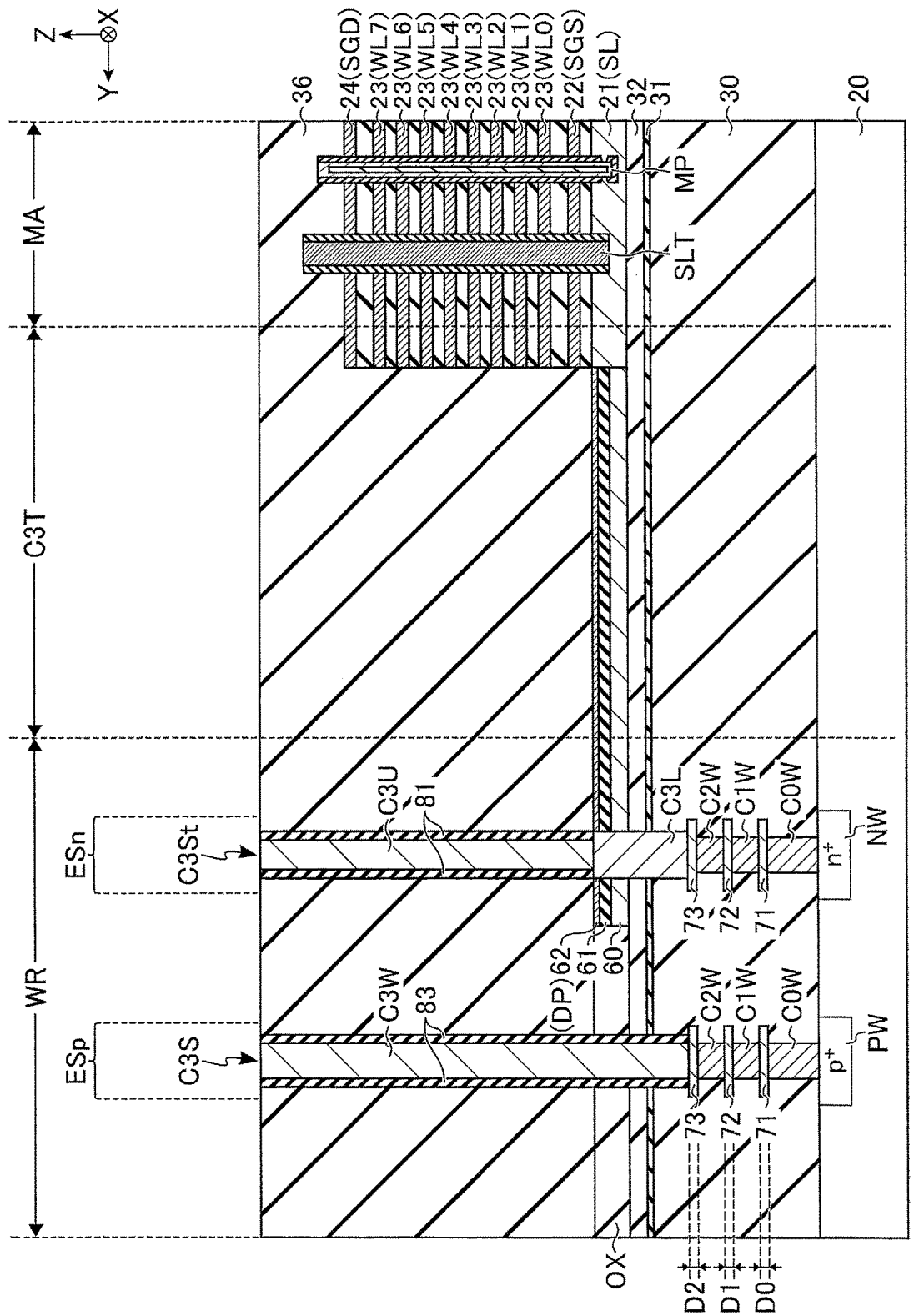

By the processing of step S307, as illustrated in FIG. 52, the spacers 81 and the contact C3U are formed in the slit C3St, and the spacers 83 and the contact C3W are formed in the slit C3S. Specifically, first, an insulating film corresponding to the spacers 81 and 83 is formed by CVD or the like. The insulating film is formed not only on the side surfaces of each of the slits C3St and C3S, but also on the bottom of each of the slits C3St and C3S. Subsequently, etch back processing is executed, and the insulating film formed on the bottom of each of the slits C3St and C3S is removed. As a result, the contact C3L is exposed at the bottom of the slit C3St, and the conductive layer 73 is exposed at the bottom of the slit C3S. Then, a conductor is embedded in each of the slits C3St and C3S, and the conductor outside the slits C3St and C3S is removed. The conductor formed in the slit C3St corresponds to the contact C3U. The conductor formed in the slit C3S corresponds to the contact C3W.

As a result, corresponding to the sealing member ESn, structure is formed in which the square ring contacts C3L and C3U are connected together. Corresponding to the sealing member ESp, the square ring contact C3W is formed. Note that, the manufacturing processes described above are merely examples, and other processing may be inserted between the manufacturing processes, or the order of the manufacturing processes may be changed as long as no problem occurs.

[3-3] Effects of the Third Embodiment

According to the semiconductor memory device 1 according to the third embodiment described above, a yield of the semiconductor memory device 1 can be improved similarly to the first embodiment, and manufacturing cost can be further suppressed. Hereinafter, detailed effects will be described of the semiconductor memory device 1 according to the third embodiment.

Figure 53:
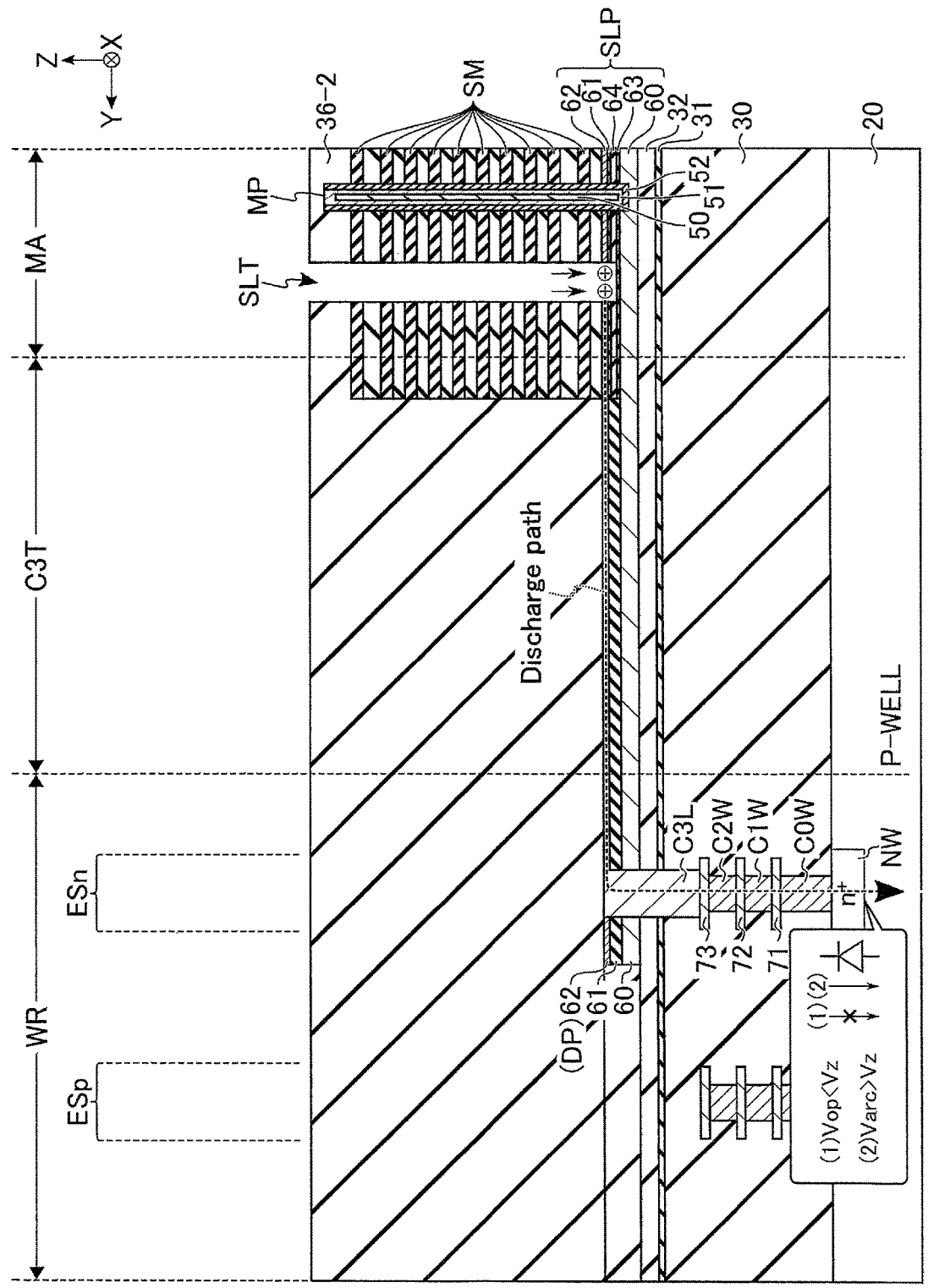

FIG. 53 is a cross-sectional view illustrating an example of cross-sectional structure of the semiconductor memory device 1 according to the third embodiment during manufacturing. FIG. 53 illustrates the structure of the semiconductor memory device 1 in a state in which the stacked wiring structure before the replacement processing is formed after the structure illustrated in FIG. 51 is formed. As illustrated in FIG. 53, in the semiconductor memory device 1 according to the third embodiment, a diode is formed by the P-type semiconductor substrate 20 (P-WELL) and the N-type impurity diffusion region NW. Then, the semiconductor memory device 1 according to the third embodiment includes a discharge path via the contact C3L of the sealing member ESn in a high aspect ratio etching process.

In the semiconductor memory device 1 according to the third embodiment, the contact C3L of the sealing member ESn and a conductive layer 21 (source line SL) in the memory region MA are electrically connected together even after the device is completed. Then, a voltage Vop that can be applied to the source line SL during operation of the semiconductor memory device 1 is, for example, a positive voltage, and is set not to exceed a breakdown voltage Vz of the diode formed between the semiconductor substrate 20 and the N-type impurity diffusion region NW. For this reason, the diode is in a reverse bias state during operation of the semiconductor memory device 1, so that a flow of a current from the source line SL to the semiconductor substrate 20 is suppressed (FIG. 53 (1)). On the other hand, a voltage Varc generated in the source line SL in the high aspect ratio etching process can exceed the breakdown voltage Vz of the diode. That is, during manufacturing of the semiconductor memory device 1, a breakdown current can flow from the source line SL to the semiconductor substrate 20 when the diode is in a breakdown state (FIG. 53 (2)).

As described above, in the semiconductor memory device 1 according to the third embodiment, the sealing member ESn is used as the discharge path in the high aspect ratio etching process, and suppresses discharge of electric charge to the semiconductor substrate 20 during operation of the semiconductor memory device 1. As a result, the semiconductor memory device 1 according to the third embodiment can cause positive charge stored in the source line SL to be discharged to the semiconductor substrate 20 via the sealing member ESn in the high aspect ratio etching process. Furthermore, in the semiconductor memory device 1 according to the third embodiment, even if the sealing member ESn and the conductive layer 21 in the memory region MA are electrically connected together, the semiconductor memory device 1 can operate without problems as described above. As a result, the semiconductor memory device 1 according to the third embodiment can omit a manufacturing process related to the dividing portion KC, and can suppress the manufacturing cost of the semiconductor memory device 1.

[4] Modification

The first to third embodiments can be modified in various ways. Hereinafter, descriptions will be given of a first modification, a second modification, a third modification, a fourth modification, and a fifth modification.

(First Modification)

The first modification relates to the structure of the sealing members ESn and ESp described in the first embodiment.

Figure 54:
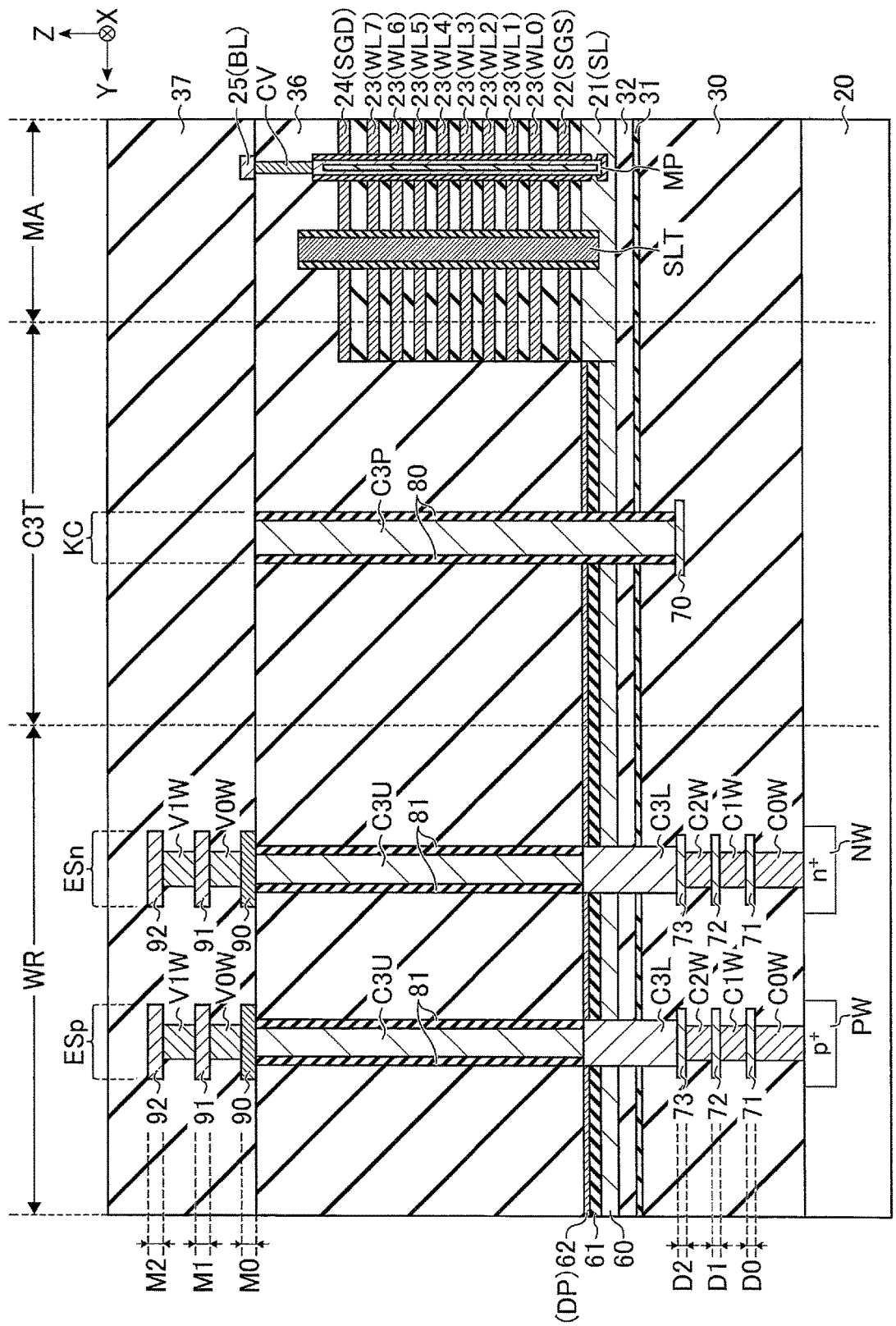
FIG. 54 is a cross-sectional view illustrating an example of cross-sectional structure in the contact region and the wall region of the semiconductor memory device according to the first embodiment to which a first modification is applied.

FIG. 54 is a cross-sectional view illustrating an example of cross-sectional structure in the contact region C3T and the wall region WR of the semiconductor memory device 1 according to the first embodiment to which the first modification is applied. FIG. 54 illustrates the same region as the cross-sectional structure of the semiconductor memory device 1 according to the first embodiment illustrated in FIG. 11. As illustrated in FIG. 54, in the semiconductor memory device 1 according to the first embodiment to which the first modification is applied, the contact C3M is omitted, and the contact C3U is provided on the contact C3L. Other configurations are similar to those in the first embodiment. As described above, in the semiconductor memory device 1 according to the first embodiment, the contact C3M may be omitted if there is no problem in design of a margin for superposition of the contacts C3L and C3U. In the semiconductor memory device 1 according to the first embodiment to which the first modification is applied, it is preferable that the width of the upper surface of the contact C3L is wider than the width of the bottom of the slit C3St.

(Second Modification)

The second modification relates to a case where the structure of the conductive portion DP described in the third embodiment is applied to each of the first and second embodiments.

FIG. 55 is a cross-sectional view illustrating an example of cross-sectional structure in the contact region C3T and the wall region WR of the semiconductor memory device 1 according to the first embodiment to which the second modification is applied. FIG. 55 illustrates the same region as the cross-sectional structure of the semiconductor memory device 1 according to the first embodiment illustrated in FIG. 11.

As illustrated in FIG. 55, the semiconductor memory device 1 according to the first embodiment to which the second modification is applied is provided with the conductive portion DP in the same range as that of the third embodiment. Then, the semiconductor memory device 1 according to the first embodiment to which the second modification is applied includes the sealing member ESn described in the first embodiment and the sealing member ESp described in the third embodiment. Other configurations are similar to those in the first embodiment. In such a case, the semiconductor memory device 1 according to the first embodiment to which the second modification is applied can obtain an effect of combining the first embodiment and the third embodiment.

Figure 56:
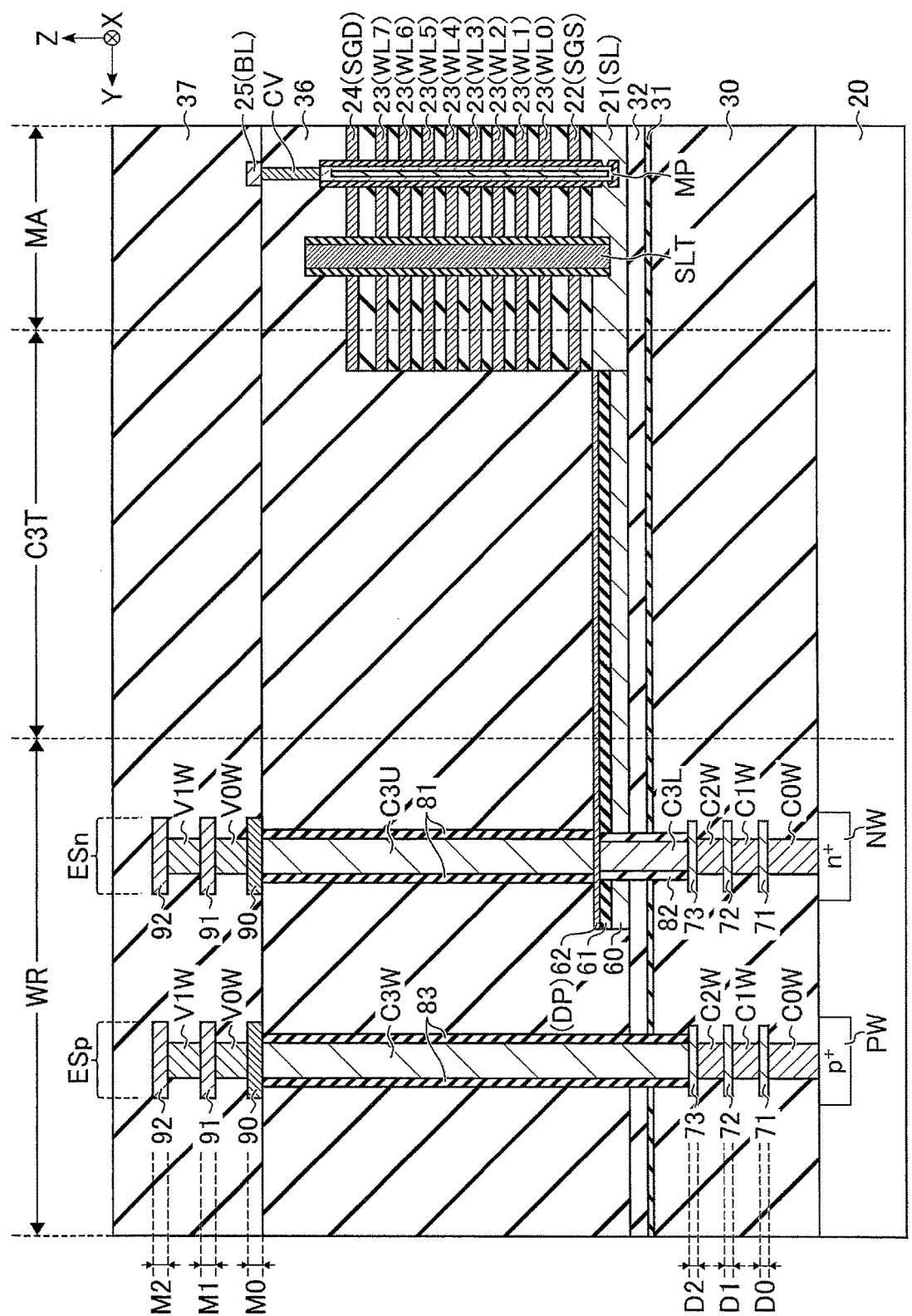
FIG. 56 is a cross-sectional view illustrating an example of cross-sectional structure in the contact region and the wall region of the semiconductor memory device according to the second embodiment to which the second modification is applied.

FIG. 56 is a cross-sectional view illustrating an example of the cross-sectional structure in the contact region C3T and the wall region WR of the semiconductor memory device 1 according to the second embodiment to which the second modification is applied. FIG. 56 illustrates the same region as the cross-sectional structure of the semiconductor memory device 1 according to the second embodiment illustrated in FIG. 29.

As illustrated in FIG. 56, the semiconductor memory device 1 according to the second embodiment to which the second modification is applied is provided with the conductive portion DP in the same range as that of the third embodiment. Then, the semiconductor memory device 1 according to the second embodiment to which the second modification is applied includes the sealing member ESn described in the second embodiment and the sealing member ESp described in the third embodiment. Other configurations are similar to those in the second embodiment. In such a case, the semiconductor memory device 1 according to the second embodiment to which the second modification is applied can obtain an effect of combining the second embodiment and the third embodiment.

(Third Modification)

The third modification relates to a case where a plurality of the sealing members ESn is provided in the wall region WR.

Figure 57:
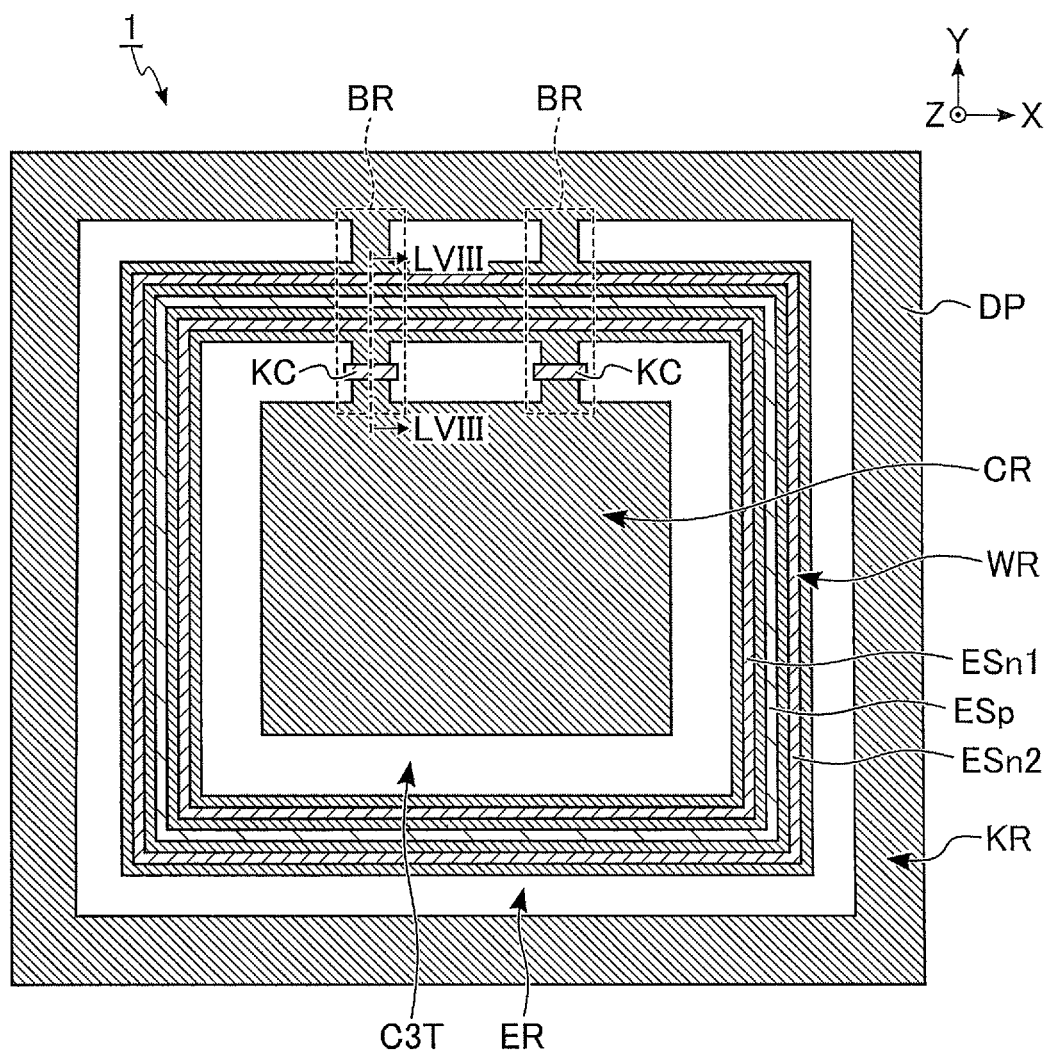
FIG. 57 is a plan view illustrating an example of a plan layout of the sealing member and the conductive portion in the semiconductor memory device according to the first embodiment to which a third modification is applied.

FIG. 57 is a plan view illustrating an example of a plan layout of the sealing member ES and the conductive portion DP in the semiconductor memory device 1 according to the first embodiment to which the third modification is applied. FIG. 57 illustrates the same region as the plan layout of the semiconductor memory device 1 according to the first embodiment illustrated in FIG. 3. As illustrated in FIG. 57, the semiconductor memory device 1 according to the first embodiment to which the third modification is applied includes sealing members ESn1 and ESn2 and the sealing member ESp in the wall region WR. The sealing member ESn1, the sealing member ESp, and the sealing member ESn2 are closer to the memory region MA in this order. That is, the sealing member ESp is arranged between the sealing members ESn1 and ESn2.

Figure 58:
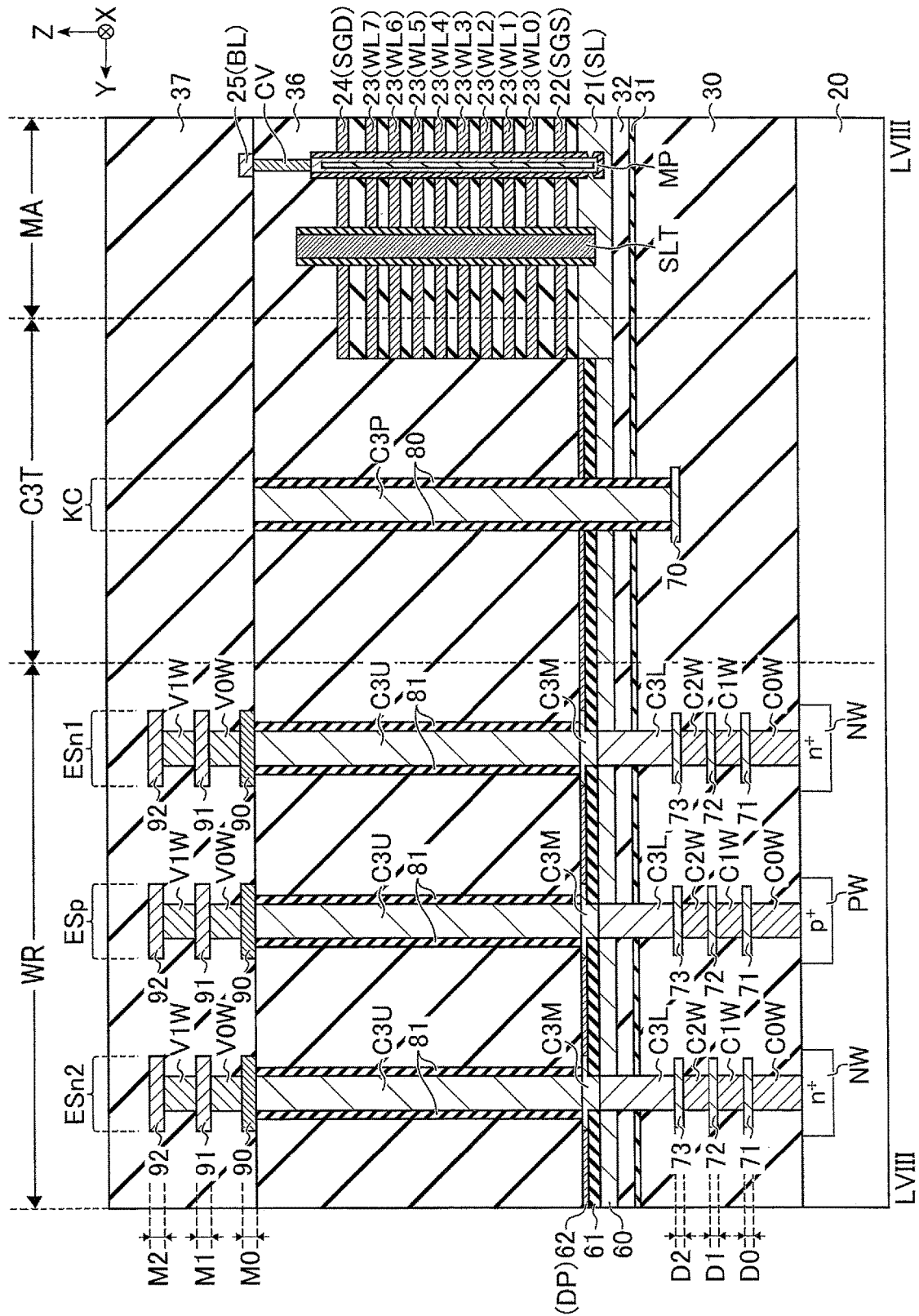
FIG. 58 is a cross-sectional view taken along a line LVIII-LVIII of FIG. 57 illustrating an example of cross-sectional structure in the contact region and the wall region of the semiconductor memory device according to the first embodiment to which the third modification is applied.

FIG. 58 is a cross-sectional view taken along a line LVIII-LVIII of FIG. 57 illustrating an example of cross-sectional structure in the contact region C3T and the wall region WR of the semiconductor memory device 1 according to the first embodiment to which the third modification is applied. As illustrated in FIG. 58, structure of each of the sealing members ESn1 and ESn2 is similar to the structure of the sealing member ESn described in the first embodiment. In the semiconductor memory device 1 according to the first embodiment to which the third modification is applied, a sealing member arranged closest to the memory region MA is the ESn1, and a sealing member arranged farthest from the memory region MA is the ESn2. Other configurations are similar to those in the first embodiment.

As a result, in the semiconductor memory device 1 according to the first embodiment to which the third modification is applied, the storage of the positive charge of the source line SL generated in the memory region MA is discharged to the semiconductor substrate 20 mainly via the sealing member ESn1, and static electricity or the like from the outside is discharged to the semiconductor substrate 20 mainly via the sealing member ESn2. As a result, the semiconductor memory device 1 according to the first embodiment to which the third modification is applied can suppress destruction of an element of the semiconductor memory device 1 due to abnormal discharge or static electricity, and improve reliability of the semiconductor memory device 1. The semiconductor memory device 1 can obtain an effect similar to a case where the third modification is applied to the first embodiment even in a case where the third modification is applied to the second embodiment.

FIG. 59 is a plan view illustrating an example of a plan layout of the sealing member ES and the conductive portion DP in the semiconductor memory device 1 according to the third embodiment to which the third modification is applied. FIG. 59 illustrates the same region as the plan layout of the semiconductor memory device 1 according to the first embodiment illustrated in FIG. 3. As illustrated in FIG. 59, the semiconductor memory device 1 according to the third embodiment to which the third modification is applied includes the sealing members ESn1 and ESn2 and the sealing member ESp in the wall region WR. The sealing member ESn1, the sealing member ESp, and the sealing member ESn2 are closer to the memory region MA in this order. That is, the sealing member ESp is arranged between the sealing members ESn1 and ESn2. The outer peripheral of the conductive portion DP is arranged between the sealing members ESn1 and ESp.

Figure 60:
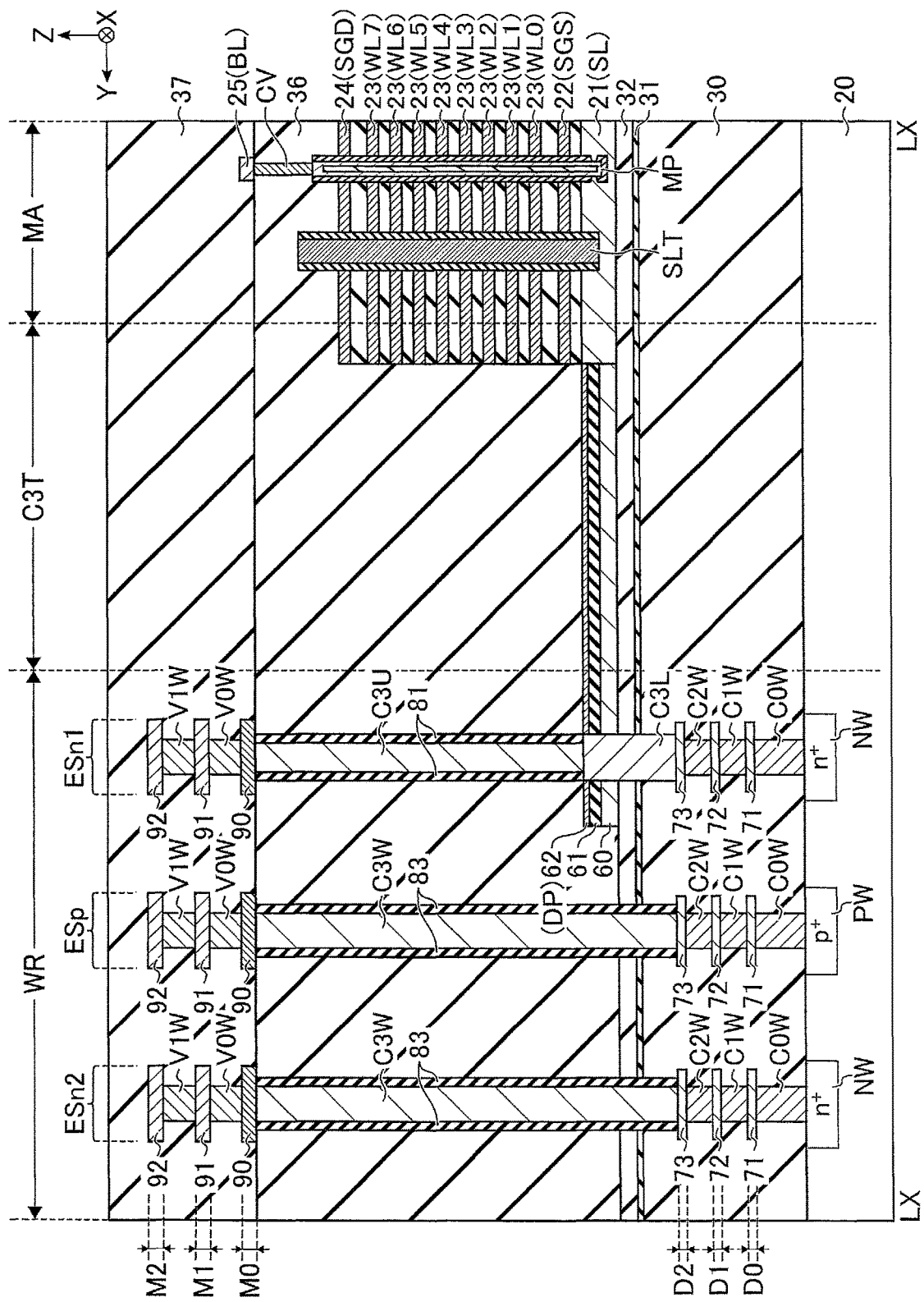
FIG. 60 is a cross-sectional view taken along a line LX-LX of FIG. 59 illustrating an example of cross-sectional structure in the contact region and the wall region of the semiconductor memory device according to the third embodiment to which the third modification is applied.

FIG. 60 is a cross-sectional view taken along a line LX-LX of FIG. 59 illustrating an example of cross-sectional structure in the contact region C3T and the wall region WR of the semiconductor memory device 1 according to the third embodiment to which the third modification is applied. As illustrated in FIG. 60, structures of the sealing members ESn1 and ESp are similar to the structures of the sealing members ESn and ESp described in the third embodiment, respectively. On the other hand, the sealing member ESn2 has structure in which the contact C0W is connected to the N-type impurity diffusion region NW and other portions are similar to the sealing member ESp. Furthermore, a sealing member arranged closest to the memory region MA is the ESn1, and a sealing member arranged farthest from the memory region MA is the ESn2. Other configurations are similar to those in the third embodiment.

As a result, in the semiconductor memory device 1 according to the third embodiment to which the third modification is applied, the storage of the positive charge of the source line SL generated in the memory region MA is discharged to the semiconductor substrate 20 mainly via the sealing member ESn1, and static electricity or the like from the outside is discharged to the semiconductor substrate 20 mainly via the sealing member ESn2. As a result, the semiconductor memory device 1 according to the third embodiment to which the third modification is applied can suppress destruction of an element of the semiconductor memory device 1 due to abnormal discharge or static electricity, and improve reliability of the semiconductor memory device 1.

(Fourth Modification)

The fourth modification relates to a case where a discharge portion DIS is provided that utilizes a part of the structure of the sealing member ESn described in the third embodiment.

Figure 61:
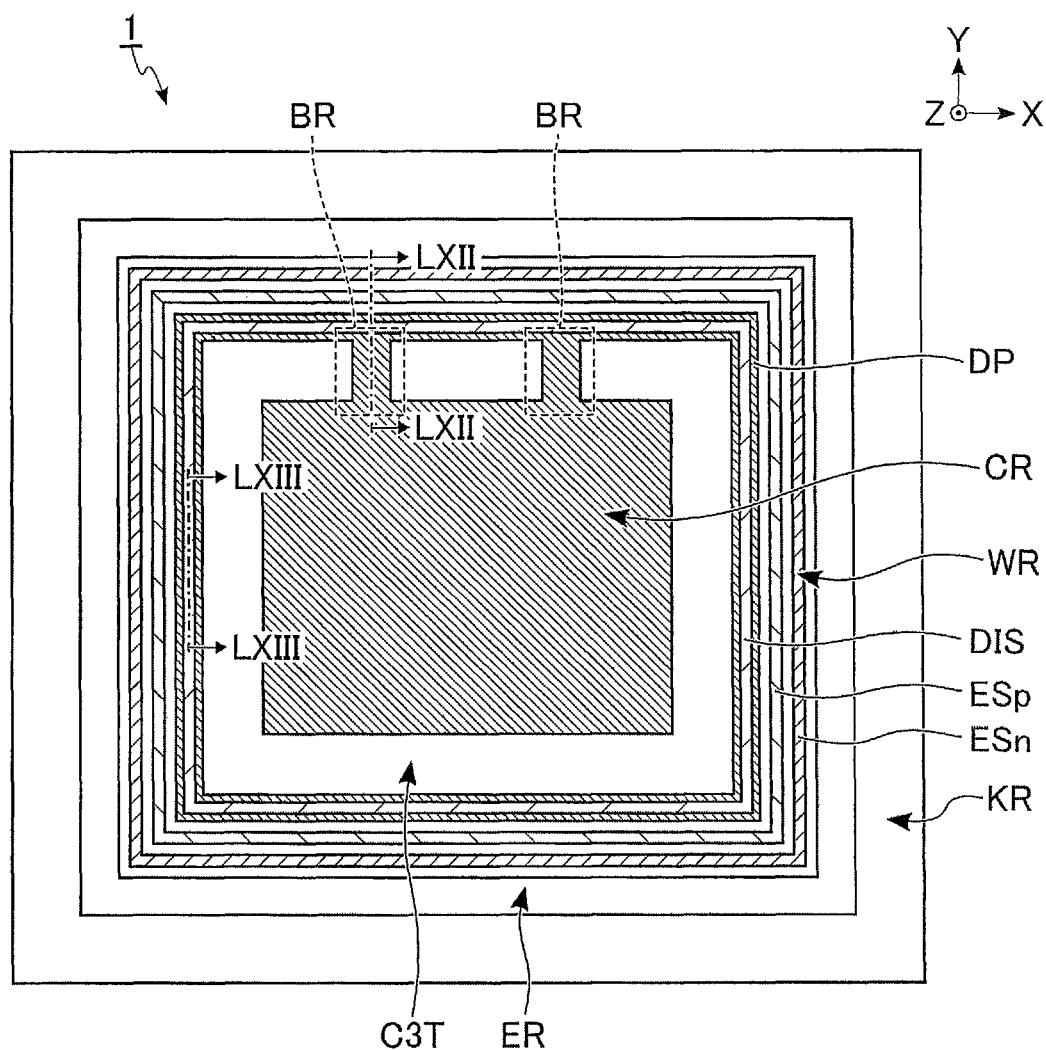
FIG. 61 is a plan view illustrating an example of a plan layout of the sealing member and the conductive portion in the semiconductor memory device according to the third embodiment to which a fourth modification is applied.

FIG. 61 is a plan view illustrating an example of a plan layout of the sealing member ES and the conductive portion DP in the semiconductor memory device 1 according to the third embodiment to which the fourth modification is applied. FIG. 61 illustrates the same region as the plan layout of the semiconductor memory device 1 according to the first embodiment illustrated in FIG. 3. As illustrated in FIG. 61, the semiconductor memory device 1 according to the third embodiment to which the fourth modification is applied includes the sealing members ESn and ESp and the discharge portion DIS in the wall region WR. The discharge portion DIS, the sealing member ESp, and the sealing member ESn are closer to the memory region MA in this order. The sealing member ESp is arranged between the discharge portion DIS and the sealing member ESn. The outer peripheral of the conductive portion DP is arranged between the discharge portion DIS and the sealing member ESp.

Figure 62:
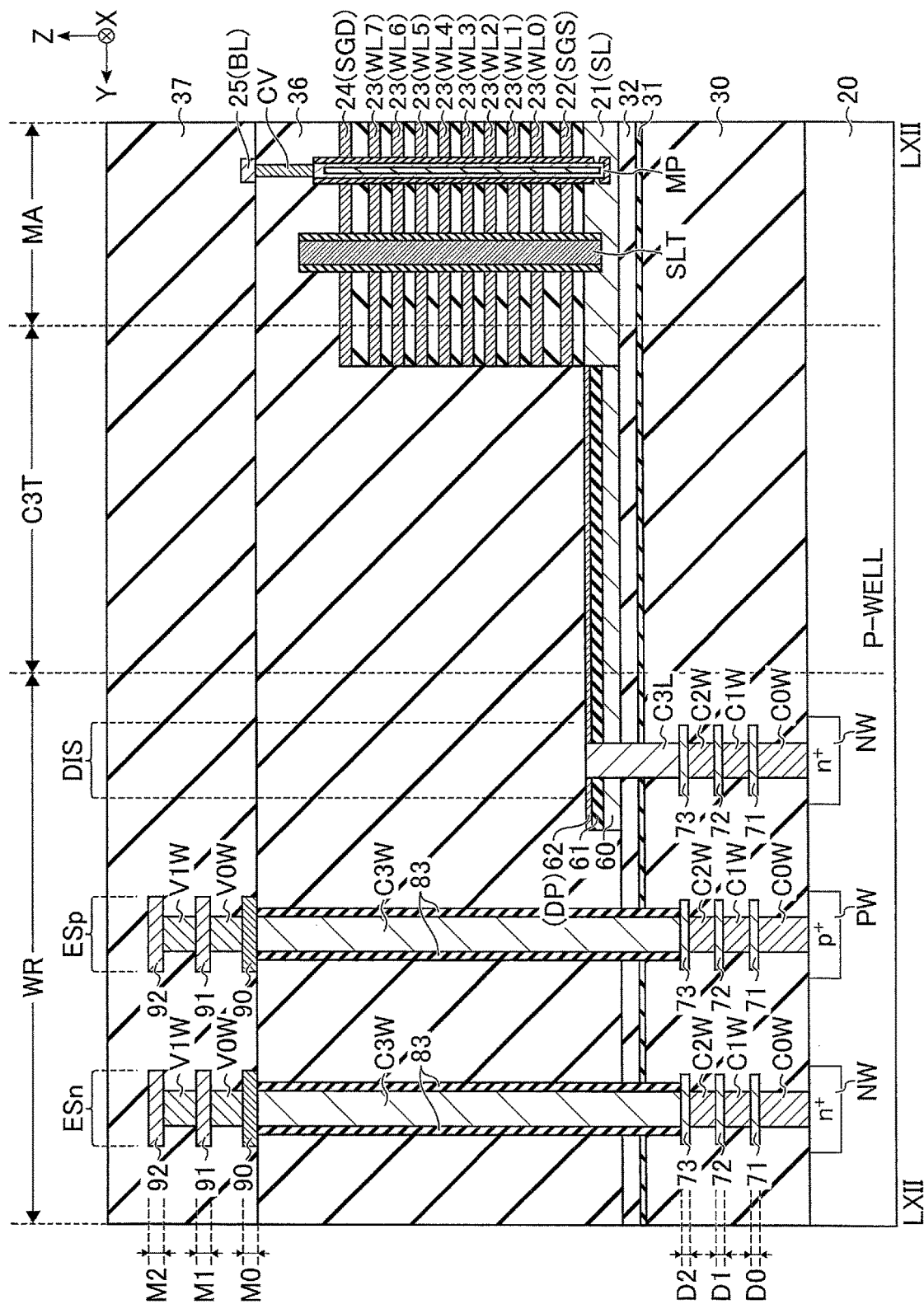
FIG. 62 is a cross-sectional view taken along a line LXII-LXII of FIG. 61 illustrating an example of cross-sectional structure in the contact region and the wall region of the semiconductor memory device according to the third embodiment to which the fourth modification is applied.

FIG. 62 is a cross-sectional view taken along a line LXII-LXII of FIG. 61 illustrating an example of cross-sectional structure in the contact region C3T and the wall region WR of the semiconductor memory device 1 according to the third embodiment to which the fourth modification is applied. As illustrated in FIG. 62, the discharge portion DIS has structure in which the configuration of the upper layer than the contact C3L is omitted from the sealing member ESn described in the third embodiment. The structure of the sealing member ESp is similar to the structure of the sealing member ESp described in the third embodiment. The sealing member ESn has structure in which the contact C0W is connected to the N-type impurity diffusion region NW and other portions are similar to the sealing member ESp.

Figure 63:
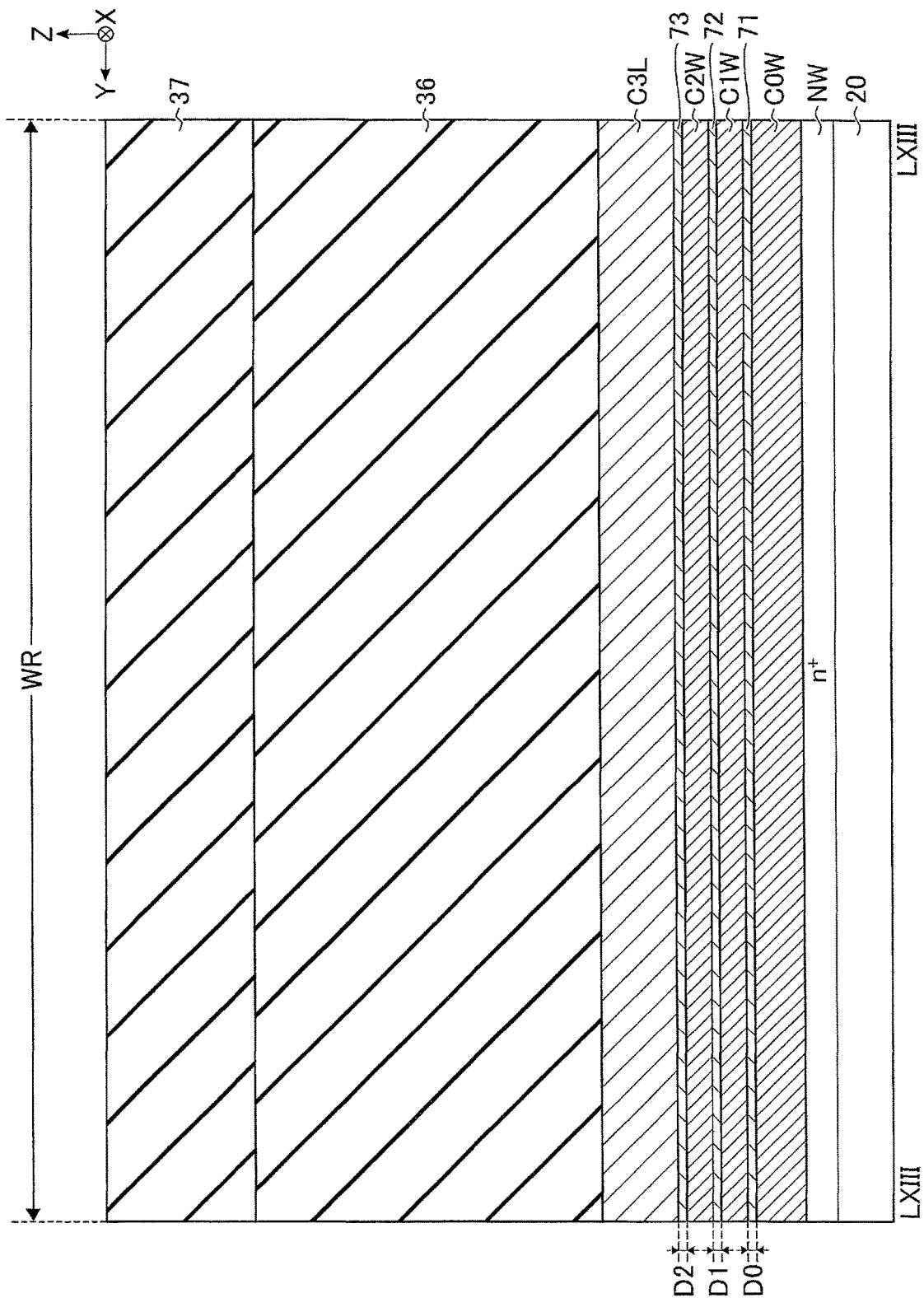
FIG. 63 is a cross-sectional view taken along a line LXIII-LXIII of FIG. 61 illustrating an example of cross-sectional structure in the wall region of the semiconductor memory device according to the third embodiment to which the fourth modification is applied.

FIG. 63 is a cross-sectional view taken along a line LXIII-LXIII of FIG. 61 illustrating an example of cross-sectional structure in the wall region WR of the semiconductor memory device 1 according to the third embodiment to which the fourth modification is applied. As illustrated in FIG. 63, each of the contacts C0W, C1W, C2W, and C3L and the conductive layers 71 to 73 included in the discharge portion DIS includes a portion extending in the Y direction. Furthermore, in a region not illustrated, each of the contacts C0W, C1W, C2W, and C3L and the conductive layers 71 to 73 included in the discharge portion DIS also includes a portion extending in the X direction. Other configurations are similar to those in the third embodiment.

As a result, each of the contacts C0W, C1W, C2W, and C3L and the conductive layers 71 to 73 in the discharge portion DIS is provided in a square ring, for example, and surrounds the core region CR. Then, the discharge portion DIS has a function of discharging the positive charge stored in the source line SL to the semiconductor substrate 20 in the high aspect ratio etching process, similarly to the sealing member ESn described in the third embodiment. As a result, the semiconductor memory device 1 according to the third embodiment to which the fourth modification is applied can suppress the occurrence of arcing in the high aspect ratio etching process, and improve the yield of the semiconductor memory device 1.

Figure 64:
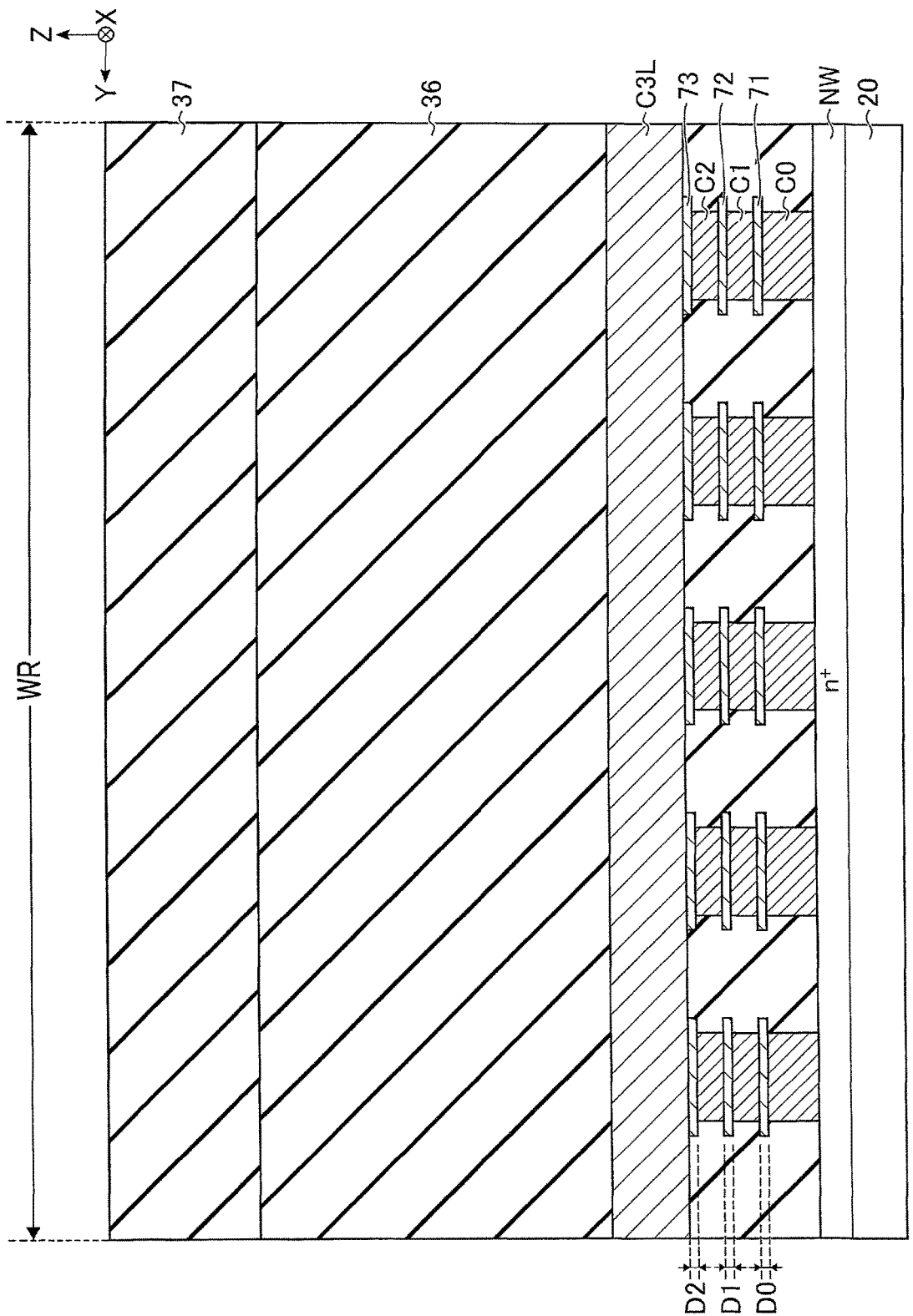
FIG. 64 is a cross-sectional view illustrating an example of the cross-sectional structure in the wall region of the semiconductor memory device according to the third embodiment to which the fourth modification is applied.

Note that, in the fourth modification, each of the contacts C0W, C1W, and C2W and the conductive layers 71 to 73 of the discharge portion DIS does not have to be provided in a square ring. FIG. 64 is a cross-sectional view illustrating an example of the cross-sectional structure in the wall region WR of the semiconductor memory device 1 according to the third embodiment to which the fourth modification is applied. As illustrated in FIG. 64, the discharge portion DIS may be provided with a plurality of sets of the columnar or plate-shaped contacts C0W, C1W, and C2W and conductive layers 71 to 73 connected together in the Z direction. Even in such a case, the discharge portion DIS can suppress the occurrence of arcing in the high aspect ratio etching process. Furthermore, the semiconductor memory device 1 in this example can reduce junction leakage by reducing a contact region between the discharge portion DIS and the semiconductor substrate 20. As a result, a power consumption of the semiconductor memory device 1 can be suppressed.

Figure 65:
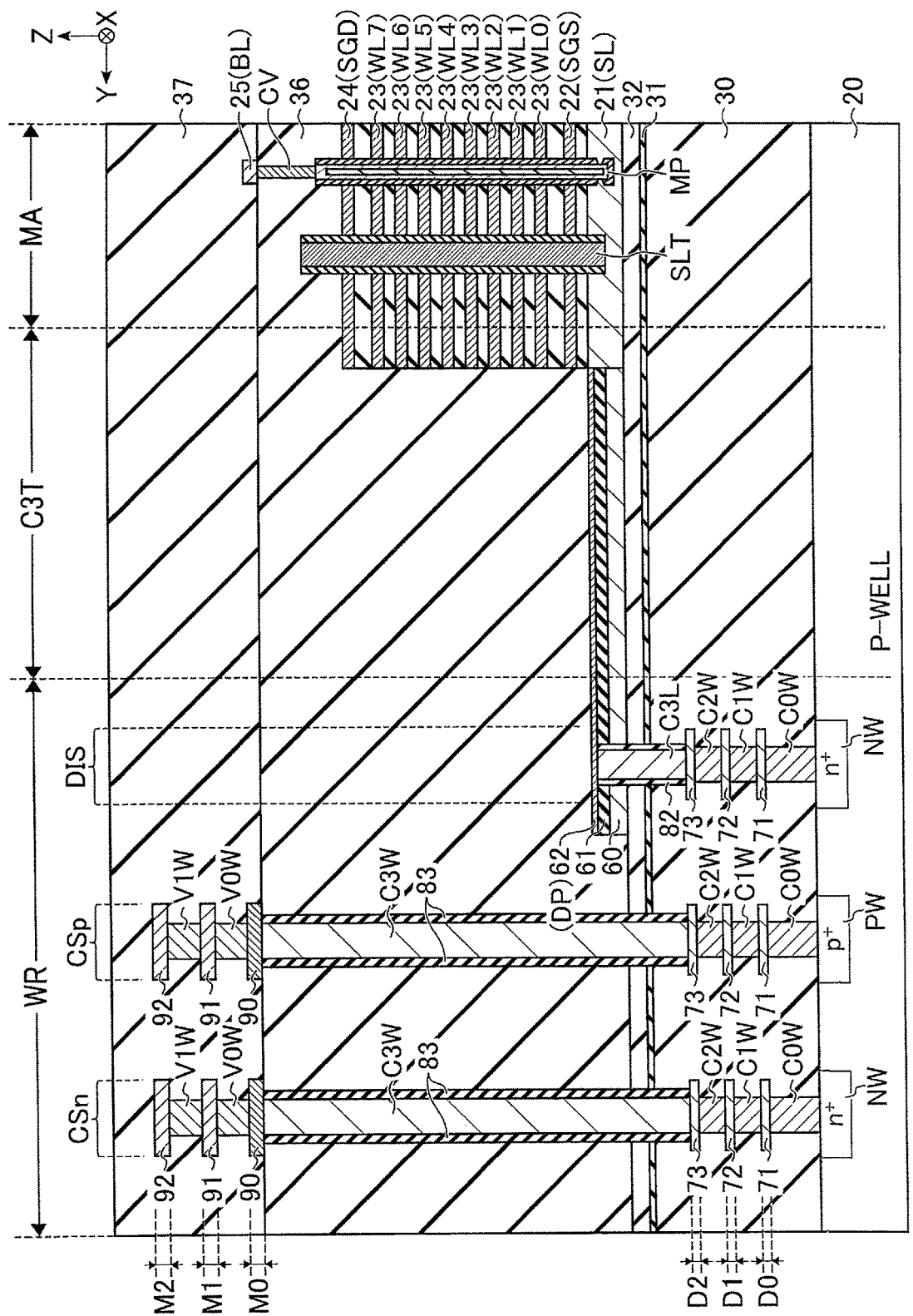
FIG. 65 is a cross-sectional view illustrating an example of cross-sectional structure in the contact region and the wall region of the semiconductor memory device according to the second embodiment to which the fourth modification is applied.

Furthermore, in the fourth modification, the insulating film 82 may be provided on the side walls of the contact C3L of the discharge portion DIS. That is, the second embodiment may be combined with the fourth modification. FIG. 65 is a cross-sectional view illustrating an example of the cross-sectional structure in the contact region C3T and the wall region WR of the semiconductor memory device 1 according to the second embodiment to which the fourth modification is applied. The semiconductor memory device 1 illustrated in FIG. 65 has structure in which the conductive layer 62 covering the upper end of the contact C3L and the insulating film 82 covering the side walls of the contact C3L are added to the semiconductor memory device 1 illustrated in FIG. 62. The structures of the contact C3L and the insulating film 82 in this example are the same as the structures of the contact C3L and the insulating film 82 described in the second embodiment. The contact C3L and the conductive layer 62 (conductive portion DP) formed of, for example, polysilicon are in contact with each other via the upper surface of the contact C3L. As a result, the semiconductor memory device 1 can suppress hydrogen entering the peripheral circuits in a process of forming the stacked wiring structure, and can obtain an effect of combining the fourth modification and the second embodiment.

(Fifth Modification)

The fifth modification relates to a modification of a connection method between the semiconductor layer 51 in the memory pillar MP and the source line SL (conductive layer 21).

FIG. 66 is a cross-sectional view illustrating an example of cross-sectional structure in the memory region of the memory cell array in the semiconductor memory device 1 according to the first embodiment to which the fifth modification is applied. FIG. 66 illustrates the same region as the cross-sectional structure of the semiconductor memory device 1 according to the first embodiment illustrated in FIG. 6. As illustrated in FIG. 66, the semiconductor layer 51 in the memory pillar MP and the source line SL may be connected together via the bottom surface of the memory pillar MP. Other structures are similar to those in the first embodiment.

Even in such a case, the semiconductor memory device 1 according to the first embodiment to which the fifth modification is applied can obtain an effect similar to that of the first embodiment if the conductive portion DP and the sealing members ESn and ESp as described in the first embodiment are provided. Furthermore, similarly, in each of the second and third embodiments, the semiconductor layer 51 in the memory pillar MP and the source line SL may be connected together via the bottom surface of the memory pillar MP.

[5] Others

In the manufacturing process of the semiconductor memory device 1 according to the first embodiment, the contact C3L may be formed by using the manufacturing method described in the third embodiment. Similarly, in the manufacturing process of the semiconductor memory device 1 according to the third embodiment, the contact C3L may be formed by using the manufacturing method described in the first embodiment. A similar manufacturing process can be used in the first embodiment and the third embodiment, except that regions differ where the conductive portion DP is formed. Furthermore, the semiconductor memory device 1 according to the third embodiment may have the structure of the contact C3M as in the first embodiment. In this case, for example, step S305 of the flowchart illustrated in FIG. 43 is replaced with the processing of steps S102 to S105 illustrated in FIG. 13.

Figure 67:
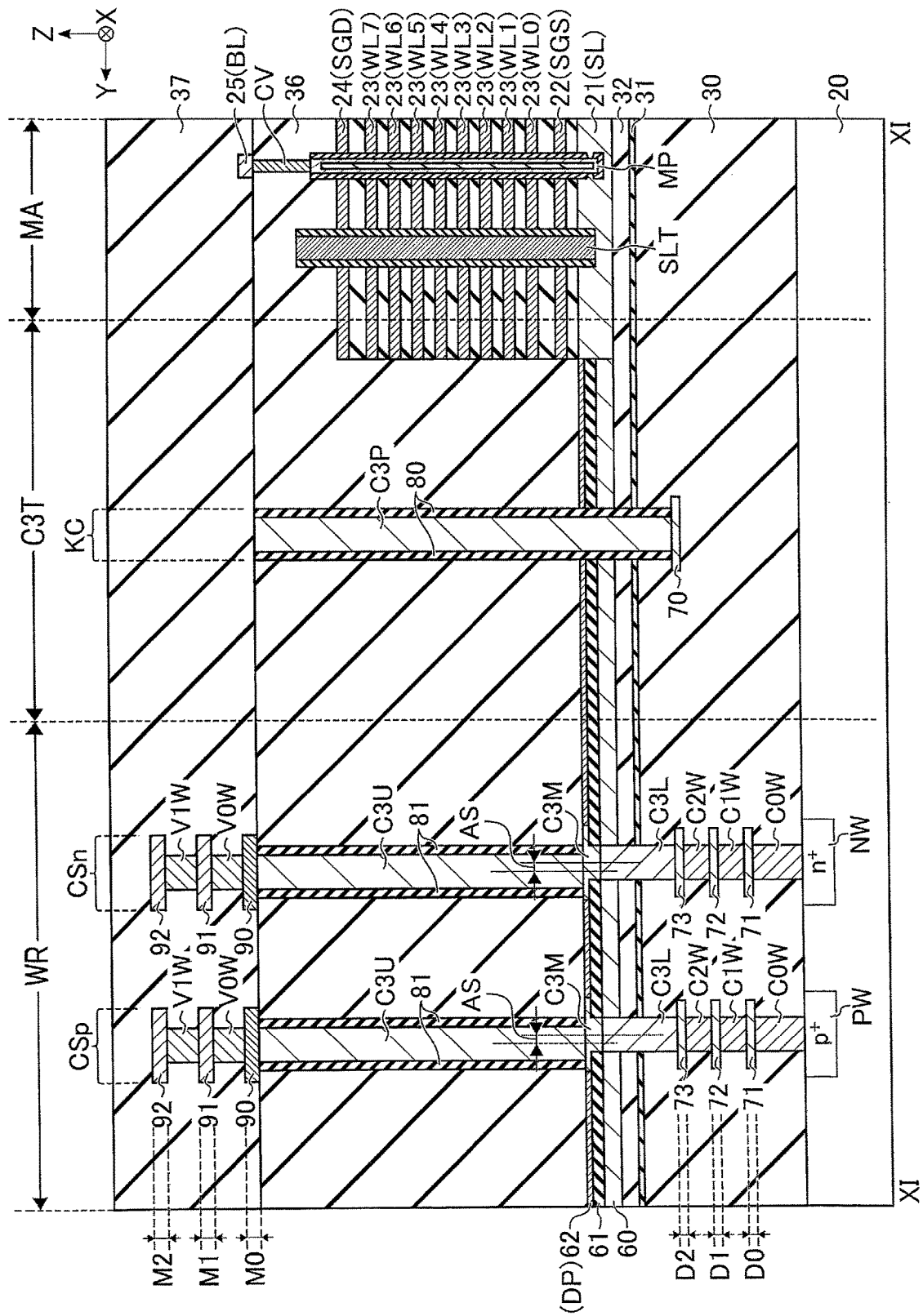
FIG. 67 is a cross-sectional view illustrating an example of the cross-sectional structure in the contact region and the wall region of the semiconductor memory device according to the first embodiment.

FIG. 67 is a cross-sectional view illustrating an example of the cross-sectional structure in the contact region and the wall region of the semiconductor memory device 1 according to the first embodiment. FIG. 67 illustrates the same region as the cross-sectional structure of the semiconductor memory device 1 according to the first embodiment illustrated in FIG. 11. As illustrated in FIG. 67, misalignment AS can occur between the contacts C3M and C3U in the sealing member ESn, and between the contacts C3M and C3U in the sealing member ESp. In the semiconductor memory device 1, it may be specified that the contacts C3M and C3U are formed in a separate process based on the misalignment AS between the contacts C3M and C3U. Similarly, the misalignment AS can also occur between the contacts C3L and C3U.

In the above embodiments, the number of sealing members ESn and ESp provided in the semiconductor memory device 1 is not limited to the number described in the embodiments. It suffices that the semiconductor memory device 1 includes at least one set of the sealing members ESn and ESp. Three or more sealing members ESn may be provided. A plurality of the sealing members ESn may be adjacent to each other. Two or more sealing members ESp may be provided. A plurality of the sealing members ESp may be adjacent to each other. The conductive layer 92 and the like may be shared between two or more sealing members ESn adjacent to each other. The conductive layer 92 and the like may be shared between two or more sealing members ESp adjacent to each other.

Furthermore, it suffices that each of the sealing members ESn and ESp have at least square ring wall-like structure, and the numbers of contacts and conductive layers included in each of the sealing members ESn and ESp may be other numbers. As a material used as the conductive layer and the contact included in the sealing members ESn and ESp, for example, a metal material is used, such as titanium, titanium nitride, or tungsten. Not limited to this, various metal materials can be used for the sealing members ESn and ESp. As a measure against static electricity or the like from the outside, it is preferable that the sealing member ESn is arranged on the outermost periphery.

In the first and second embodiments, the dividing portion KC does not necessarily have to include the contact C3P. It suffices that the dividing portion KC insulate at least the conductive layers 62 and 60 in the memory region MA from the conductive layers 62 and 60 in the wall region WR. For example, the dividing portion KC may include only an insulator.

In the above embodiments, the memory pillar MP may have structure in which two or more pillars are connected together in the Z direction. In this case, the "high aspect ratio etching process" used in the description of the present specification corresponds to the etching process of the hole corresponding to the pillar reaching the source line SL, or the like. Furthermore, the memory pillar MP may have structure in which a pillar corresponding to the select gate line SGD and a pillar corresponding to the word line WL are connected together. The memory pillar MP and the bit line BL, the contact CC and the conductive layer 26, and the contact C3 and the conductive layer 27 each may be connected together by a plurality of contacts connected together in the Z direction. A conductive layer may be inserted into a connecting portion of the plurality of contacts. This also applies to other contacts.

In the drawings used for the description in the above embodiments, a case has been exemplified where the memory pillar MP has the same diameter in the Z direction; however, the embodiments are not limited to this. For example, the memory pillar MP may have a tapered shape or a reverse tapered shape, or may have a shape in which the intermediate portion is bulged (bowing shape). Similarly, each of the slit SLT and SHE may have a tapered shape or a reverse tapered shape, or may have a bowing shape. Similarly, each of the contacts C0W, C1W, C2W, C3L, C3M, C3U, C3P, C3W, V0W, and V1W may have a tapered or reverse tapered shape, or may have a bowing shape. Furthermore, in the above embodiments, a case has been exemplified where the cross-sectional structures of the memory pillar MP and the contacts CC and C3 are circular; however, these cross-sectional structures may be elliptical and can be designed in any shape.

In the above embodiments, the inside of each of the slit SLT and SHE may include a single or a plurality of types of insulators. In this case, for example, a contact for the source line SL (conductive layer 21) is provided in, for example, the hookup region HA. In the present specification, a position of the slit SLT is specified based on, for example, a position of the contact LI. When the slit SLT includes an insulator, the position of the slit SLT may be specified by a seam in the slit SLT or a material remaining in the slit SLT during the replacement processing.

Note that, for "square ring" in the present specification, it is sufficient that a target constituent element is formed in a ring shape while at least having portions extending in directions intersecting with each other. Furthermore, the "square ring" may be formed to have a corner portion obliquely formed, and may have a portion in which a side is not formed in a straight line. The "square ring" is preferably a perfect ring, but a part of the ring portion may be interrupted. If the sealing members ESn and ESp have substantially ring structure, the effects of the sealing members ESn and ESp described in the above embodiment can be obtained. "Ring" is not limited to a circle, but also includes a square ring. "Diameter" indicates the inner diameter of a hole or the like in a cross section parallel to the surface of the semiconductor substrate. "Width" indicates the width of a constituent element in, for example, the X direction or the Y direction. "Side walls" indicate one and the other side surface portions of the slit.

In the present specification, "connection" indicates being electrically connected, and does not exclude, for example, interposing another element in between. "Electrically connected" may have an interposing insulator as long as it can operate similarly to an electrically connected one. "Columnar" indicates being a structure provided in the hole formed in the manufacturing process of the semiconductor memory device 1. It suffices that "Identical layer structure" means that at least the layers are formed in the same order.

In the present specification, "P-type well region" indicates a region of the semiconductor substrate 20 containing P-type impurities. "N-type impurity diffusion region" indicates a region in which the semiconductor substrate 20 is doped with N-type impurities. "P-type impurity diffusion region" indicates a region in which the semiconductor substrate 20 is doped with P-type impurities.

In the present specification, "region" may be regarded as a configuration included by the semiconductor substrate 20. For example, when the semiconductor substrate 20 is defined as including two regions, the memory region MA and the hookup region HA, the two regions, the memory region MA and the hookup region HA, are respectively associated with different regions above the semiconductor substrate 20. "Height" corresponds to, for example, a distance in the Z direction between a measurement target configuration and the semiconductor substrate 20. As a reference of the "height", a configuration other than the semiconductor substrate 20 may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate including a core region and a first region, the first region being provided to surround an outer periphery of the core region;
   a source line provided above the substrate in the core region;
   a plurality of word lines provided above the source line in the core region, the word lines being provided apart from each other in a first direction intersecting a surface of the substrate;
   a pillar provided to extend in the first direction in the core region, a bottom of the pillar reaching the source line, and an intersecting portion of the pillar and one of the word lines functioning as a memory cell;
   an outer peripheral conductive layer provided to surround the core region in the first region, the outer peripheral conductive layer being included in a first layer including the source line;
   a lower layer conductive layer provided in the first region, the lower layer conductive layer being included in a second layer between the first layer and the substrate; and
   a first contact provided on the lower layer conductive layer to surround the core region in the first region, an upper end of the first contact being included in the first layer, and the first contact being electrically connected to the outer peripheral conductive layer.

2. The device of claim 1, wherein
   the outer peripheral conductive layer and the source line are electrically insulated from each other.

3. The device of claim 1, wherein
   the outer peripheral conductive layer includes a first outer peripheral conductive layer and a second outer peripheral conductive layer, the first outer peripheral conductive layer and the second outer peripheral conductive layer being provided apart from each other in the first direction, and
   the first contact divides the first outer peripheral conductive layer on a lower layer side and extends in the first direction, the upper end of the first contact being in contact with a bottom surface of the second outer peripheral conductive layer on an upper layer side.

4. The device of claim 3, further comprising:
   a first insulating layer provided in a third layer between the first layer and the second layer over the core region and the first region, the first insulating layer being divided by the first contact; and
   a second insulating layer provided on side surfaces of the first contact, the second insulating layer being in contact with the first insulating layer, wherein
   each of the first insulating layer and the second insulating layer contains silicon nitride.

5. The device of claim 1, wherein
   the outer peripheral conductive layer includes a first outer peripheral conductive layer and a second outer peripheral conductive layer, the first outer peripheral conductive layer and the second outer peripheral conductive layer being provided apart from each other in the first direction, and an intermediate insulating layer being provided between the first outer peripheral conductive layer and the second outer peripheral conductive layer,
   the pillar includes a semiconductor provided to extend in the first direction, and
   the semiconductor is in contact with the source line at a height at which the intermediate insulating layer is provided.

6. The device of claim 1, wherein
a side surface portion of the first contact adjacent to the upper end of the first contact is in contact with the outer peripheral conductive layer.

7. The device of claim 1, further comprising
a second contact provided above the first contact to surround the core region in the first region, an upper end of the second contact being included in an upper layer than an upper end of the pillar.

8. The device of claim 7, further comprising
an intermediate contact provided between the first contact and the second contact to surround the core region in the first region, a side surface portion of the intermediate contact adjacent to an upper end of the intermediate contact being in contact with the outer peripheral conductive layer, wherein
at a contact portion between the first contact and the intermediate contact, a side surface of the first contact and a side surface of the intermediate contact are provided to be aligned, and
a width in a second direction intersecting the first direction of the intermediate contact in a contact portion between the intermediate contact and the outer peripheral conductive layer is wider than a width in the second direction of the intermediate contact in the contact portion between the first contact and the intermediate contact.

9. The device of claim 1, wherein
the substrate includes, in the first region, a P-type well region and an N-type impurity diffusion region formed in the P-type well region, and
the lower layer conductive layer is electrically connected to the N-type impurity diffusion region.

10. The device of claim 9, wherein
the substrate further includes a second region provided between the core region and the first region, and
the outer peripheral conductive layer is connected to the source line via a portion of the first region.

11. The device of claim 1, wherein
the first contact is provided in a square ring.

12. The device of claim 1, further comprising
a peripheral circuit provided between the substrate and the source line, the peripheral circuit being used for controlling the memory cell.

13. A semiconductor memory device comprising:
a substrate including a core region and a first region, the first region being provided to surround an outer periphery of the core region;
a source line provided above the substrate in the core region;
a plurality of word lines provided above the source line in the core region, the word lines being provided apart from each other in a first direction intersecting a surface of the substrate;
a pillar provided to extend in the first direction in the core region, a bottom of the pillar reaching the source line, and an intersecting portion of the pillar and one of the word lines functioning as a memory cell;
an outer peripheral conductive layer provided in the first region, the outer peripheral conductive layer being included in a first layer including the source line;
a first lower layer conductive layer provided to surround the core region in the first region, the first lower layer conductive layer being included in a second layer between the first layer and the substrate;
a first lower layer contact provided between the substrate and the first lower layer conductive layer to surround the core region in the first region, the first lower layer contact electrically connecting the substrate to the first lower layer conductive layer;
a second lower layer conductive layer provided closer to the core region than the first lower layer conductive layer in the first region, the second lower layer conductive layer being included in the second layer;
a second lower layer contact provided between the substrate and the second lower layer conductive layer in the first region at a height identical to that of the first lower layer contact, the second lower layer contact electrically connecting the substrate to the second lower layer conductive layer; and
a first contact provided on the second lower layer conductive layer in the first region, an upper end of the first contact being included in the first layer, and the first contact being electrically connected to the outer peripheral conductive layer.

14. The device of claim 13, wherein
a layer structure between the substrate and the first lower layer conductive layer is identical to a layer structure between the substrate and the second lower layer conductive layer.

15. The device of claim 13, further comprising
a second contact provided on the first lower layer conductive layer to surround the core region in the first region, an upper end of the second contact being included in an upper layer than an upper end of the pillar, and the second contact being electrically insulated from the outer peripheral conductive layer.

16. The device of claim 13, further comprising:
a third contact provided on the first lower layer conductive layer to surround the core region in the first region, an upper end of the third contact being included in the first layer, and the third contact being electrically connected to the outer peripheral conductive layer, and
the outer peripheral conductive layer and the source line are electrically insulated from each other.

17. The device of claim 13, wherein
the substrate includes, in the first region, a P-type well region and an N-type impurity diffusion region formed in the P-type well region, and
the second lower layer contact is electrically connected to the N-type impurity diffusion region.

18. The device of claim 13, wherein
the outer peripheral conductive layer is provided to surround the core region, and
the first contact is provided in a square ring.

19. The device of claim 18, wherein
the second lower layer conductive layer and the second lower layer contact are provided in a square ring.

20. The device of claim 13, further comprising
a peripheral circuit provided between the substrate and the source line, the peripheral circuit being used for controlling the memory cell.

* * * * *